United States Patent [19]

Goldsbury et al.

[11] Patent Number: 4,646,312
[45] Date of Patent: Feb. 24, 1987

[54] ERROR DETECTION AND CORRECTION SYSTEM

[75] Inventors: Timothy G. Goldsbury, Escondido; Carson T. Schmidt, Poway, both of Calif.

[73] Assignee: NCR Corporation, Dayton, Ohio

[21] Appl. No.: 681,347

[22] Filed: Dec. 13, 1984

[51] Int. Cl.[4] ............................................. G06F 11/00
[52] U.S. Cl. ...................................... 371/38; 371/13; 371/37
[58] Field of Search ............................. 371/13, 37, 38

[56] References Cited

U.S. PATENT DOCUMENTS

| 3,648,239 | 3/1972 | Carter | 371/38 |
|---|---|---|---|
| 3,668,632 | 6/1972 | Oldham | 371/37 X |
| 3,688,265 | 8/1972 | Carter et al. | |
| 4,037,091 | 7/1977 | Beuscher | 371/13 |
| 4,249,253 | 2/1981 | Gentili | 371/38 |
| 4,345,328 | 8/1982 | White | |
| 4,355,391 | 10/1982 | Alsop | 371/37 |
| 4,388,684 | 6/1983 | Nibby, Jr. et al. | |
| 4,394,763 | 7/1983 | Nagano | 371/38 |
| 4,413,339 | 11/1983 | Riggle | 371/38 |
| 4,456,996 | 6/1984 | Haas | 371/38 X |
| 4,502,141 | 2/1985 | Kuki | 371/37 |

FOREIGN PATENT DOCUMENTS 2064840  6/1981  United Kingdom.

OTHER PUBLICATIONS

Electronic Engineering, vol. 54, No. 663, Mar. 1982.
M. Y. Hsiao et al., "Double-Error Correcting Code with Separable Single-Error Correcting Capability," IBM Technical Disclosure Bulletin, vol. 14, No. 8, Jan. 1972, pp. 2363-2365.
R. Korody et al. "Purge Your Memory Array of Pesky Error Bits," Electrical Design News, vol. 25, No. 10, May 20, 1980, pp. 154-155.
J. P. Brosius, Jr. et al., "Fault-Tolerant Plated Wire Memory for Long Duration Space Missions," Digest of Papers of the International Symposium on Fault Tolerant Computing, Palo Alto, Symposium 3, IEEE, New York, Jun. 21-22, 1973, pp. 33-38.
D. E. Waldecker, "Memory Error Correction," IBM Technical Disclosure Bulletin, vol. 13, No. 1, Jun. 1970, pp. 52-53.
C. Carinalli et al., "High Performance Dynamic RAM Support Circuits," IEEE Electro, vol. 7, No. 5, May 1982, pp. 1-11.

*Primary Examiner*—Jerry Smith
*Assistant Examiner*—Robert W. Beausoliel, Jr.
*Attorney, Agent, or Firm*—Wilbert Hawk, Jr.; Edward Dugas; Floyd A. Gonzalez

[57] ABSTRACT

An error detection and correction apparatus including a transmission bus for transmitting multi-bit data signals and multi-bit error correction code signals generated responsive to the multi-bit data signals in accordance with a modified Hamming code technique. Parity generators are connected to the bus for receiving the bits of the data signals and selected bits of the error correction code signals in accordance with the modified Hamming code technique for determining if a single bit error exists in the data. A two-state comparison gate is connected to the parity generators which has a first state if a single bit error does exist, and a second state if a single bit error does not exist. A separate error detection and correction circuit is provided to detect and correct any single bit errors in the data on the transmission bus. The two-state comparison gate is reset to its second state after the separate error detection and correction circuit corrects any single bit error in the data.

15 Claims, 55 Drawing Figures

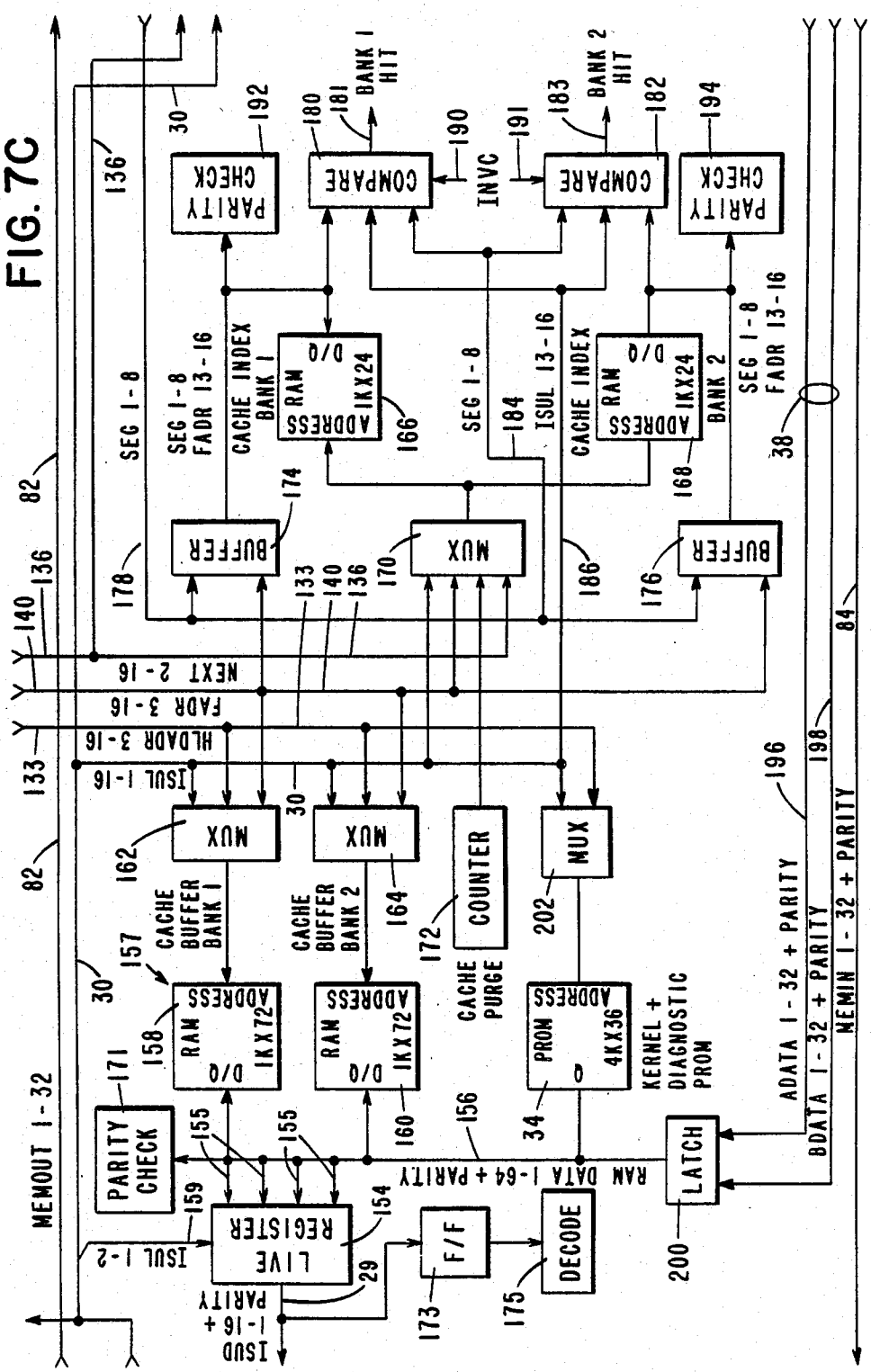

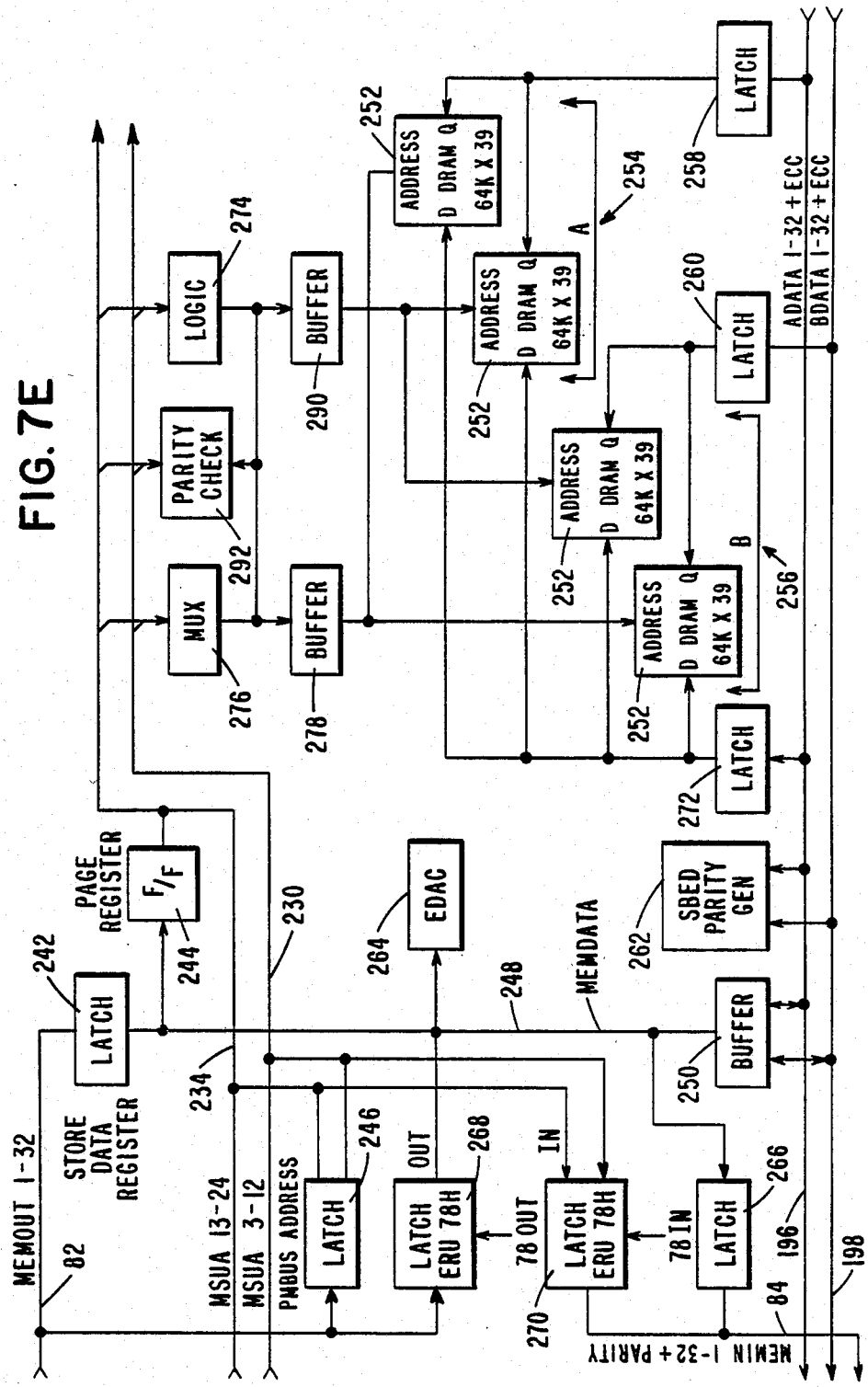

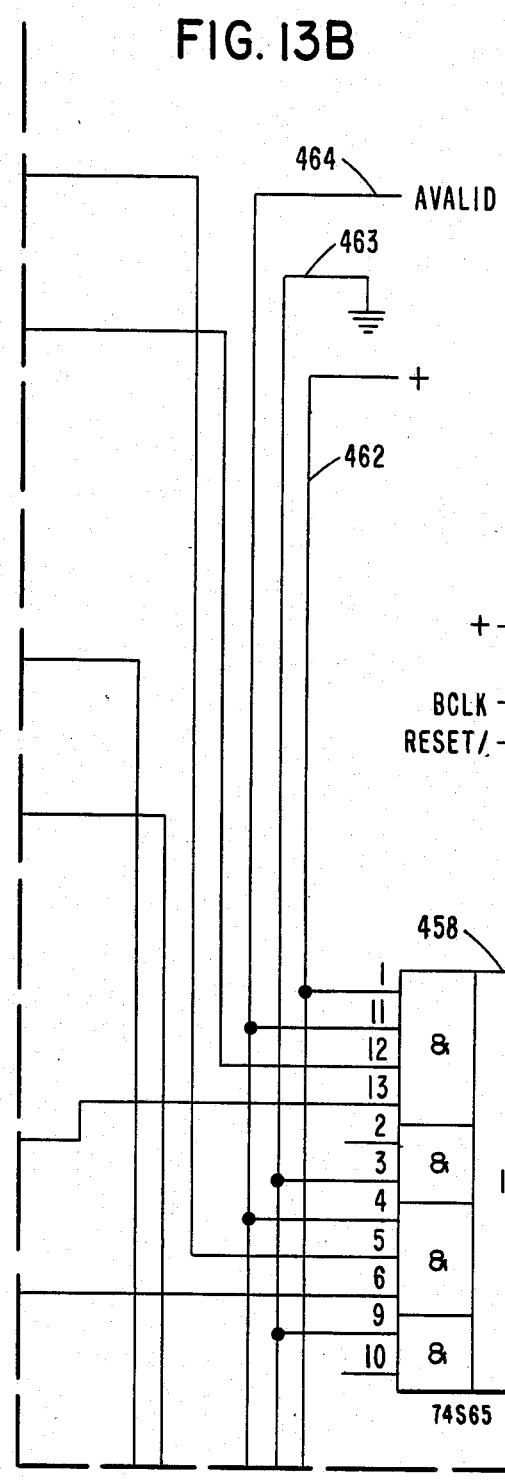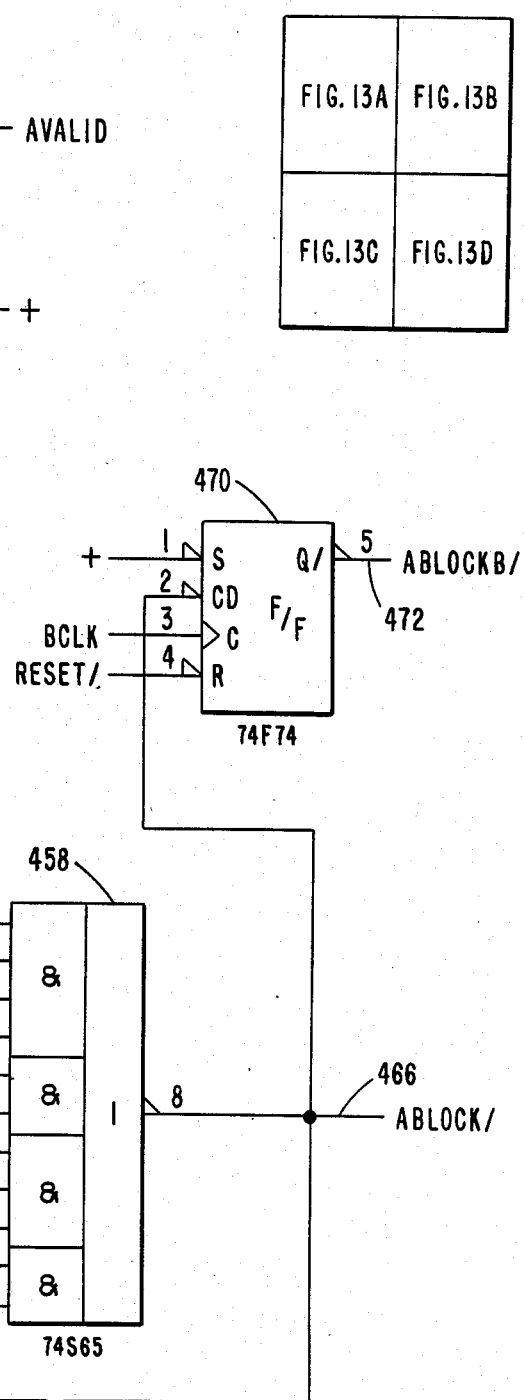
FIG. 13B
FIG. 14

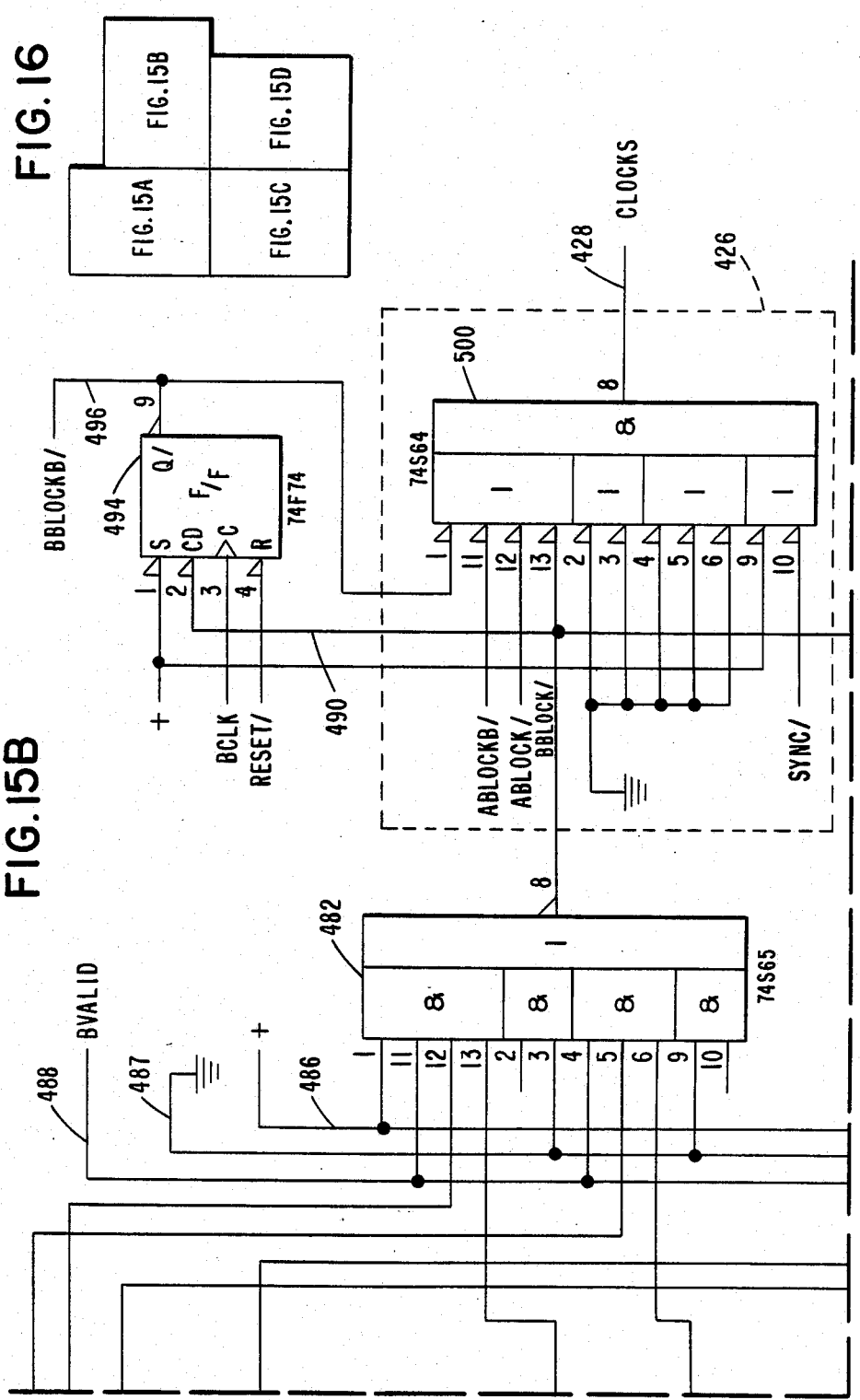

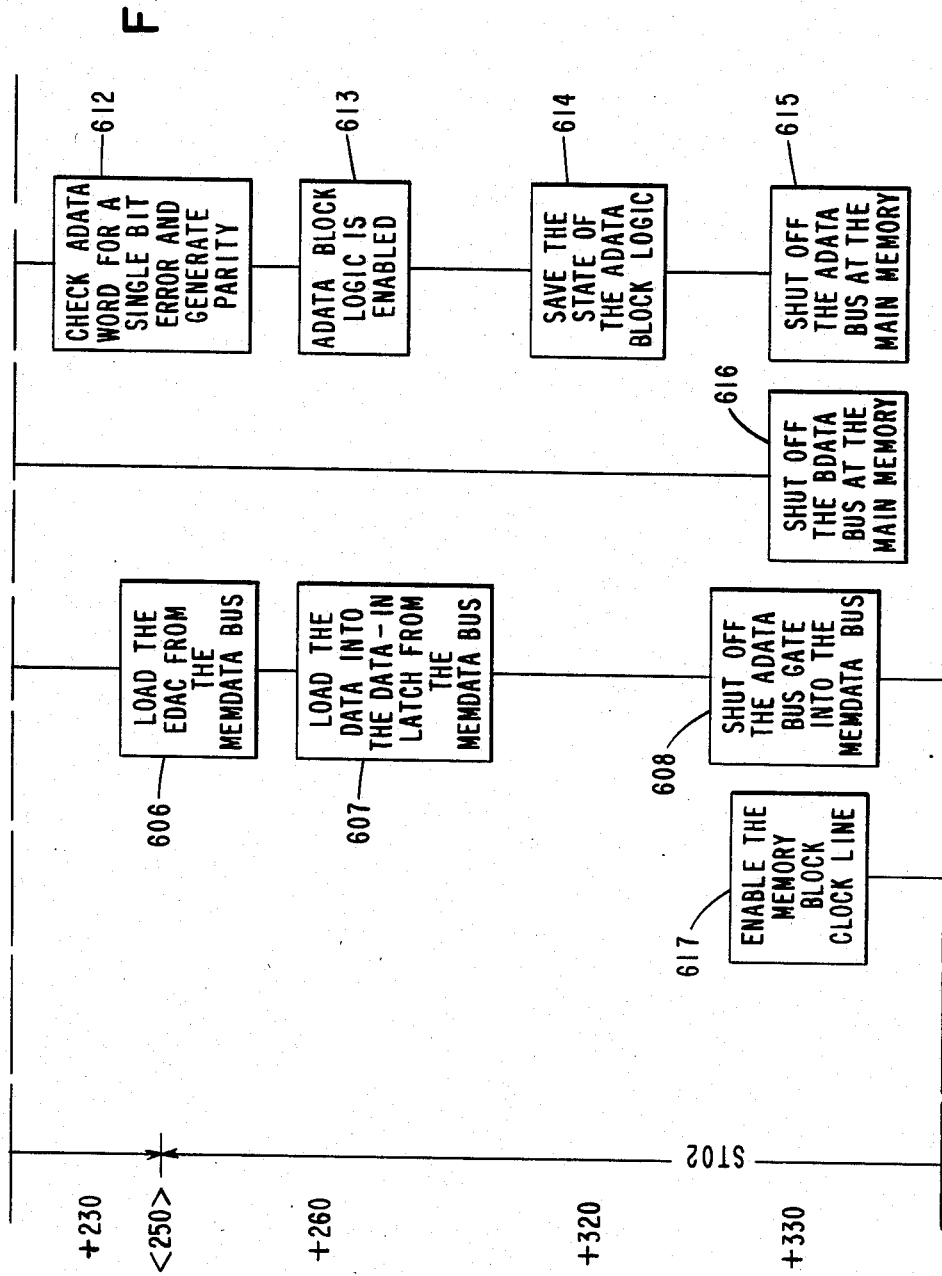

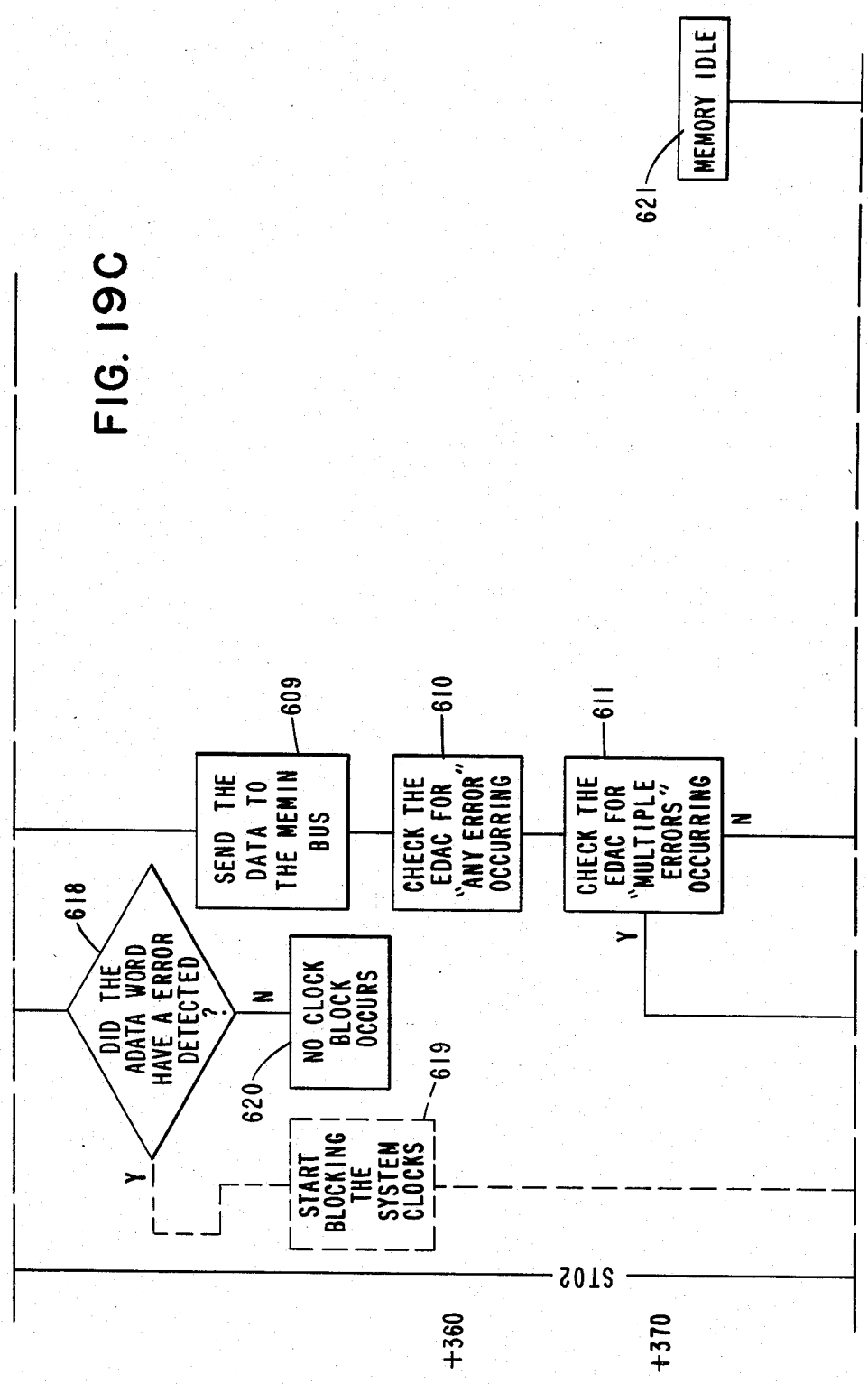

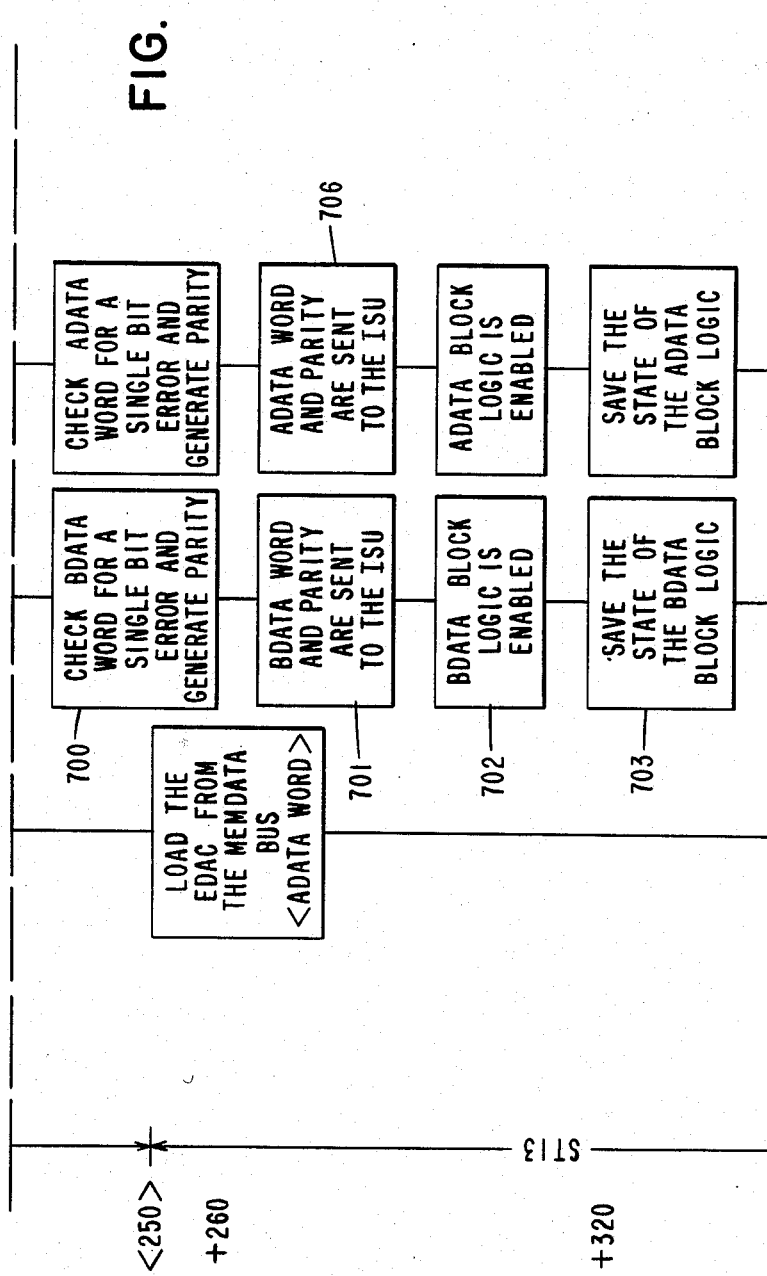

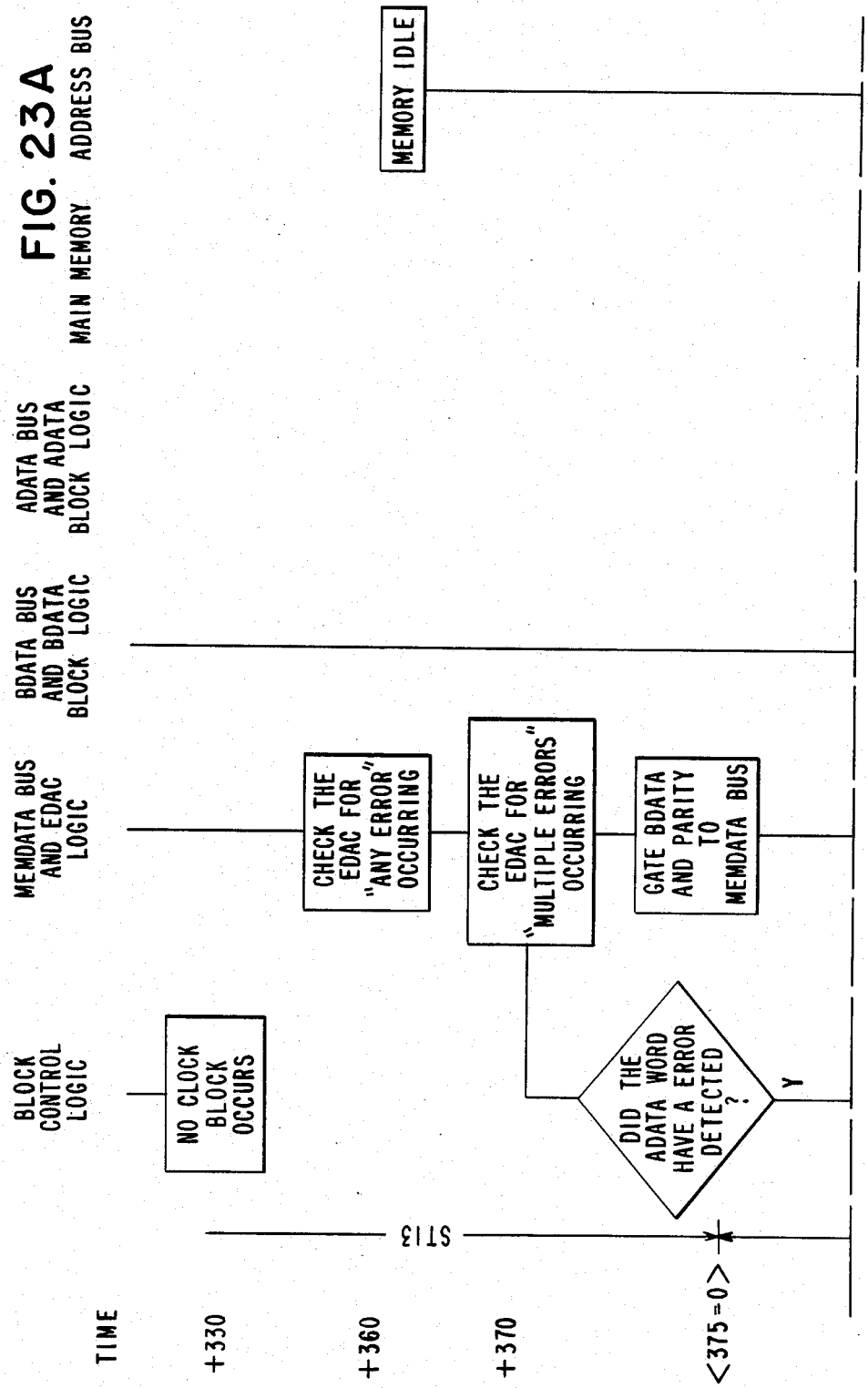

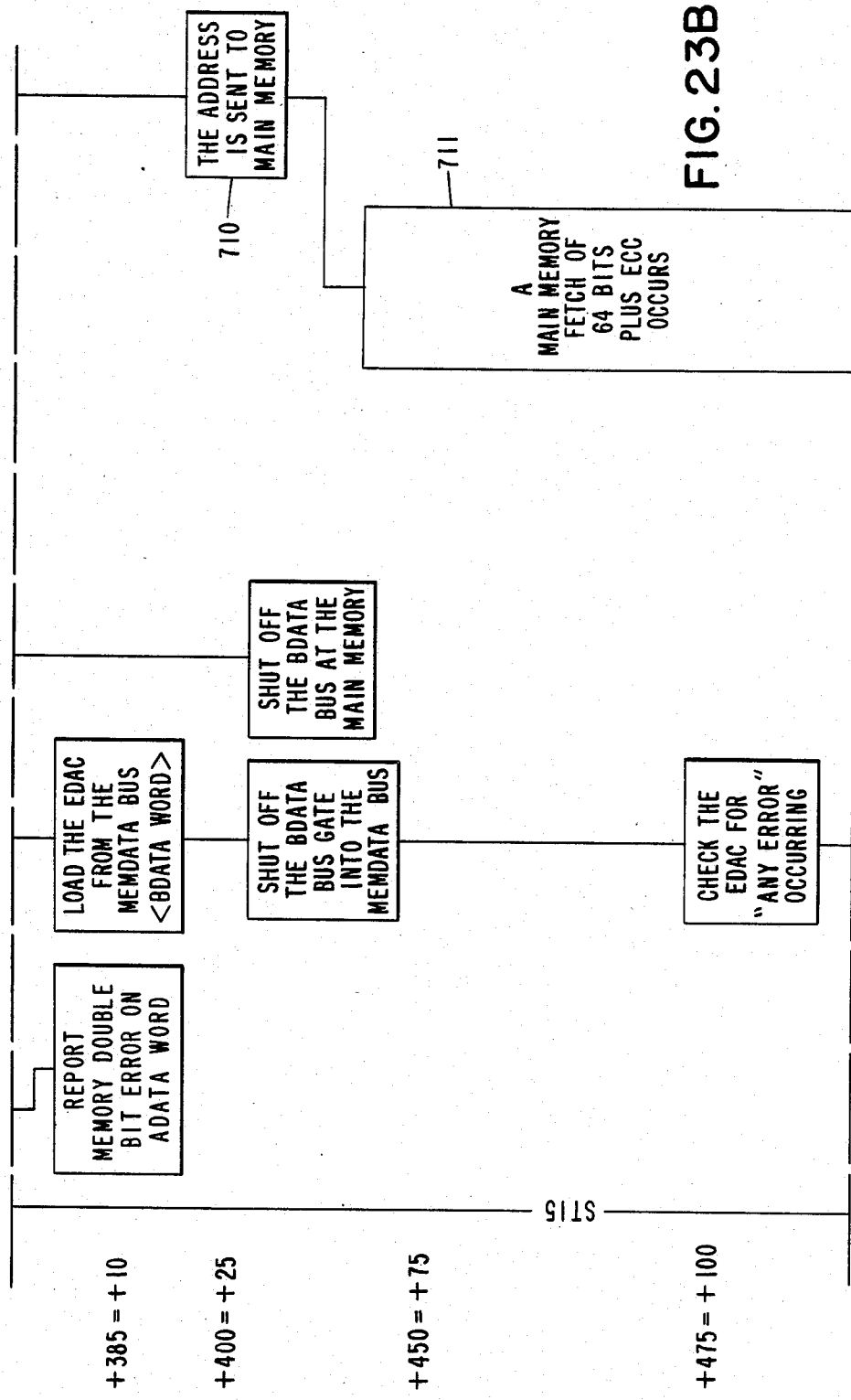

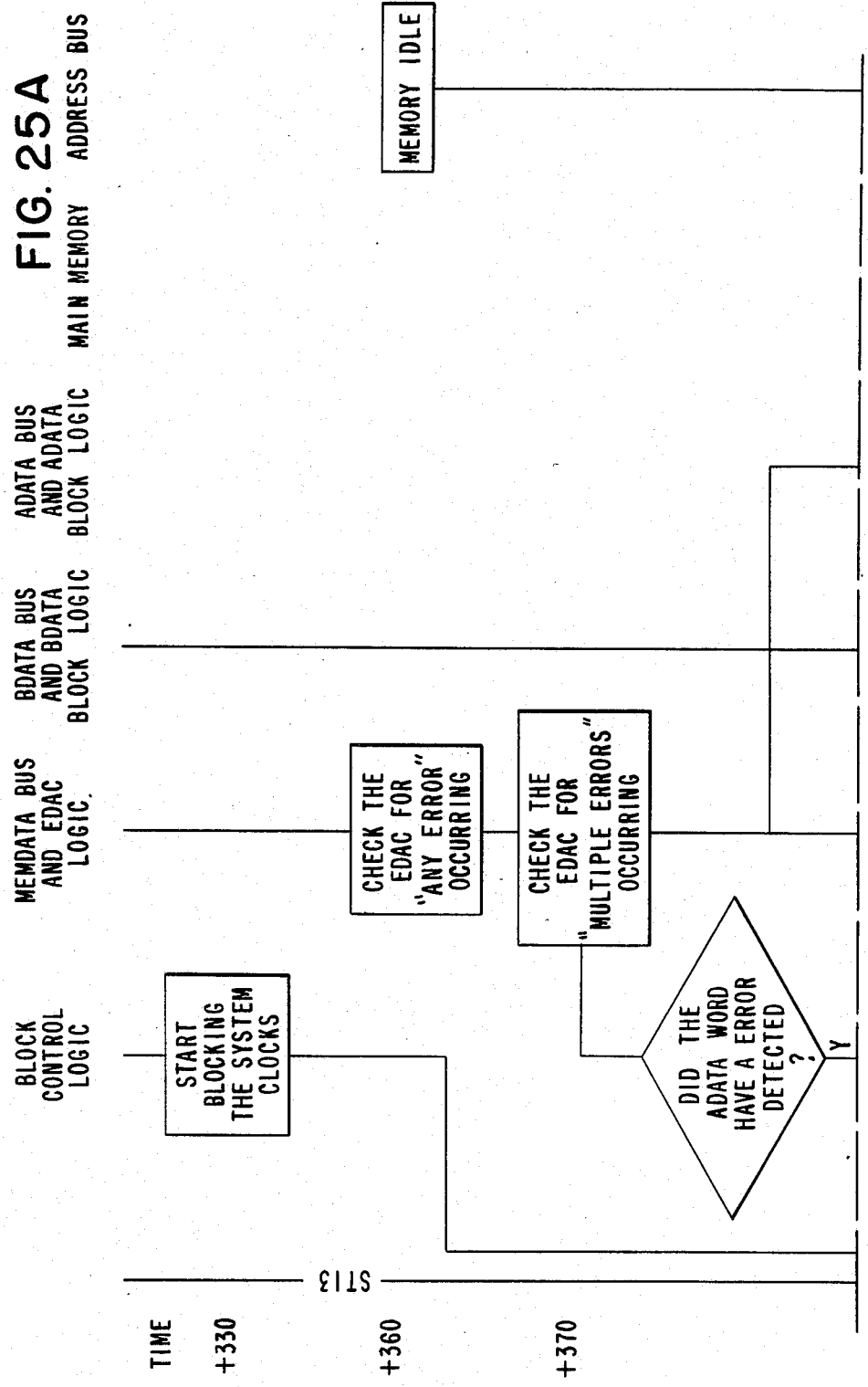

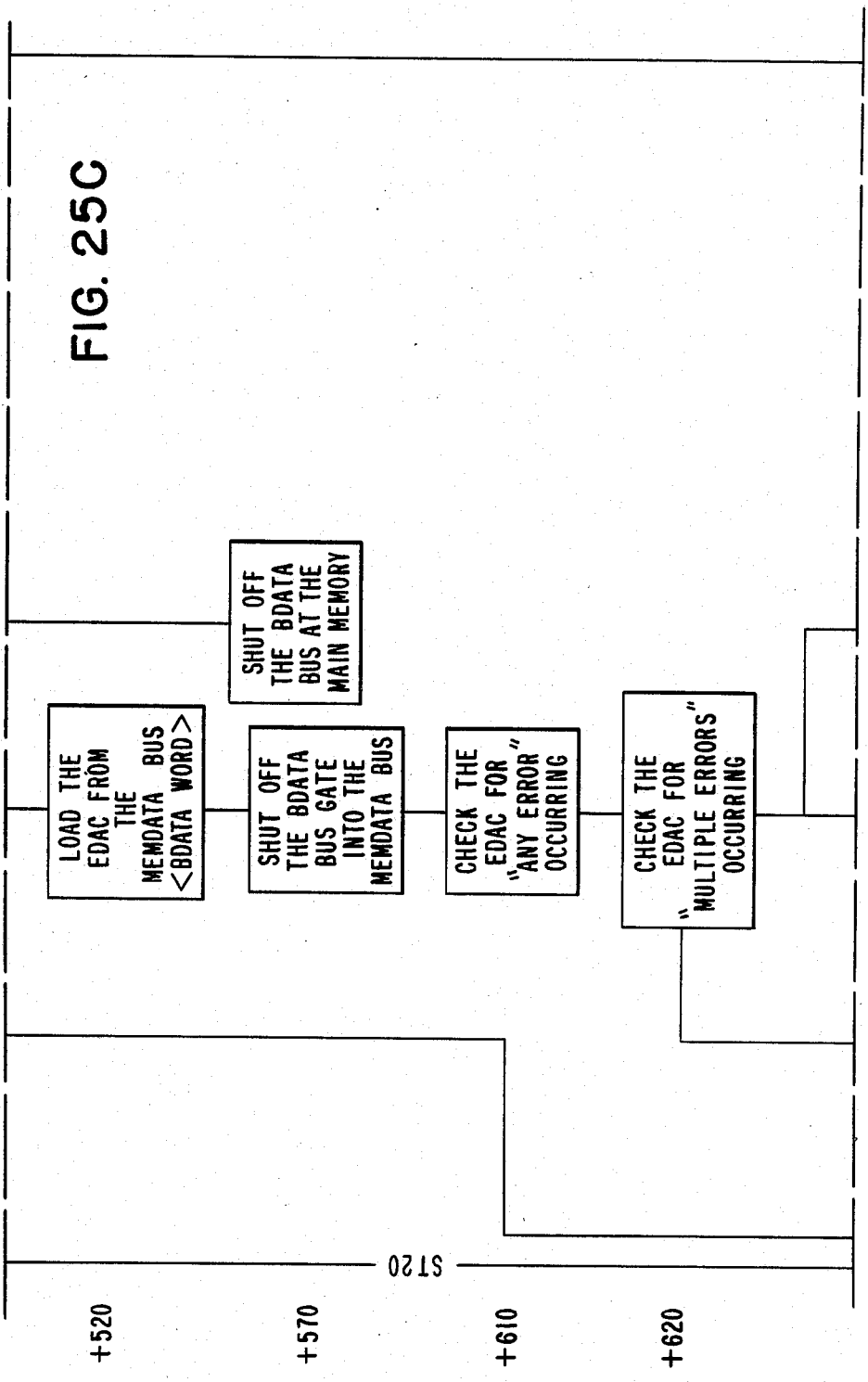

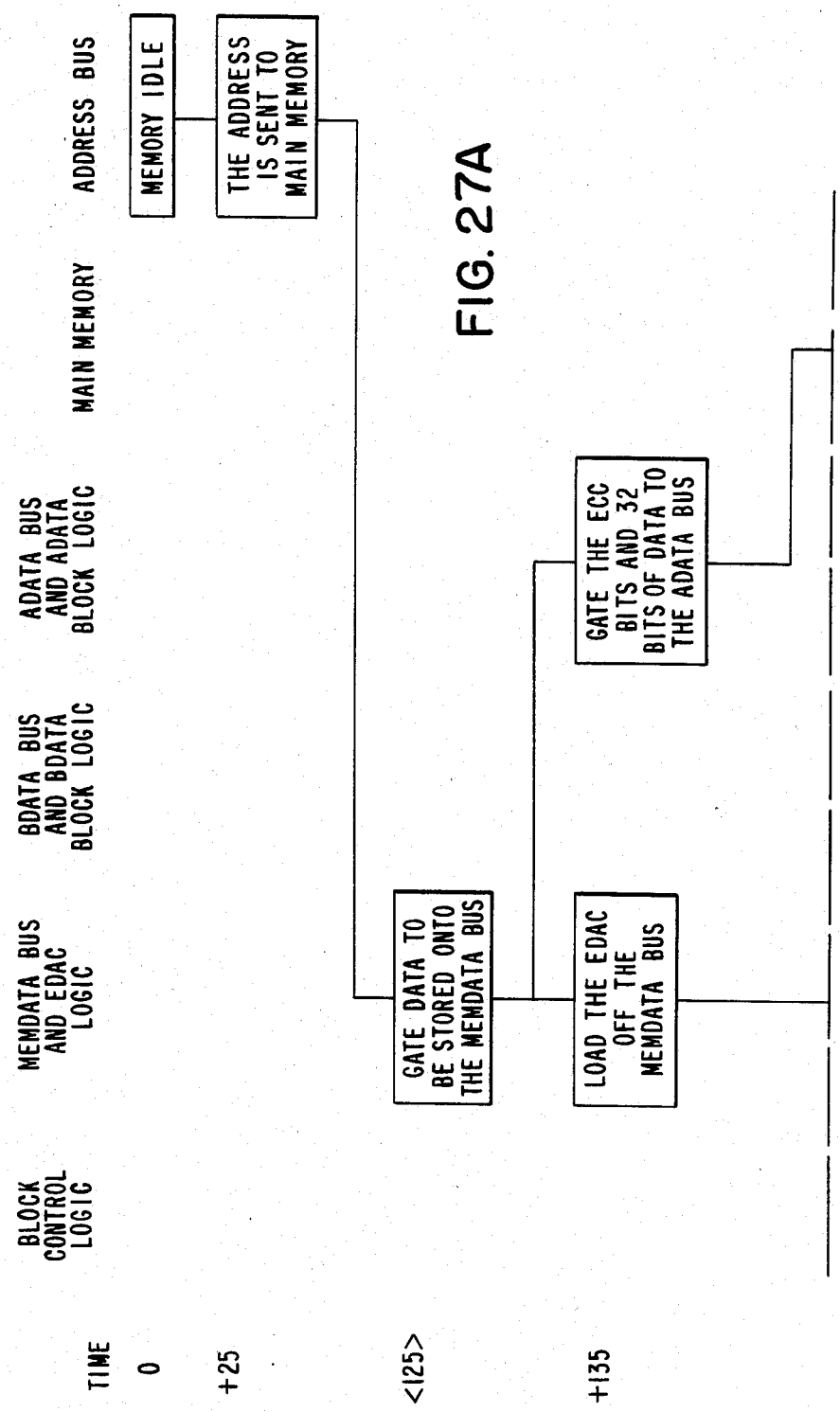

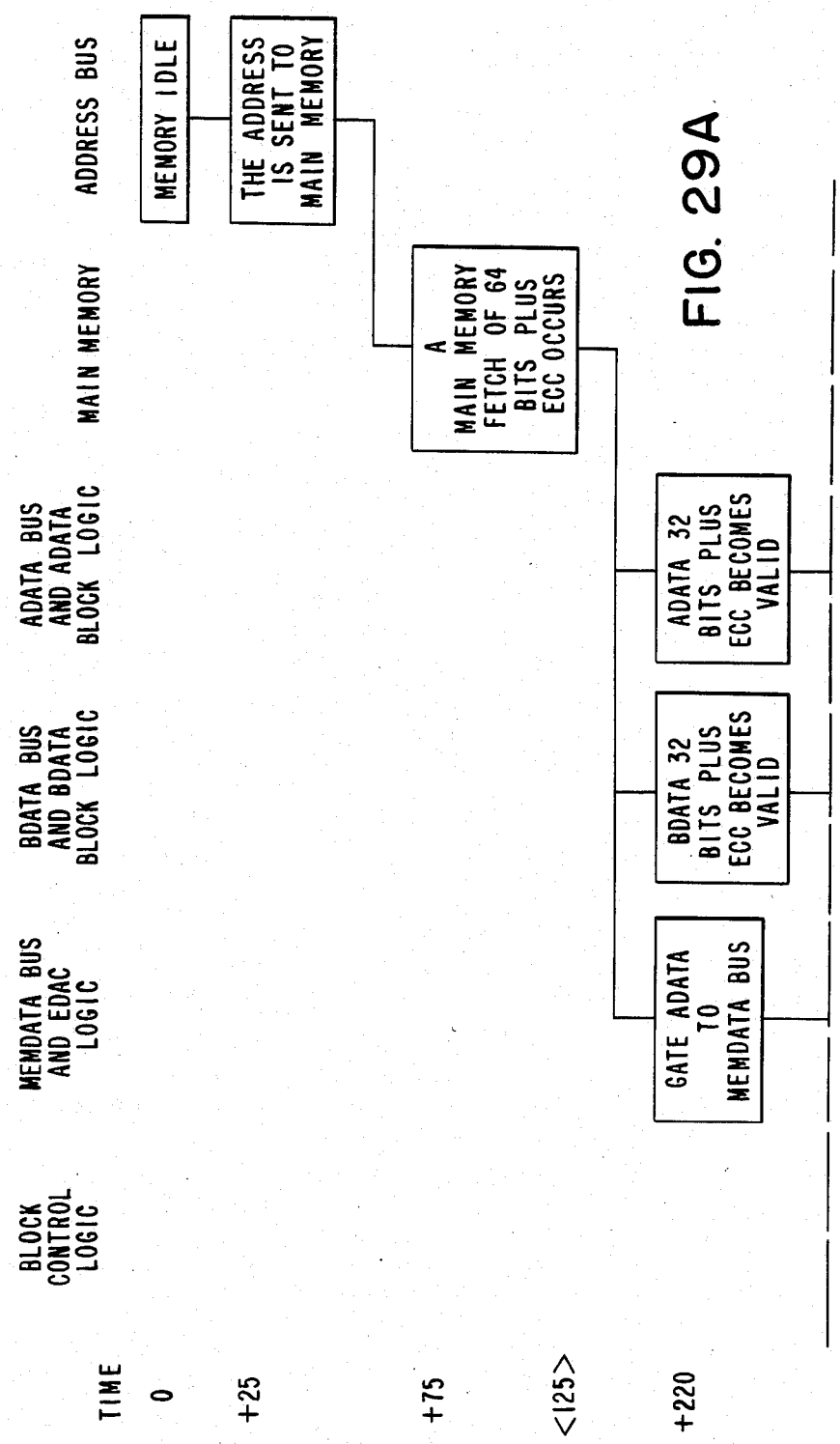

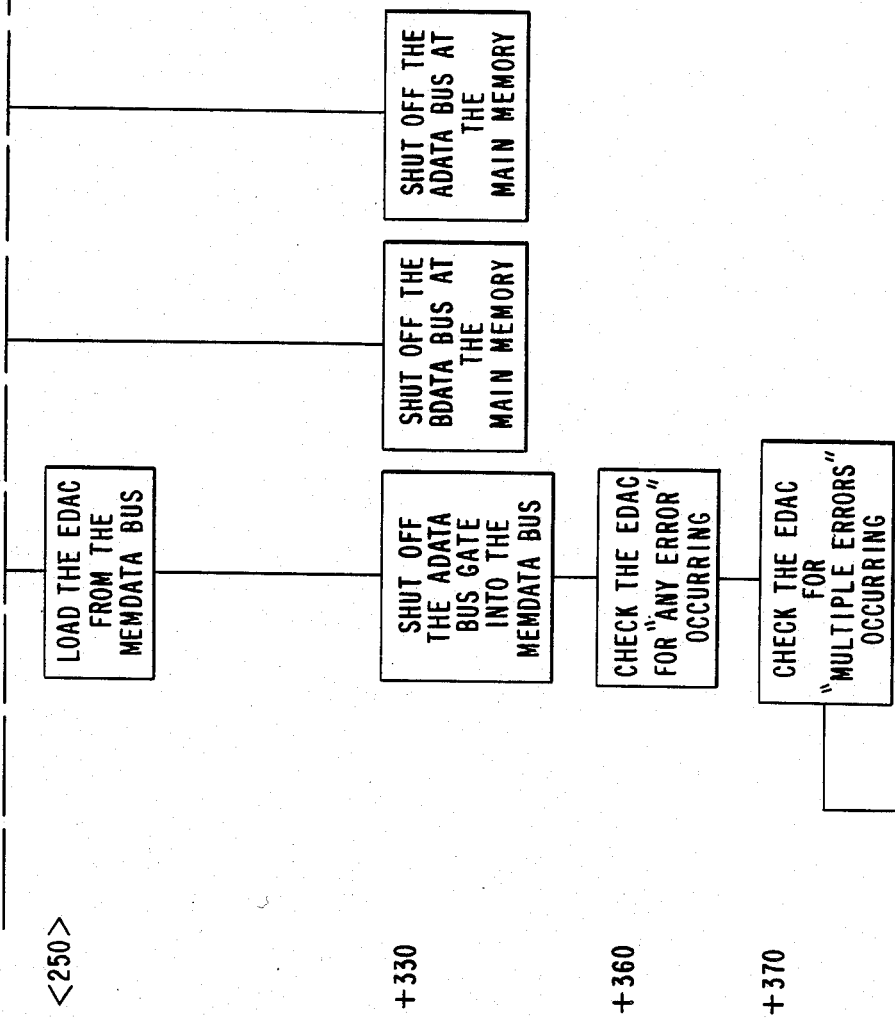

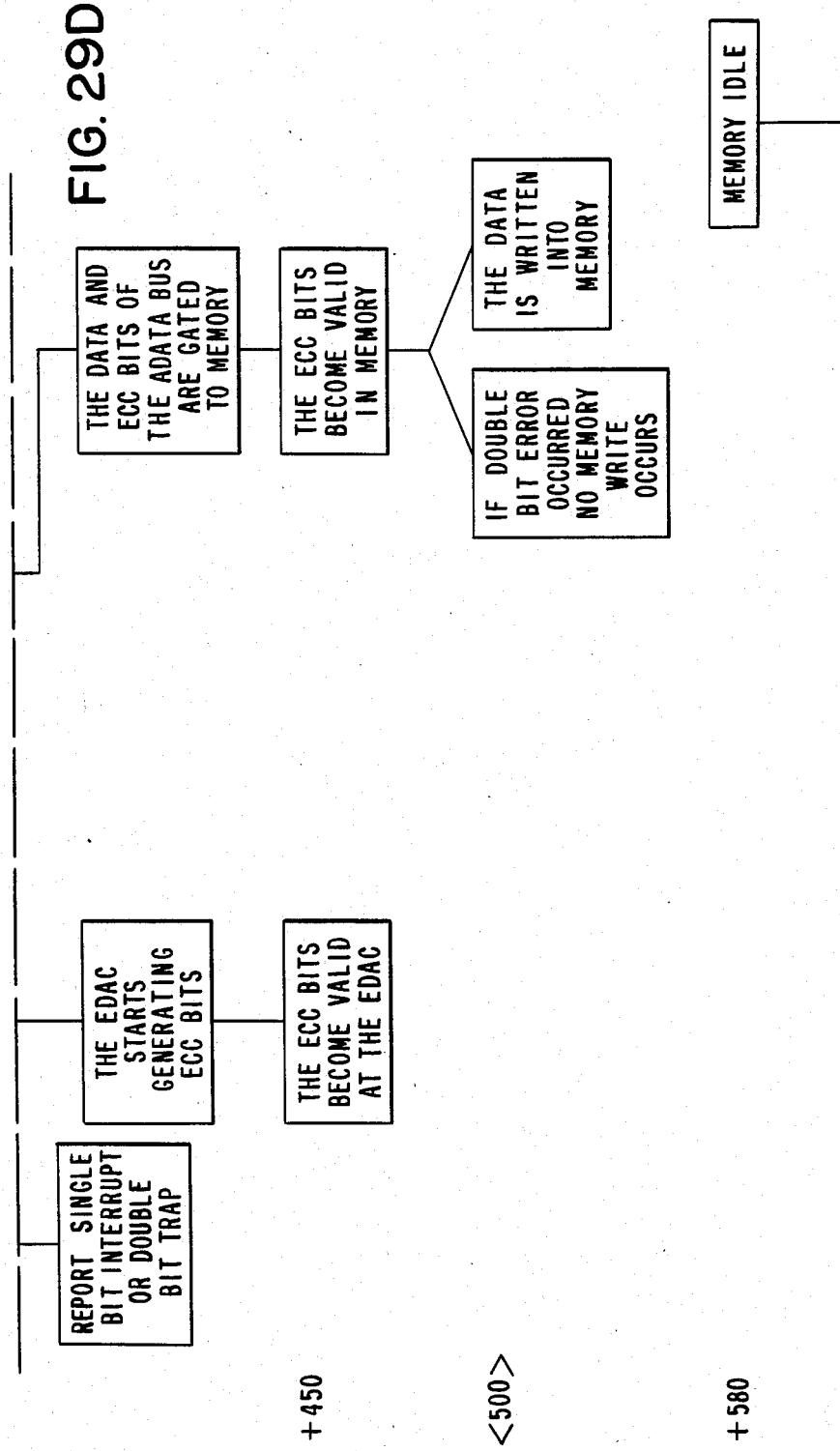

ERROR DETECTION AND CORRECTION SYSTEM

RELATED APPLICATIONS

The present application is related to U.S. application Ser. No. 643,512 filed Aug. 23, 1984, titled, "Direct Execution of Software on Microprogrammable Hardware" by Carson T. Schmidt et al, and owned by the assignee of the present application.

BACKGROUND OF THE INVENTION

The present invention relates to an error detection and correction system, and more particularly, to a method and apparatus for detecting single bit errors in a string of data bits such that the detected single bit errors may be corrected in an economical and efficient manner.

Error detection and correction circuits are known which detect single and double bit errors in data from a storage device, and for correcting single bit errors in such data. Many of these error detection and correction circuits are based on Hamming code or modified Hamming code described in the publication "Error Detecting and Correcting Codes", R. W. Hamming, The Bell System Journal, Volume XXIX, April, 1950, No. 2, pp. 147-160. Examples of these type devices are disclosed in U.S. Pat. Nos. 3,648,239; 4,005,405; 4,201,337; 4,251,863; and 4,410,988. An LSI device for error detection and correction is described in the publication "Chip Cuts Parts Count in Error Correction Networks", Reinhard Schurba, Electronics, Nov. 9, 1978.

The apparatus disclosed in U.S. Pat. No. 4,251,863 includes means for generating a hold signal to halt the requestor during the time required to test the requested addressable locations in a memory, and to correct an erroneous data word.

U.S. Pat. No. 4,112,502 to Scheuneman discloses apparatus for conditionally bypassing an error correction function wherein if no error exists in the read data from a random access memory, the memory is accessed at a relatively fast access time while, if an error exists in the read data the memory is accessed at a relatively slower access time to provide the added time required by an error correction circuit to correct the read data.

Many devices, such as the device disclosed in U.S. Pat. No. 4,201,337 and the device described in the Schurba article, and the AM2960 cascadable 16 bit Error Detection and Correction Unit available from Advanced Micro Devices Inc. of Sunnyvale, CA 94086, may be configured for error detection and correction of 64 bits. To check 64 bits of data, several of these devices must be cascaded. Error correction and detection devices are expensive, and there is an economic benefit in limiting the number of these devices needed to detect and correct errors in 64 bits of data.

In many configurations, a data processing system will assume that data from the memory is correct, and will continue processing until an error is detected. If a correctable error is found, the processing is halted, corrected data is substituted for the bad data, and processing is resumed. If the error detection process takes too long, then errors caused by the processing of bad data must also be located and corrected, if possible. Thus, it is important to locate errors in data as soon as possible so that processing may be stopped before the bad data is used.

In the present invention, data may be fetched from the memory either in 32 bit data fields, or as 64 bits of instruction data in two 32 bit portions. Each portion of the data is checked separately by an error correction and detection circuit which only checks 32 bits at a time, rather than all 64 bits of the entire data field at one time. A pair of single bit check circuits are provided for quickly determining if a single bit error will be located by the error correction and detection circuit for their respective 32 bit data portion. If either single bit check circuit determines that a single bit error will be located and corrected by the error detection and correction circuit, a clock block signal is generated to stop data processing until after the single bit error is corrected. The single bit check circuits, which operate in parallel, can thus determine if a single bit error exists in either 32 bit portion in about 31 nanoseconds. If a single bit error does exist, processing can be stopped before the bad data is used. If no single bit errors exist, the data processing system can continue with no degradation in its operation.

In addition, 32 bit data paths may be used rather than 64 bit paths. Also, less expensive, slower memory devices may be used, while still having the same or nearly the same time performance.

Memory operations are performed using 32 bit operations, wherein two 32 bit operations may be processed in parallel such that a 32 bit memory appears to be a 64 bit memory.

SUMMARY OF THE INVENTION

In a preferred embodiment, the error detection and correction apparatus includes a transmission bus for transmitting multi-bit data signals and multi-bit error correction code signals generated responsive to the multi-bit data signals in accordance with a modified Hamming code technique. Parity generators are connected to the bus for receiving the bits of the data signals and selected bits of the error correction code signals in accordance with the modified Hamming code technique for determining if a single bit error exists in the data. A two-state comparison gate is connected to the parity generators which has a first state if a single bit error does exist, and a second state if a single bit error does not exist. A separate error detection and correction circuit is provided to detect and correct any single bit errors in the data on the transmission bus. The two-state comparison gate is reset to its second state after the separate error detection and correction circuit corrects any single bit error in the data.

It is therefore an object of the present invention to provide an error detection and correction apparatus which detects single bit errors in data before the data is processed by a data processing system.

It is a further object of the present invention to detect and correct errors in a data field in smaller, more economic data portions.

It is another object of the present invention to limit the number of error detection and correction devices required to correct 64 bits of data.

It is another object of the present invention to lessen the amount of time required to detect single bit errors in a data field.

It is another object of the present invention to provide an error detection and correction circuit which may be used with slower, less expensive memory devices without a degradation in the operation of the memory.

It is a further object of the present invention to provide a 32 bit memory which appears as a 64 bit memory.

BRIEF DESCRIPTION OF THE DRAWINGS

FIGS. 7A-7E, assembled in accordance with the map of FIG. 8, is a block diagram of the data processing system of FIG. 1;

FIGS. 13A-13D, assembled in accordance with the map of FIG. 14, is a schematic diagram of a single bit check circuit for one of the data buses of FIG. 11;

FIGS. 15A-15D, assembled in accordance with the map of FIG. 16, is a schematic diagram of a single bit check circuit for another of the data buses of FIG. 11, and includes a schematic diagram of the clock block logic circuit of FIG. 11;

FIGS. 19A-19D assembled in accordance with the map of FIG. 20 is a block diagram of a 32 bit fetch operation of the system of FIG. 1;

FIGS. 21A-21C assembled in accordance with the map of FIG. 22 is a block diagram of a portion of a 64 bit fetch operation of the system of FIG. 1;

FIGS. 23A-23C assembled in accordance with the map of FIG. 24 is a block diagram of the remaining portion of a 64 bit fetch operation when no errors are detected;

FIGS. 25A-25D assembled in accordance with the map of FIG. 26 is a block diagram of the remaining portion of a 64 bit fetch operation when a error is detected;

FIGS. 27A-27B assembled in accordance with the map of FIG. 28 is a block diagram of a full store operation of the system of FIG. 1; and FIGS. 29A-29D assembled in accordance with the map of FIG. 30 is a block diagram of a partial store operation of the system of FIG. 1.

DESCRIPTION OF THE PREFERRED EMBODIMENT

Figure 1:
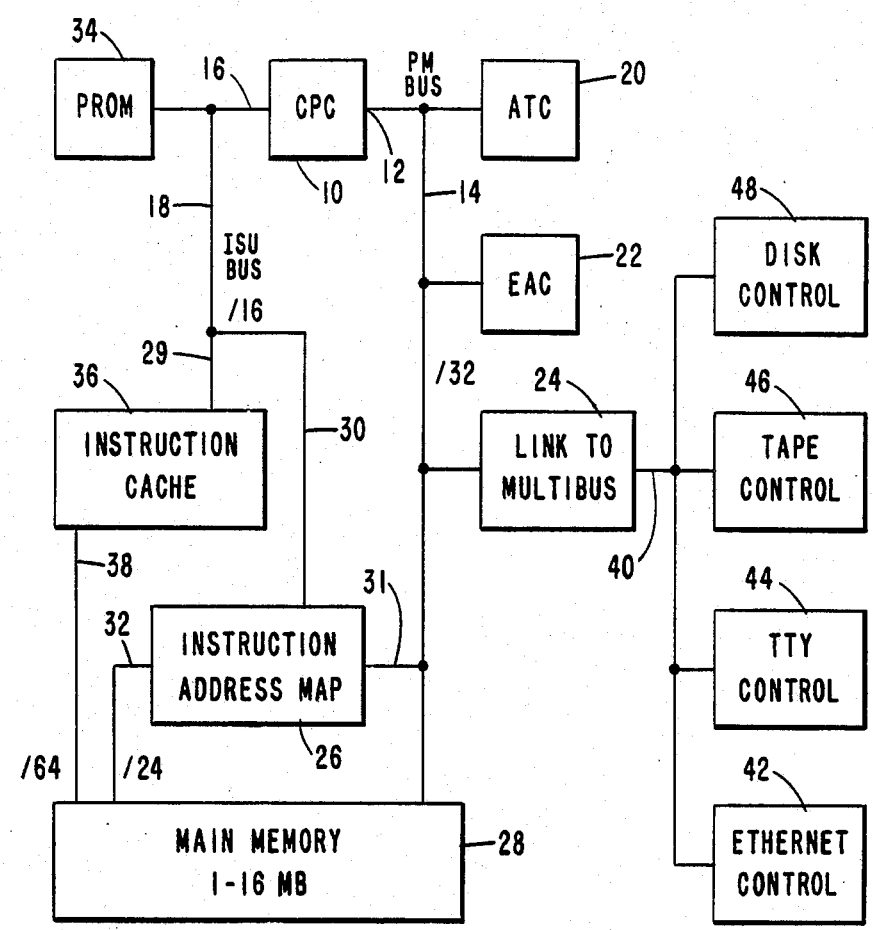
FIG. 1 is a block diagram illustrating a data processing system utilizing the present invention.

FIG. 1 is a block diagram illustrating a microprogrammable processor-based data processing system including a central processing chip (CPC) 10 having a data terminal 12 for connection with a processor memory bus (PM bus) 14, and an instruction input terminal 16 for connection with an instruction storage unit bus (ISU bus) 18. The PM bus 14 is connected to an address translation chip (ATC) 20, an extended arithmetic chip (EAC) 22, a link to MULTIBUS circuit (LIMB) 24, an instruction address map circuit 26, and an addressable main memory unit 28. The instruction address map circuit 26 is also connected to the ISU bus 18 by ISU line (ISUL) bus 30, and to the main memory 28 by buses 31 and 32 as shown.

The ISU bus 18 is additionally connected to a programmable read-only memory (PROM) 34 and an instruction cache circuit 36 by ISU Data (ISUD) bus 29. The instruction cache circuit 36 is additionally connected by a bus 38 to the main memory 28.

The preferred central processor chip is an NCR/32-000 central processor chip available from the NCR Corporation, Dayton, Ohio, and is fully described in the aforementioned reference manual RM-0484 titled "NCR/32 General Information". The preferred CPC 10 is a self-contained, 32 bit architecture, microprocessor element that provides the logic to execute a user microinstruction program. The CPC 10 writes data to and fetches data from the main memory 28 over the PM bus 14 which is a 32 bit processor memory bus, also fully explained in the aforementioned reference manual RM-0480.

Data to be stored in and fetched from the main memory 28 by the CPC 10 is placed on the PM bus 14 by virtual addresses. The ATC 20 in the preferred embodiment is an NCR/32-010 address translation chip fully explained in the aforementioned reference manual RM-0480. The ATC 20 provides memory management assistance to the CPC 10. It contains an address translation unit, a time of day counter/register, memory refresh control circuitry, and special registers available to the CPC.

The ATC 20 accepts virtual memory addresses from the CPC 10 over the PM bus 14, and translates these virtual memory addresses to real memory addresses for storing data in and fetching data from the main memory 28 at the real addresses. All of these features are fully discussed in the aforementioned reference manual are outside the scope of the present invention, and will not be further discussed herein.

Microinstructions for execution by the CPC 10 are provided over the ISU bus 18 which is a 16 bit bus fully explained in the aforementioned reference manual. The microinstruction set used by the preferred NCR/32-000 central processor chip is fully set out and explained in Chapter VI of reference manual RM-0480.

The EAC 22 may be one of several circuits for doing extended arithmetic operations, and are well-known in the art. One extended arithmetic chip usable with the invention is designated as 16081 available from National Semiconductor, 2900 Semiconductor Drive, Santa Clara, Calif. 95051.

The LIMB 24 is a hardware interface between the PM bus and a standard input/output bus (I/O bus) to which may be connected various input/output devices such as an ETHERNET control 42, a teletype control 44, a tape control 46, and a disk control 48, or any combination thereof, for controlling various input/output devices for reading data into or writing data out of the microprocessor controlled data processing system of the present invention. The I/O bus may be a conventional bus known by the trademark MULTIBUS of the Intel Corporation of 710 Lakeway, Sunnyvale, Calif. 94086, which is well-known in the data processing art.

The PROM 34 contains the diagnostic routines and the control portion of the kernel. As is known, the kernel handles all interrupts in the order of their assigned priority, handles all system calls, handles switcher routines when they are invoked, programs for transferring data from disk to memory and from memory to disk, and provides program synchronization. The switcher routines of the kernel may terminate the current process, roadblock or temporarily suspend the current process, or preempt the current process. Such kernel programs are well-known and are available from a number of different sources. As is known, the kernel provides a program execution environment for a data processing system, and is hardware-independent. One such kernel program is the UNIX program which is a trademarked product available from AT&T, P.O. Box 967, Madison Square Station, New York, N.Y. 10159.

The kernel routines load the operating system from one of the storage devices connected to the I/O bus 40 through the LIMB 24 and loads it in a privileged portion of memory. A user program can then be read into the system over I/O bus 40 for execution. The kernel locates the program in virtual memory and stores a portion or page of the program in the main memory 28. The operating system, controlled by the kernel, then steps through the program to operate the data processing system as desired, moving pages of virtual memory to the main memory 28 as may be needed, all of which is well-known and thoroughly understood in the art.

One of the types of programs which may be so loaded and executed are compiler programs which take user source programs written in a high level language, and converts them into microinstruction code which is directly executable by the CPC 10. For instance, a portable "C" compiler also available from AT&T can be modified to take a source program written in the "C" language and converts it to an "object" program having individual instructions in microcode which may be executed by the CPC 10.

To conform the portable "C" compiler to the preferred NCR/32-000 CPC, the CPC microinstruction set set out in Chapter VI of the aforementioned NCR/32 General Information Manual, RM-0480, are placed in the proper microinstruction code module in the compiler programs. As is known in the art, this provides a "C" language compiler which generates object programs compatible with and executable by the preferred NCR/32-000 central processor chip.

As will be understood, the compiled object program may be quite lengthy and contain many hundreds of microinstructions depending upon the complexity, the length, the peripherals to be used, and other factors of the high level language program being compiled. The compiled object program is stored in virtual memory and its location is mapped in instruction address map 26 as will be explained. When the object program is to be executed, the operating system resident in the privileged area of memory, and under the control of the kernel in PROM 34, instructs the CPC 10 to step through the program by fetching directly executable microinstructions over the ISU bus. The CPC 10 fetches instructions using virtual memory addresses; however, the instructions themselves are accessed from main memory 28 and are retrievable by use of real memory locations which specify the actual location in main memory 28 where the instruction is to be found. Therefore, virtual memory addresses issued by the CPC 10 must be converted to real memory addresses before the instruction may be fetched from the main memory 28 and returned to the CPC 10 for execution. In the preferred embodiment, a portion of the virtual memory of an instruction to be fetched is issued by the CPC 10 on the ISU bus 18, and a portion of the virtual address is issued on the PM bus 14. As the compiled object program was being formed in virtual memory, a cross-reference table cross-referencing the virtual address to the real address is additionally stored in a table in main memory. On an instruction fetch command, the ISU portion of the virtual memory is received by the instruction address map 26 over bus 30, and the PM bus portion is received over bus 31 and combined to give an address into the crossreference table. This combined address is then used to issue a fetch to the main memory to retrieve the real address of the desired instruction. A portion of this real address is then latched into a page register in the instruction address map, and the contents of this register is used to construct the real address in main memory corresponding to the virtual address where the desired directly executable microinstruction is stored. This microinstruction is passed from the main memory over bus 38 to the instruction cache 36, and from there over the ISU bus 18 to the CPC for execution, as will be explained.

It will be understood that fetched instructions are stored in the instruction cache 36 such that future fetches to the same addresses may be located in the instruction cache without having to go to main memory 28.

Figure 2:
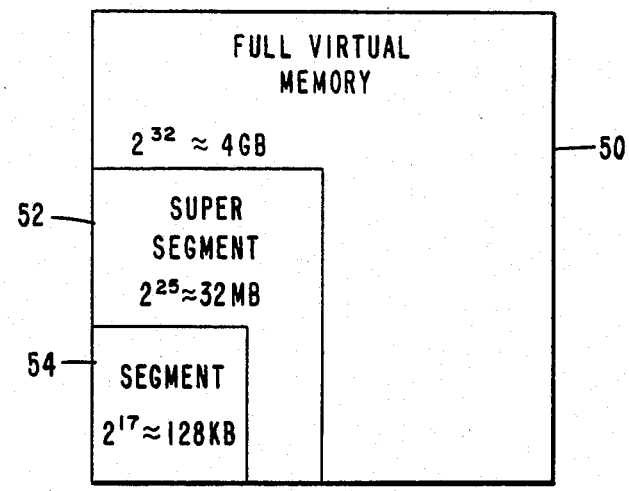
FIG. 2 is a diagrammatic representation of the virtual memory of the system of FIG. 1.

At this point, it will be helpful to review the difference between virtual memory and real memory. Turning to FIG. 2, an illustration is shown of the full virtual memory of the data processing system. The virtual memory 50 is stored on a random access device such as a disk controlled by disk control 48 of FIG. 1, such that portions of the virtual memory 50 may be read into the real memory of the data processing system as needed. The virtual memory of the exemplary system is $2^{32}$ bytes or approximately 4 gigabytes in size, addressed by virtual memory addresses made up of 32 bits. In the present system, the virtual memory 50 is divided into a plurality of super segments 52, each of which is $2^{25}$ bytes, or approximately 32 megabytes in size. As will be discussed, any virtual storage location in a super segment may be addressed by a virtual address 25 bits in length. Each super segment is hardware supported such that a virtual address in a super segment 52 may be decoded, providing direct hardware access to any virtual memory location in the addressed super segment.

The super segment in the present system is intended to be restricted to a single user. However, as is known, the kernel program such as UNIX, provides for multiple users residing simultaneously in the virtual memory of a data processing system. Kernel routines may be written such that if a single user exceeds the virtual memory bounds of the 32 megabyte super segment assigned to him, the software purges the hardware, establishes a new super segment, and continues with processing. It will be understood that such a provision for crossing the boundaries of a super segment is time-consuming. If such a capability is provided in the kernel routines, it will only be used rarely because there are few applications which would require more than 32 megabytes of storage.

Each super segment contains a plurality of segments 54 having a $2^{17}$ byte size or 128 kilobytes of storage. The segment 54 of 128 kilobytes of storage is addressable by the CPC 10 over the ISU bus 18 to a separate 128 kilobyte instruction storage unit, when the preferred CPC 10 is used as originally designed.

Figure 3:
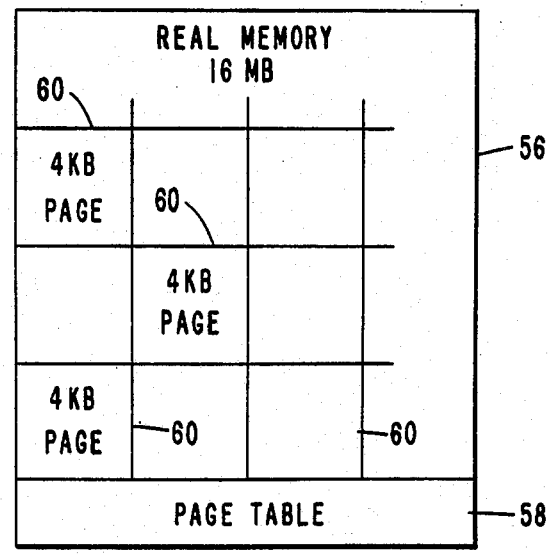
FIG. 3 is a diagrammatic representation of the real memory of the system of FIG. 1.

FIG. 3 provides a diagrammatic illustration of the real memory 56 present in the main memory 28. The real memory 56 contains 16 megabytes of storage, and includes a portion reserved for a page table 58, and a plurality of portions 60, each of which may contain a 4 kilobyte page of data from the virtual memory 50. The page table 58 contains the real memory address of the beginning of each 4 kilobyte page 60. As will be discussed, when the CPC wishes to fetch an instruction at a particular location in virtual memory, a fetch is made into a corresponding entry in the page table 58 to find if the desired virtual memory location is stored in real memory. If the desired memory location is part of a page stored in one of the page storage locations 60, the page table 58 will direct the hardware to the proper location in the 4 kilobyte page to retrieve the instruction from the desired location. If however, the desired location is not presently stored in the real memory 56, an indication is present in the page table 58 which directs the kernel to retrieve the page in virtual memory 50 containing the desired location, and to store it in the next available page storage location 60 in the real memory. If there are no storage locations 60 available in the real memory 56, one of the old pages is overwritten with the new, desired page. The old page, if it had been altered, will be rewritten to disk before it is overwritten. The page table entries are then updated to reflect the new configuration of the real memory 56. Thus, it can be seen that pages may be swapped from the virtual memory 50 into the real memory 56 into any available page storage section 60. After the desired page is located in real memory, and the page table 58 is updated, the data processing system returns to the task it was performing before the page swapping took place.

Figure 4:
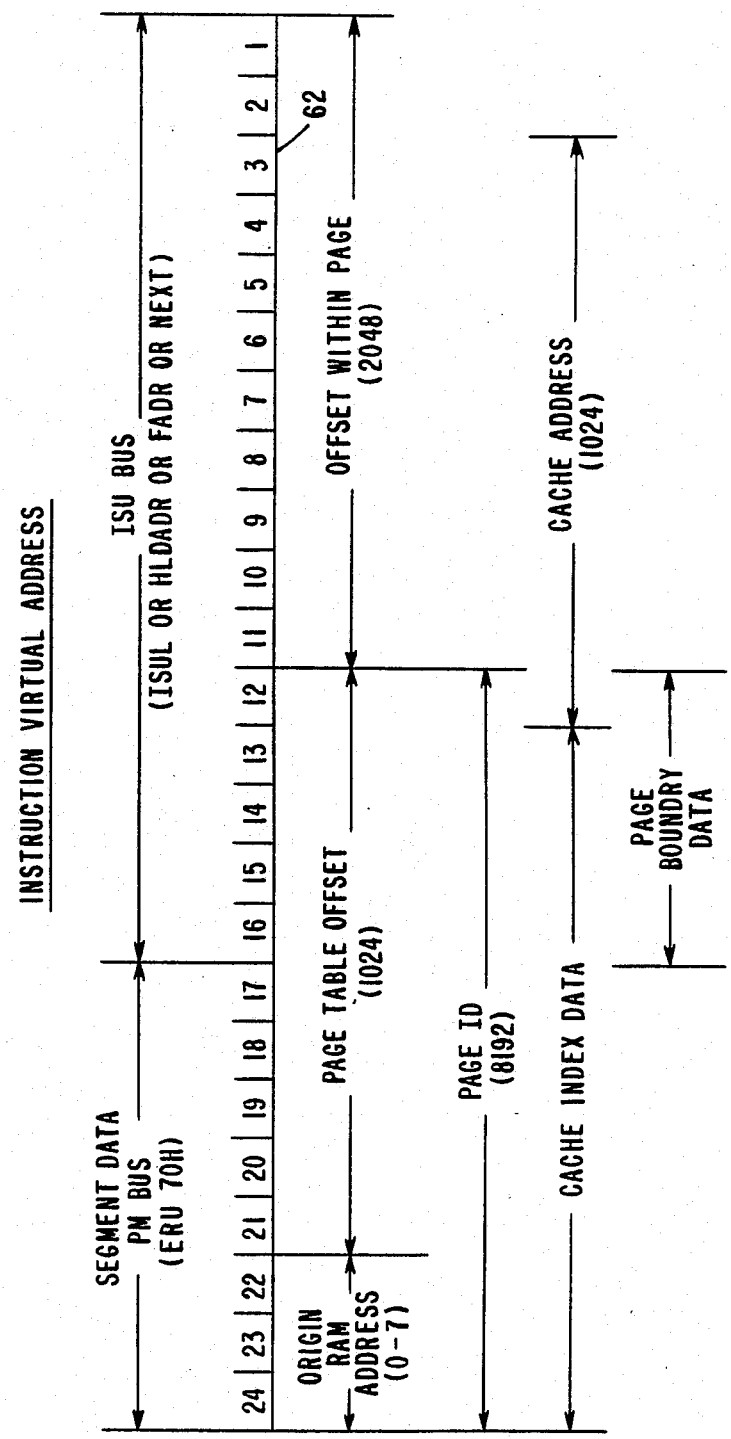
FIG. 4 is an illustration of the instruction virtual address.

FIG. 4 represents an instruction virtual address. The numbers 1-24 on horizontal line 62 represent the bits which make up the instruction virtual address. As discussed in connection with FIG. 2, the instruction virtual address provides for addressing of 32 megabytes in the super segment 52. Bits 1-16 are sent by the CPC 10 over the ISU bus 18 to the ISUL bus 30 of FIG. 1, to be discussed later. A portion of the instruction virtual address shown in FIG. 4 as bits 17-24 and identified as segment data, is sent by the CPC 10 over the PM bus 14 and the bus segment 31 to a segment register in the instruction address map 26, as will be discussed.

Bits 1-11 of the instruction virtual address shown in FIG. 4 represent the offset within the page designated by bits 12-24 as is stored in one of the segments 60 shown in FIG. 3. The offset within the page can have up to 2048 values and represent one instruction, each of which resides in 2 bytes of memory. Thus, the 2048 instructions represent 4 kilobytes of memory. As previously mentioned, each super segment 52 shown in FIG. 2 contains 8192 page entries of 4 kilobytes each. Thus, bits 12-24 of the virtual address can address any one of the 8192 pages in a super segment. Bits 12-24 of the virtual address refer to the page ID, and represent 8192 pages. The page ID is decoded by the use of page table 58 shown in FIG. 3, and is used to find the beginning address of the page in real memory, if the page is stored in real memory 56 as previously described. Each page table has 1024 entries as identified by the page table offset of bits 12-21 of the instruction virtual address. As shown in FIG. 4, bits 12-16 are originally provided over the ISU bus, and bits 17-21 are originally provided over the PM bus. The final three bits, bits 22-24, provide an address into an origin RAM, as will be explained. Bits 22-24 may have any one of the values 0-7, thus pointing to one of eight page tables, each one of which has 1024 entries.

As will be discussed later, bits 3-12 provide a cache address having 1024 entries, and bits 13-24 are stored in a cache index RAM used to determine if the desired instruction is stored in the cache buffer, as will be explained. Bits 12-16 are used as a page boundary check for verifying if an address is within the same page boundary as the previously-fetched address, as will be explained.

Figure 5:
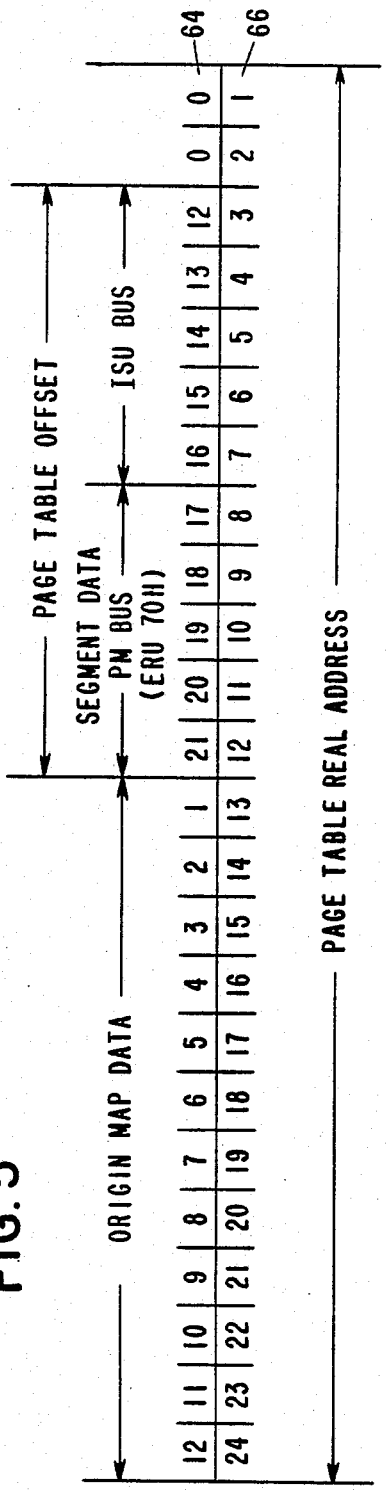
FIG. 5 is an illustration of the page table real address.

FIG. 5 is an illustration of the page table real address derived from the page table ID of FIG. 4. The numbers on horizontal line 64 identify bits as they are numbered in their indicated sources. The numbers on horizontal line 66 indicate the bit numbers of the page table real address. It will be understood that the page table real address is used to access the page table 58 illustrated in FIG. 3, wherein the real address of the beginning of the desired page is given. Bits 1 and 2 are set to 0 as shown in FIG. 5, as these two bits are not used in the fetching of data from the real memory 56. Bits 3-12 of the page table real address are made up of bits 12-21 of the virtual address identified in FIG. 4 as the page table offset. Bits 13-24 of the page table real address are made up of bits 1-12 of data from an origin RAM. It will be understood that the origin RAM, to be discussed later, includes at least 8 entries, having 12 bits for each entry. Bits 22-24 of the virtual address shown in FIG. 4 is used to access one of these 8 entries in the origin RAM, to obtain the origin map data bits 13-24 of the page table real address.

After the page table real address is constructed as shown in FIG. 5, a memory fetch is issued to the main memory 28 of FIG. 1 by the Instruction Address Map 26, and 4 bytes starting with the location in main memory of the page table real address are returned to the Instruction Address Map 26, over the PM bus 14. Twelve bits of these 4 bytes represent the beginning address of a section 60 in the real memory 56 in which the desired 4 kilobyte page of instructions is stored. This page table data is shown in FIG. 6, as will now be explained.

Figure 6:
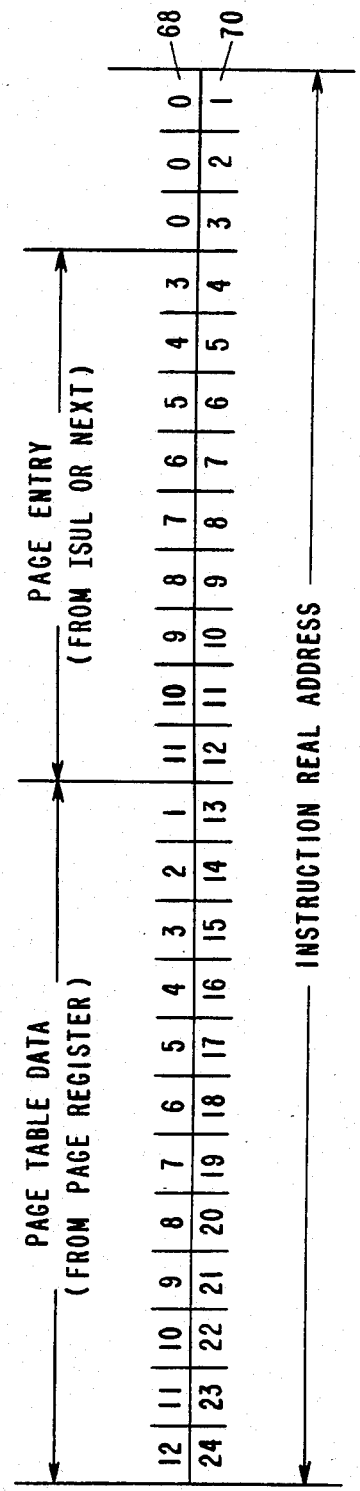
FIG. 6 is an illustration of the instruction real address.

FIG. 6 illustrates the instruction real address which is translated from the instruction virtual address. The numbers in horizontal line 68 are the bit numbers of the instruction real address as they were identified in their sources. The numbers on horizontal line 70 represent the bit numbers of the instruction real address. Bit numbers 1-3 are set to 0, as these bits are not used in an instruction memory fetch operation. Bits number 4-12 of the instruction real address are made up of bits 3-11 of the offset within page data of FIG. 4 of a desired instruction address issued over the ISU bus. The page table data obtained from the page table 58 of the real memory 56, makes up bits 13-24 of the instruction real address as explained in connection with FIG. 5. Each memory fetch instruction using the instruction real address shown in FIG. 6 will obtain 4 instructions starting at the instruction real address constructed as shown in FIG. 6. As bits 3-11 represent 1024 entries, it will be understood that the instruction real address constructed wise idle time to obtain instructions which will most likely be needed next.

Figure 7A:
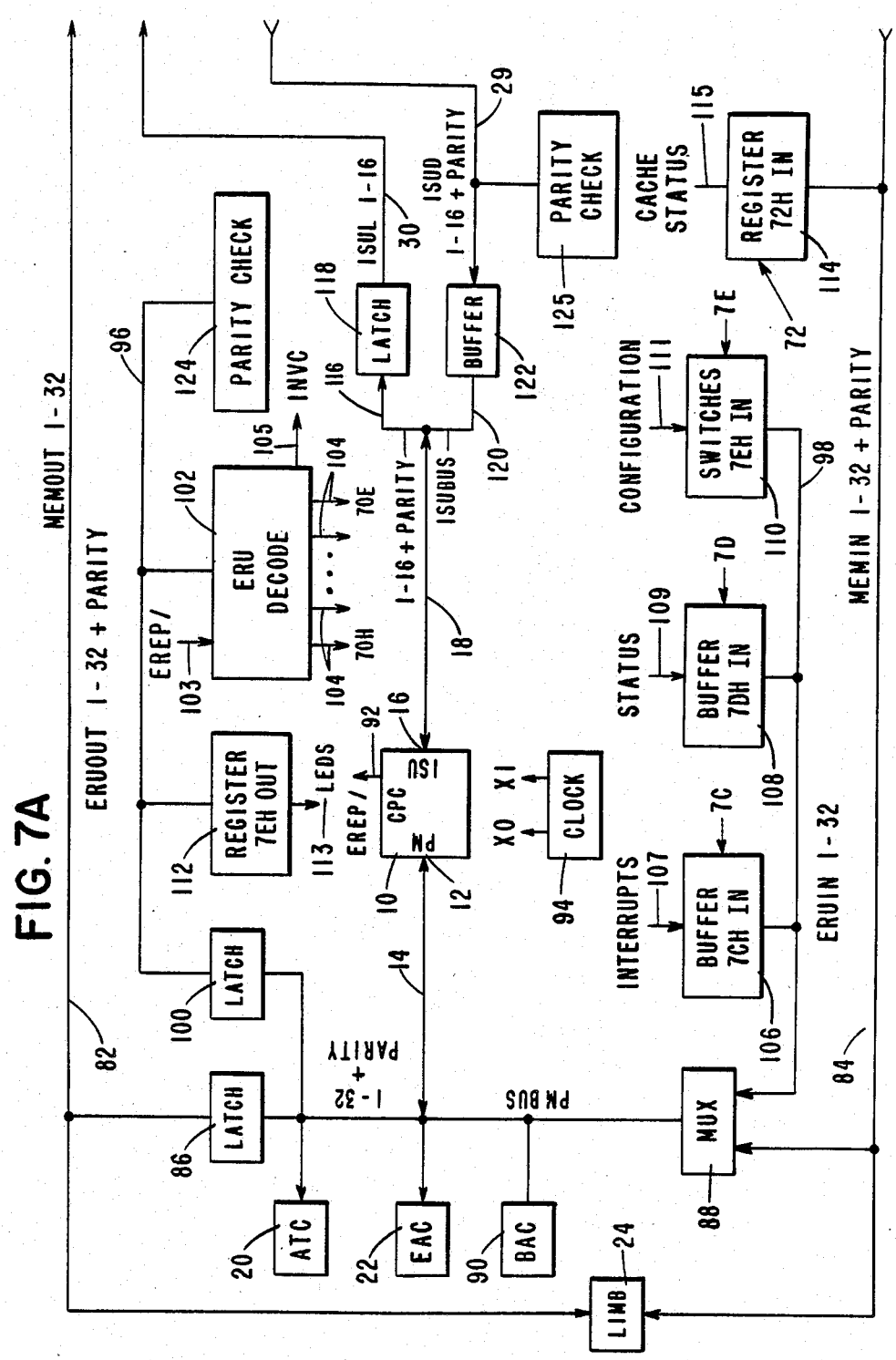
Figure 7B:
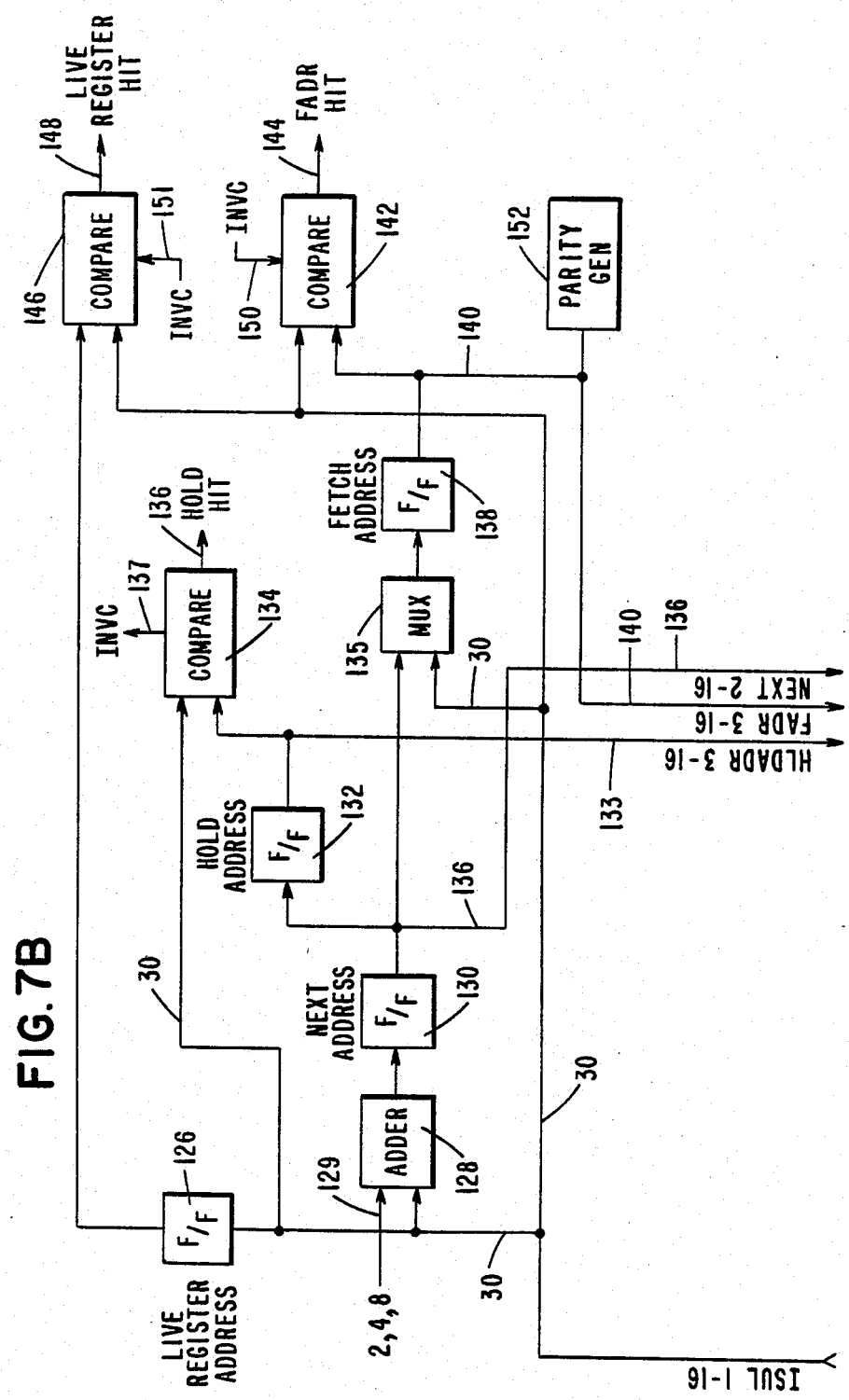

The prefetch circuit of FIG. 7B includes a live register address register 126 in which is stored bits 2-16 of the super segment virtual address of the presently executing instruction. This is the ISU portion of the immediately preceding virtual address received on the ISUL bus 30.

Also connected to ISUL bus 30 is an adder 128 for calculating the address to be prefetched. Depending upon the instruction code state (as will be explained later in the description of FIG. 10), the adder 128 adds 2, 4 or 8 to the virtual address on the ISUL bus 30 to calculate the next address. This calculated next address is stored in a next address register 130 whose input is connected to the output of adder 128. The output of the next address register 130 is connected to the input of a hold address register 132, the input of a multiplexer 134, and to a NEXT bus 136 used to transmit bits 2-16 of the NEXT address to other parts of the circuit as will be described. The output of the hold address register 132 is connected to one input of a compare circuit 134 which compares the address held in hold address register 132 with the address on the ISUL bus 30 connected to its other input. If the comparison circuit 134 determines that the address on its inputs are equal, a hold hit signal is placed on hold hit conductor 136. Compare 134 includes an invalidate compare input 137 for receiving the INVC signal from ERU decode circuit 102 which forces a non-compare output on conductor 136, even if the addresses input to compare 134 are equal.

Multiplexer 135 controls the passing of either the NEXT address output from the next address register 130, or the address on the ISUL bus 30 to a fetch address register 138. The output of fetch address register 138 is placed on a fetch address (FADR) bus 140, connected to a compare circuit 142. The other input of compare circuit 142 is connected to the ISUL bus 30. An output 144 of the compare circuit 42 provides a FADR hit signal when the addresses on the ISUL bus 30 and the FADR bus 140 are equal. A compare circuit 146 is also provided to compare the previous virtual address in the live register address register 126 and the present address on the ISUL bus 30. The output of compare circuit 146 is a live register hit lead 148 which indicates if the present address on ISUL bus 30 and the previous address in the live register address register 126 are equal. Compare circuits 142 and 146 are provided with inputs 150 and 151 respectively for inputting the INVC signal and holding the outputs 144 and 148 in a non-compare condition when activated.

As will be explained, a live register is provided which stores directly executable microcode instructions located in four consecutive addresses starting on a modulo four boundary in main memory 28. It is only necessary to compare bits 3-16 (or 2-16 while using PROM 34) of the virtual address on the ISUL bus 30 with bits 3-16 of the addresses input to comparator 146 to determine if the requested address is present in the live register.

A conventional parity generator 152 is provided to generate parity bits on the FADR bus 140 which are used for conducting parity bit error checks in other portions of the circuit. A HLDADR bus 133 is provided to transmit bits 3-16 of an address of hold address register 132.

FIG. 7C is a block diagram of the instruction cache circuit 36 of FIG. 1, and includes the connection details of PROM 34 also shown in FIG. 1. The instruction cache includes a live register 154 which holds four microcode instructions of 16 bits each. The microcode instructions are input into the live register 154 over buses 155 from a RAMDATA bus 156 which transmits 64 bits of data at one time (or 32 bits of instructions from PROM). Live register 154 is a tri-state device which may latch 64 bits on its inputs, and which places on the ISUD bus 29 connected to its output one of four groups of 16 bits dependent upon the value of the two least significant bits from ISUL bus 30 over bus 159. Thus, if the value of the first two bits of the address on ISUL is zero, the first group of 16 bits is placed from live register 154 on the ISUD bus 29. If the first two bits of the ISUL address is equal to one, the second group of 16 bits is placed on ISUD bus 29, if the value is two, the third group of 16 bits is placed and if the value is three, the fourth group of 16 bits is placed. It will thus be understood that the live register 154 contains four instructions at one time, and the first two bits of the ISUL address determines which of the four instructions will be transmitted over the ISUD bus 29 to the CPC 10.

A cache buffer 157 includes two 1K by 72 bit RAM banks 158 and 160 are provided for storing 1,024 groups of four microcode instructions. When outputting data from the RAM banks 158 or 160 to the live register 154, a cache address is input at the address terminals of the respective RAM bank, and the data is transmitted from the D/Q terminal onto RAM data bus 156. Also, when writing data from the RAM data bus 156 into either the RAM bank 158 or the RAM bank 160, a RAM address is placed on the address terminal of the respective RAM bank 158 or 160 and the data is transferred into the D/Q terminal for storage at the indicated address. Multiplexers 162 and 164 control the passing of addresses from the ISUL bus 30, the HLDADR bus 133, or the FADR bus 140, to the address terminals of the RAM's 158 and 160 respectively, as will be explained. Referring to FIG. 4, bits 3-12 of the virtual address on the ISUL bus, identified as cache address, is used to provide access to the 1,000 storage addresses in the RAM banks 158 and 160.

A cache index 165 is provided by RAM banks 166 and 168 in which are stored bits 13-24 of the user segment virtual address, shown in FIG. 4 as cache index data.

When a block of four instructions is fetched from the main memory MSU 28 which has not been previously fetched, it is stored in the cache buffer 157, and its cache index data is stored at a corresponding location in the cache index 165. During the prefetch operation, the cache index data of the virtual address being prefetched is compared to the cache index data stored in the cache index 165. If the cache index data of the address being prefetched is the same as the cache index data stored in the cache index 165, it is not necessary for the instructions of the virtual address being prefetched to be fetched from the main memory 28. A multiplexer 170 is provided for controlling the passing of the cache address from ISUL bus 30, FADR bus 140, NEXT bus 136 or from a counter 172 to the cache index 165. The counter 172 counts through the 1,024 addresses, and is used to purge the cache upon certain unrecoverable memory errors and when the user segment boundary is changed, as previously explained in connection with FIG. 2.

Buffers 174 and 176 are provided for passing cache index data to the D/Q terminals of the cache index in accordance with FIG. 6 may address locations anywhere in the 4 kilobytes of instruction data in a page stored in a page segment 60 as shown in FIG. 3.

Figure 8:
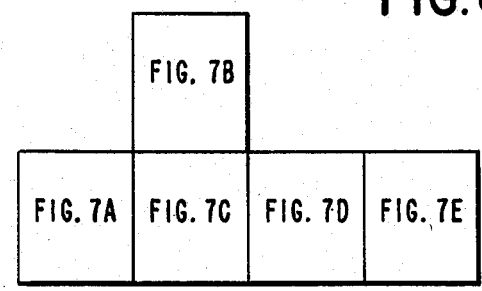

FIGS. 7A–7E assembled in accordance with the map of FIG. 8, is a block diagram of the data processing system. FIG. 7A presents a more detailed diagram of the connections of CPC 10, and the elements of the PM bus 14 and the ISU bus 18. The PM bus 14 connects to a 32 bit memory output (MEMOUT) bus 82, and a 32 bit memory input (MEMIN) bus 84. The MEMOUT bus 82 provides data to the LIMB 24, the instruction address map 26, and the main memory 28, as discussed in connection with FIG. 1. Data output by the CPC 10 onto the PM Bus 14 is placed on the MEMOUT bus 82 by a latch 86. The MEMIN bus 84 provides data from the main memory 28 to the PM Bus 14 through a multiplexer (MUX) 88, and also provides data from the main memory 28 to the LIMB 24 as shown.

The extended arithmetic chip 22 and the address translation chip 20 are connected to the PM Bus 14, and perform as described in connection with FIG. 1. A bus assist chip (BAC) 90 is also connected to the PM Bus 14, and may be any one of a number of conventional bus assist chips which sense data being transmitted over the PM Bus 14, and assist data transitions thereby speeding up and making more certain the reading of data on the PM Bus 14 by the various chips connected thereto.

The preferred CPC 10 is able to directly communicate, responsive to appropriate commands of its microcode, with registers in an external register unit (ERU). The ERU register locations are implemented external to the CPC 10 and are accessed over the PM bus 14. An external register enable/permit (EREP/) signal is generated by the CPC 10 and placed on the output lead 92 to enable the transfer of an external register message over the PM bus. A system clock 94 having a two phase output (X0,X1) is provided to control the CPC 10 and time the system, as is known.

An external register transfer is a three stage operation consisting of bus arbitration leading to device selection, register selection during X0, and data transferred during X1. Output data from the CPC 10 to an ERU is provided over either the MEMOUT bus 82 or ERUOUT bus 96, while input messages from an ERU to the CPC 10 are provided over either the MEMIN bus 84 or an ERUIN bus 98. Data transferred from the PM bus 14 to the ERUOUT bus 96 is controlled by latch 100, and data transferred from the ERUIN bus 98 to the PM bus 14 is controlled by the previously mentioned multiplexer 88.

When the CPC 10 is to transfer data to an ERU, the CPC 10 requests access to the PM bus 14. When access is granted, the ERU address is latched in latch 100 and placed on the ERUOUT bus 96 during X0. An ERU decode circuit 102, responsive to the EREP/ signal input at 103, decodes the address on ERUOUT bus 96 and transmits an enable signal over one of the enable lines 104 to enable the ERU register addressed. Of the ERU registers addressable by the CPC 10, registers 70 (H) through register 7E (H) are addressed by ERU decode circuit 102 and will be discussed further herein. The other ERU registers supported by CPC 10 are used in their conventional manner for control of the CPC 10 and the data processing system as discussed in the aforementioned NCR manual RM-0480.

After connection is established between the addressed ERU register by ERU decode circuit 102, the data to be transferred to the addressed ERU is placed on the PM bus, latched in latch 86 and latch 100 thereby placing the data on MEMOUT bus 82 and ERUOUT bus 96 during X1. Thus, the addressed ERU register enabled by the appropriate line 104 accepts the data placed on either the MEMOUT bus 82 or ERUOUT bus 100 during the X1 portion of the clock.

When data is sent to the ERU register 70(H), the ERU decode circuit 102 also outputs an Invalid Compare (INVC) signal on its output lead 105, to be discussed later.

Data may be, in a reverse procedure, accepted directly from an ERU register by the CPC 10 over the PM bus 14. In this process, responsive to an appropriate command, the CPC 10 gains access to the PM bus 14, transmits the address over PM bus 14 to ERUOUT bus 96 of the desired ERU register from which data is to be accepted, and accepts the requested data from either the MEMIN 84 or ERUIN bus 98 through multiplexer 88 during X1.

ERU register 7C (H) IN 106 is used to transmit various interrupt signals 107 from the system to the CPC 10. ERU register 7D (H) IN 108 is used to transmit certain status signals 109 of the system to the CPC 10, and ERU register 7E (H) IN 110 is used to transfer configuration signals 111 set by configuration switches to the CPC 10. These switches may be used to communicate the configuration, such as peripheral assignments, to the CPC 10 for use in controlling data communication between the data processing system and various peripherals connected to the IO bus 40 discussed in connection with FIG. 1. The output command of CPC 10 to ERU register 7E (H) OUT 112 illuminates a series of light emitting diodes (LED) 113 to give a visual indication of the status and configuration of the system.

Certain ERU registers are connected to the MEMIN bus 84 whose data is passed from the register to the CPC 10 through the multiplexer 88. One such register is ERU register 72 (H) IN 114 which collects cache status signals 115 to be transmitted to the CPC 10 when requested.

The ISU bus 18 of FIG. 1 includes an intermediate output bus 116 connected to a latch 118, and an intermediate input bus 120 connected to a buffer 122. The latch 118 places ISU address from the ISU terminals 16 of CPC 10 on the ISUL bus 30 of FIG. 1, which is connected to the instruction address map circuit 26. ISU input data from the instruction cache circuit 36 to the ISU terminal 16 comes from the ISUD bus 29 of FIG. 1, through buffer 122.

Conventional parity check circuits 124 and 125 are connected to ERUOUT bus 96 and ISUD bus 29 respectively for checking for parity bit errors on their respective buses.

FIG. 7B provides a functional block diagram of a prefetch circuit which is a portion of the instruction address map circuit 26 of FIG. 1. It has been found that in the majority of application programs, greater than 90% of the instructions directly follow the previously-executed instruction. The prefetch circuit of FIG. 7B is provided to obtain an instruction which follows the presently executing instruction, such that when the presently executed instruction has been completed, there is a high probability that the next instruction of the program has been fetched by the prefetch circuit and be waiting in the cache buffer. This prefetch function significantly speeds up the execution of the data processing system by efficiently making use of other- RAM's 166 and 168 during RAM store operations. As will be explained, the PM bus portion of the user segment virtual address, bits 17-24 of FIG. 4, are placed on a segment (SEG) bus 178. Buffers 174 and 176 are connected to the SEG bus 178 and the FADR bus 140. During a store operation, the eight bits on the SEG bus 178 and bits 13-16 on the FADR bus 140 from buffers 174 or 176 are passed to the D/Q inputs of the respective cache index RAM's 166 and 168 for storing at the address passed by multiplexer 170.

Compare circuits 180 and 182 are provided to compare the cache index data of the desired virtual address with the cache index data stored in the cache index 165, as previously described. The desired segment data is placed on one input of the compares 180 and 182 over bus 184 from bus 178, and bits 13-16 from the ISUL bus 30 is transmitted to the inputs of compare circuits 180 and 182 over bus 186 to complete the cache index data of the desired virtual address for comparison with the cache index data stored in the cache index 165. Equal compares by comparator 180 results in a bank one hit signal on comparator output 181, and equal compares by comparator 182 results in a bank two hit signal on comparator output 183. Control terminals 190 and 191 are provided in comparators 180 and 182 respectively to force unequal compare outputs on comparitors output 181 and 183 responsive to an input of an INVC signal. Parity check circuits 192 and 194 are provided as shown to make conventional parity bit error checks of cache index data stored into and read out of the cache index 165.

As will be explained, four microcode instructions are read at a time from the main memory 28. Two instructions are read from an A portion of the main memory and placed on ADATA bus 196. At the same time, two instructions are read from a B portion of the main memory 28 and placed on a BDATA bus 198. The ADATA bus 196 and BDATA bus 198 are part of the bus 38 of FIG. 1. A latch 200 latches the two instructions on the ADATA bus 196, and the two instructions on the BDATA bus 198 and places them on the RAM data bus 156 for storage in the cache buffer 157 as described.

The division of the cache into separate banks, such as bank 1 and bank 2 shown herein, and their set associative operation is well known and understood by those skilled in the art, and thus will not be explained further here.

A multiplexer 202 has its inputs connected to the ISUL bus 30, and the HLDADR bus 133, and its output connected to the address input of the PROM 34. The PROM 34 is operated much like a cache except that all of the instructions in the PROM routines are permanently stored in the PROM 34. Also, the PROM 34 is two instructions wide, and thus stores two microinstructions at each address rather than four as are stored in the cache. For this reason, whenever a PROM routine is being executed, the value two is input at input 129 of adder 128 to calculate the next address as discussed in connection with FIG. 7B. When a PROM routine is being executed, the address of the next desired instruction will either appear on the ISUL bus 30, or will result in a hold hit, in which case the address will appear on the HLDADR bus 133.

A conventional parity check circuit 171 is connected to the RAM data bus 156 to perform parity checks of the data on bus 156. A flip-flop circuit 173 and a decode circuit 175 are provided to decode the instructions appearing on the ISUD bus 29 for breakpoint, trap and interrupt conditions, and to send corresponding signals to the CPC 10 by way of appropriate ERUs if one of these conditions is found.

Figure 7D:
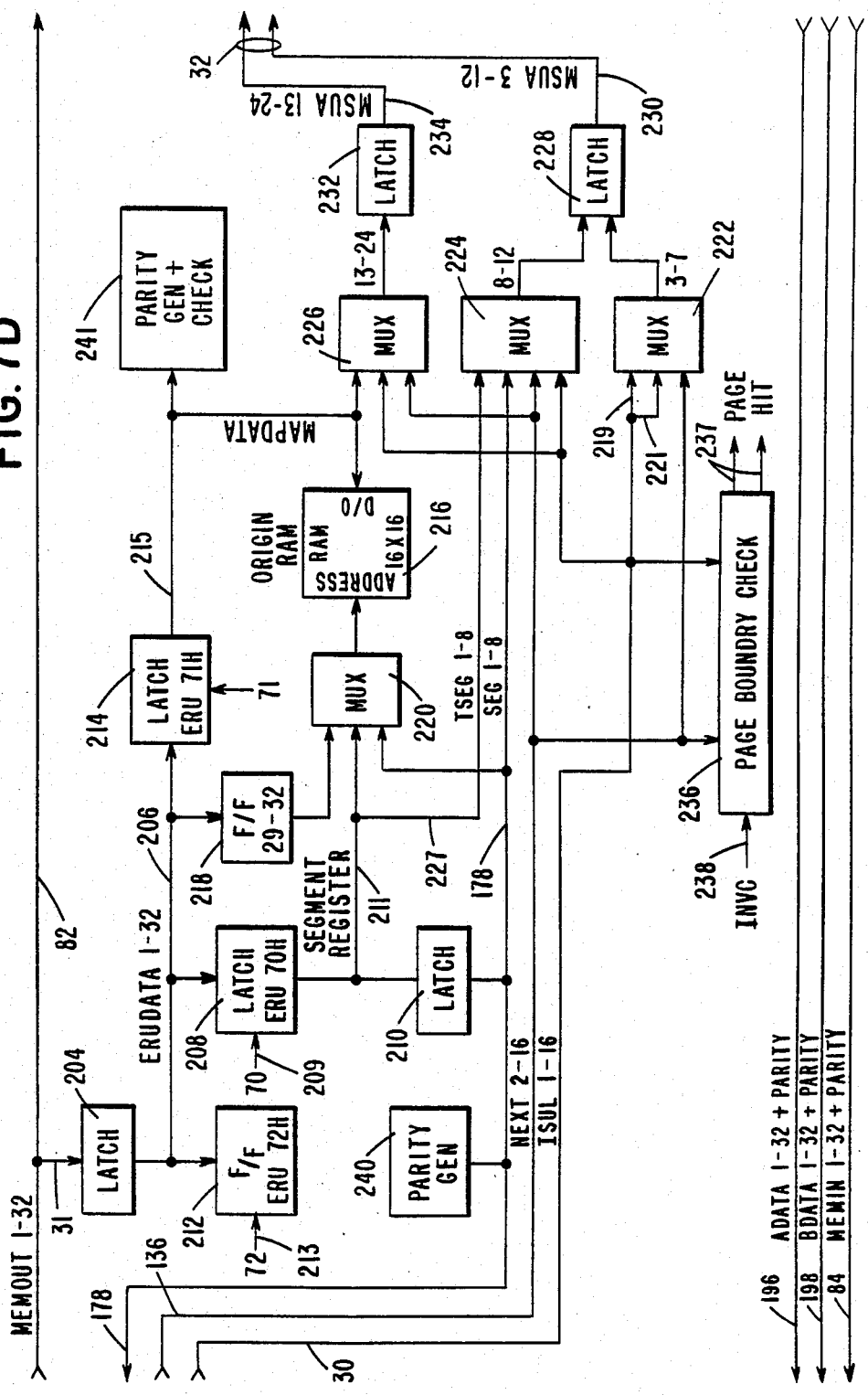

FIG. 7D is a block diagram of the remaining portion of the instruction address map 26 of FIG. 1 for the translation of virtual-to-real instruction addresses. As previously explained, when data is output to an ERU register, the ERU register address is output by the CPC 10 to the ERU decode circuit 102 during X0, and the data to be stored in the addressed ERU is placed on the MEMOUT bus 82 during X1. In FIG. 7D, a latch 204 latches data on the MEMOUT bus 82 and places it on an ERUDATA bus 206. Latch 208 is ERU register 70 (H) and is enabled by a proper signal from the ERU decode circuit 102 of FIG. 7A received at its input 209. ERU 70 (H) 208 is a segment register which stores the segment data identified in FIG. 4 as bits 17-24 of the virtual address. This segment data is passed to latch 210 and placed on the SEG bus 178 discussed in connection with FIG. 7C. Flip-flop 212 enabled by an output command addressed to ERU register 72 (H) at input 213, allows the CPC 10 to send certain signals to the instruction cache. This provides for status inquiries to be communicated between the cache and the CPC 10. Latch 214, enabled by a signal from the ERU decode circuit 102 of FIG. 7A provides an ERU register 71 (H). ERU register 71 (H) is a MAPDATA storage register, whose use will be explained.

A 16 by 16 bit RAM 216 provides an origin RAM for storing page table origin RAM data identified herein as MAPDATA. A flip-flop 218 has its input connected to the ERU data bus 206 and is a register for storing the origin RAM address in the origin RAM 216. A multiplexer 220 controls the passing of origin RAM addresses from either the flip-flop 218, bits 6-8 of the segment register 208, or bits 6-8 from the SEG bus 178.

When the KERNEL is setting up the page table 58 in real memory as discussed in connection with Fig. 3, the origin MAPDATA discussed in connection with FIG. 5 is placed on the MEMOUT bus 82 and latched into ERU 71 (H) 214. The origin RAM address corresponding to the origin MAPDATA is placed at the same time on the MEMOUT bus 82 and latched into flip-flop 218 for use as the address of the origin RAM 216. The multiplexer 220 then passes the origin RAM address from flip-flop 218 to the address terminal of the origin RAM 216, and the MAPDATA latched in ERU 71 (H) 214 is provided to the D/Q terminal of the origin RAM 216 for storage.

In addition to the eight origin RAM addresses discussed in connection with FIG. 4, additional origin RAM entries are provided in RAM 216 and used for page table entries to direct fetches to the privileged portion of the main memory 28 for use by system programs. Such privileged entries are provided for by including a fourth bit in the RAM address which is given a value of 1 for privileged operations, and a value of 0 for user operations. Multiplexers 222, 224, and 226 are connected as shown in FIG. 7D for providing the bits of the MSU address to the main memory 28 for various types of memory fetch operations.

Multiplexer 222 provides bits 3-7 of the MSU address, and has three inputs. Inputs 219 and 221 of multiplexer 222 are connected to the ISUL bus 30, and the remaining input is connected to the NEXT bus 136. Multiplexer 224 provides bits 8-12 of the MSU address and has four inputs. One input is connected to ISUL bus 30, one input is connected to NEXT bus 136, and one input is connected to the SEG bus 178. The fourth input of multiplexer 224 is connected to the output of the segment register by a TSEG bus 227. Multiplexer 226 provides bits 13-24 of the MSU address, and has 3 inputs. One input is connected to the next bus 136, one input is connected to the ISUL bus 30, and the third input is connected to the map data bus 215.

The outputs of multiplexers 222 and 224 are connected to a latch 228, and has its output connected to an MSUA bus 230 which carries bits 3-12 of the MSU address. The output of multiplexer 226 is connected to a latch 232 whose output is connected to an MSUA bus 234 carrying bits 13-24 of the MSU address.

A page boundary check circuit 236 is provided having one input connected to the ISUL bus 30, and a second input connected to the NEXT bus 136. The page boundary check circuit 236 includes a storage register for storing bits 12-16 of the user segment virtual address identified as page boundary data in FIG. 4. This page boundary storage register stores the page boundary data of the previously translated instruction virtual address which appeared on the ISUL bus 30, and is checked against the present address on the ISUL bus 30 or the present address on the NEXT bus 136, depending upon which bus contains the address to be fetched. If there is an equal compare, a page hit signal is placed on one of the outputs 237 of the page boundary check circuit 236. A control terminal 238 forces the comparisons of the page boundary check circuit 236 to a non-compare condition.

A conventional parity generator circuit 240 is connected to SEG bus 178 to generate parity bits for the segment data thereon. A parity generator and check circuit 241 is connected to map data bus 215 for generating parity bits for MAPDATA signals coming from ERU register 71(H) to be stored in RAM 216, and for performing conventional parity checks of data on the MAPDATA bus 215 coming from the origin RAM 216.

TSEG bus 227 connected between bus 211 and multiplexer 224 provides for passing data representing real addresses directly from the ERUDATA bus 206, through the multiplexers 224 and 226, to the MSUA buses 230 and 234. This may be done by passing MSUA bits 18-24 through multiplexer 226 from ERU 71(H) 214 and the map data bus 215, and MSUA bits 8-12 through multiplexer 224 from the TSEG bus 227, thereby allowing for retrieving data from real locations without first obtaining page table data from the page table portion of main memory 28.

The system also allows for the CPC 10 to be used in its conventional manner. This is done by reserving the first 128K of memory in the main memory 28 and treating it as an instruction storage unit (ISU) in the conventional manner. When operated in this way, an ISU address is placed on the ISUL bus 30. Multiplexers 222, 224 and 226 then pass the ISU address on ISUL bus 30 to the MSUA buses 230 and 234 for reading instructions stored in the first 128K of main memory 28. The ISU address is passed by transferring MSUA bits 3-7 from the ISUL bus 30 over bus 221 through multiplexer 222, MSUA bits 8-12 from the ISUL bus 30 through multiplexer 224, and MSUA bits 13-16 from the ISU bus 30 through multiplexer 226. MSUA bits 14-24 are turned off to insure that the first 128K of main memory 28 is addressed. The four instructions fetched in response to this address are stored in the live register 154 of FIG. 7C, and the system is operated as described herein, thereby providing that the CPC 10 may be operated in its conventional manner such as in an emulator mode in accordance with its original design as discussed in the aforementioned publication RM-0480.

FIG. 7E is a block diagram of the main memory 28 of FIG. 1. Referring to FIGS. 5 and 6, when the main memory 28 is addressed using the page table real address of FIG. 5, the page table data of FIG. 6 is placed on the MEMDATA bus 248 by a buffer 250. A flip-flop 244 is connected to the MEMDATA bus 248, and is a page register for storing the page table data recovered from the page table in the main memory MSU as discussed. The page register 244 has its output connected to the MSUA bus 234 carrying bits 13-24 of the MSU address.

Latch 246 has its input connected to the MEMOUT bus 82 and its output connected to the MSUA buses 230 and 234 for providing a complete MSU address. Latch 246 is a PM address register which may be used to fetch data from the main memory 28 when the CPC 10 is being used in its conventional manner.

A memory data (MEMDATA) bus 248 is connected to the output of store data register 242. A buffer 250 has one input connected to the ADATA bus 196, and one input connected to the BDATA bus 198, with its output connected to the MEMDATA bus 248 as shown. The main memory 28 memory storage unit (MSU) includes a series of dynamic random access memories (DRAM) 252, a portion of which are shown in FIG. 7E. It will be understood that additional DRAMs may be provided as needed to supply sufficient memory to store the real memory as discussed in connection with FIG. 3.

The MSU is divided into an A portion 254 and a B portion 256. The DRAMs 252 of the A portion 254 are connected to the ADATA bus 196 through a latch 258. Similarly, the DRAMs 252 of the B portion 256 are connected to the BDATA bus 198 through latch 160.

A single bit error detection and parity generator circuit 262 is connected to both the ADATA bus 196 and the BDATA bus 198, and an error detection and correction circuit 264 is connected to the MEMDATA bus 248. The error detection and correction circuit 264 detects double bit errors and corrects single bit errors detected by the single bit error detection circuit 262.

A latch 266 has its input connected to the MEMDATA bus 248, and its output connected to the MEMIN bus 84. The latch 266 provides for data to be fetched from either the ADATA bus 196 or the BDATA bus 198 through the buffer 250 and placed on the MEMIN bus 84 when the CPC 10 is being used to fetch data from the main memory 28 in a conventional manner, and when the page table data is being fetched from the page table 58 as previously discussed. Latch 268 provides an ERU register 78(H), and is enabled by an appropriate signal from the ERU decode circuit 102 of FIG. 7A and an output command from the CPC 10 to send status inquiry signals from the CPC to the memory. Latch 270 provides an ERU register 78(H) which is enabled by appropriate signals from the ERU decode circuit 102 and an IN command from the CPC 10 to receive various status signals and error signals from the memory. Thus, latches 268 and 270 provide for direct communication between the CPC 10 and the memory for the transmission of status and error signals.

It will further be understood that store data register 242 connected to the MEMOUT bus 82 places data and ECC check bits generated by the error detection and correction circuit 264 to be stored in the memory on the MEMDATA bus 248, which is in turn passed by the buffer 250 to the ADATA bus 196 to be stored in the appropriate DRAM 252 through latch 272. In this case, the PM address is latched in PM address bus 246 and placed on the MSU address buses 230 and 234. The data to be stored is latched in the store data register 242 and passed through the buffer 250 to the ADATA bus 196 to the latch 272 to be stored in the proper DRAM 252.

The logic circuit 274 provides the logic for accomplishing the storage and retrieving of data in the memory DRAMs 252. The multiplexer 276, in concert with the logic circuit 274 directs the MSU address from the MSUA buses 230 and 234 to the proper DRAMs 252 through buffers 278 and 290. In the illustrated embodiment, the DRAMs 252 are loaded 32 bits at a time. It will be understood that the logic circuit 274 addresses the proper DRAM 252, and enables the addressed DRAM to accept data in the latch 252 latched from ADATA bus 196 as described. The parity check circuit 292 provides conventional parity bit checking for the MSU addresses. The logic provided by the circuit 274 and the multiplexing functions of multiplexer 276 are well-understood in the art for storing and retrieving data from memory storage units, fall outside the scope of the present invention, and thus will not be discussed further.

When the CPC 10 issues a new virtual address on the ISUL bus 30 in response to a jump command, it means that the virtual address does not follow consecutively the address previously placed on the ISUL bus 30 and stored in the live register address register 126 of FIG. 7B. This means that the program has been directed to execute the instruction on a line other than the line immediately following the line of the previous instruction. Responsive to such a jump, the address on the ISUL bus 30 is used to fetch the target of the jump instruction, and then the value 4 is input to adder 128 over 129, and added to the address on the ISUL bus 30 to find the next address to be stored in the register 130.

Figure 9A:
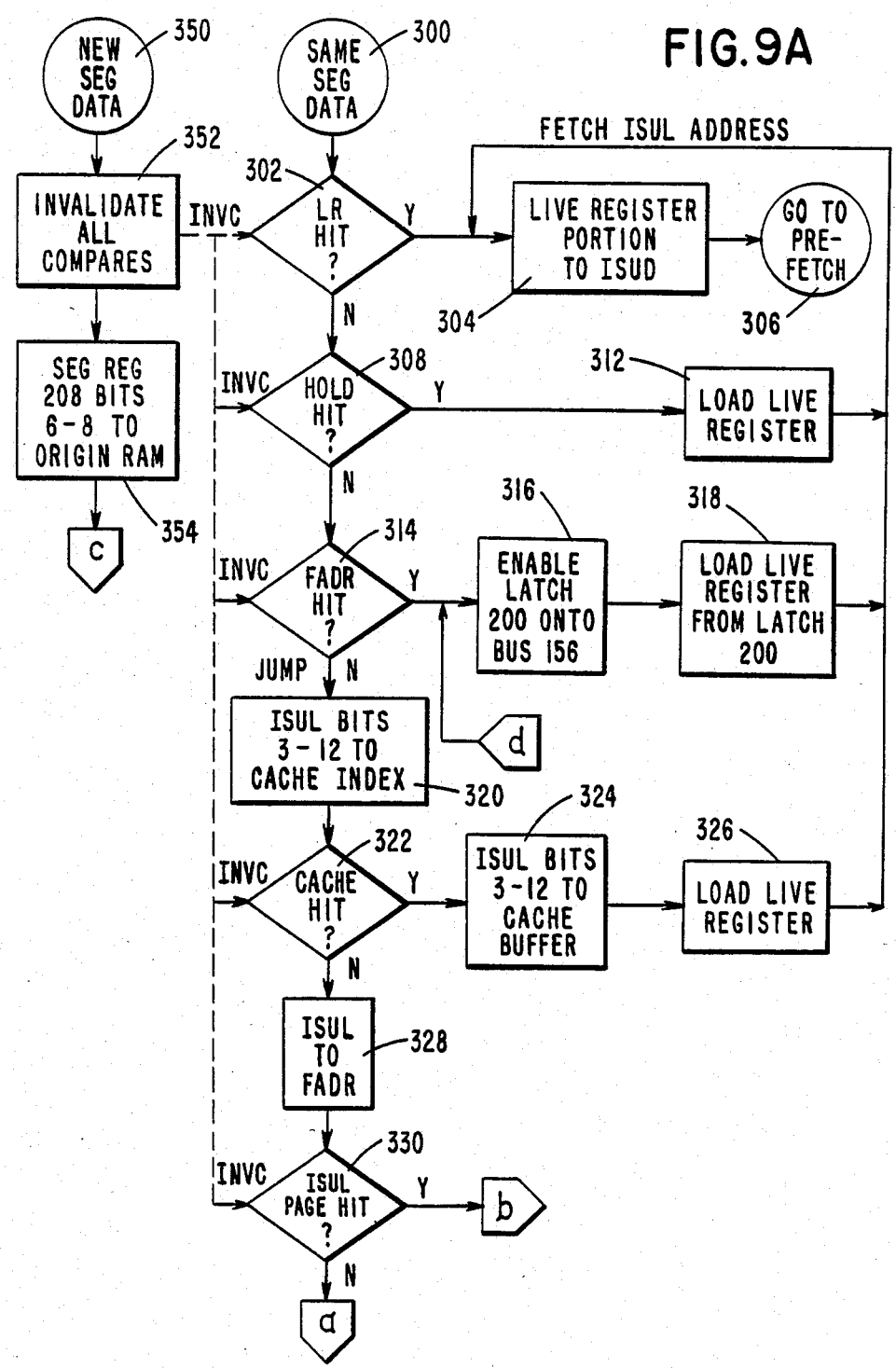
FIGS. 9A and 9B, joined at connectors a-d, is a logic flow diagram showing the logic flow of the system of FIG. 1 during the fetching of an instruction from a virtual address.
Figure 9B:
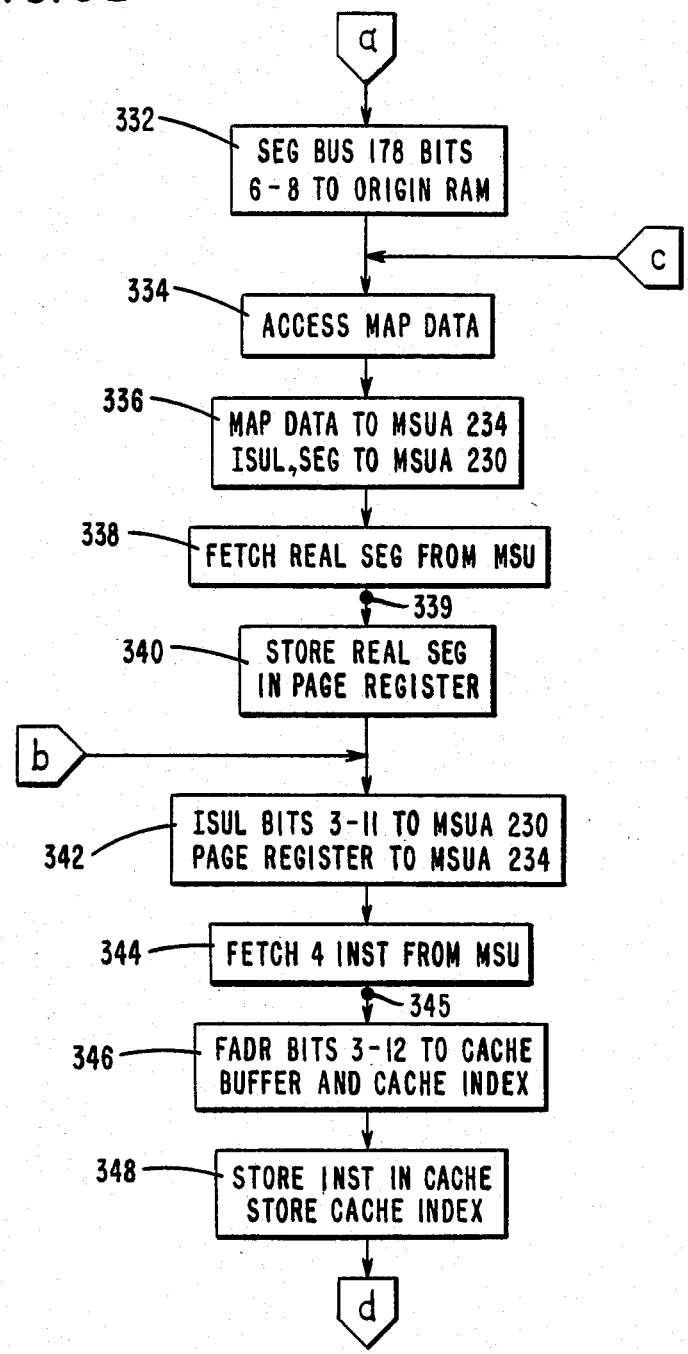

Turning now to FIGS. 9A and 9B, the fetching of an instruction from the main memory 28 at the address on the ISUL bus 30 will now be discussed.

FIGS. 9A and 9B is a logic flow diagram showing the logic flow of the system during the fetching of an instruction from a virtual address. The first case to be discussed is when the segment data, shown at FIG. 4 as bits 17–24 of the super segment virtual address, remains the same. This case is shown starting at 300 of FIG. 9A. If the segment data has not changed, the output 148 of the live register compare circuit 146 is checked at 302 to see if a live register hit has occurred. If a live register hit has occurred, the live register portion indicated by the least significant two bits on the ISUL bus 30 are passed at 304 to the ISUD bus 29. This condition indicates the address requested is within the four instructions stored in the live register. The system then goes at 306 to the prefetch function discussed in connection with FIG. 7B.

If a live register hit has not occurred, the hold address compare circuit 134 is checked at 308 to see if a hold hit has occurred. If a hold hit has occurred in the cache buffer it means that the instruction requested is being held on the RAMDATA bus 156 by the prefetch logic. The cache buffer 157 is addressed by bits 3–12 on the HLDADR bus 133 by multiplexers 162 and 164. The four instructions in the cache buffer at that address are then loaded at 312 into the live register 154. The live register portion indicated by the first two bits of the ISUL bus 30 are then loaded at 304 onto the ISUD bus 29, and the hardware continues on with its prefetch functions.

If there is not a hold hit, the fetch address compare 142 is checked at 314 to see if a fetch address hit has occurred. If a fetch address hit has occurred, the instruction at the location on the FADR bus 340 has been fetched from the main memory 28 and is stored or in the process of being stored in the cache buffer 157 as discussed in connection with FIG. 7C. If the fetched instructions have arrived at latch 200, latch 200 is enabled at 316 to load the instructions onto RAM data bus 156 and into register 154 at 318. If not, the logic waits until the fetched instructions arrive at latch 200, and then the live register 154 is loaded therefrom. The logic then transfers to blocks 304 and 306 which are then executed as discussed.

If a fetch address hit has not occurred, the address is considered to be a jump address and bits 3–12 of the ISUL bus 30 are passed at 320 by multiplexer 170 to the cache index 165. The virtual segment data stored in the cache index is then compared at 322 to the present segment data on buses 184 and 186, and a determination is made if a cache index hit on bank 1 or bank 2 has occurred. If a cache index hit has occurred, bits 3–12 on the ISUL bus 30 is passed at 324 to the cache buffer 157, and the live register 154 is loaded with the 4 instructions at that location in the cache buffer. The logic then transfers to blocks 304 and 306 which are then executed as discussed. If a cache index hit has not occurred, the address on the ISUL bus 30 is passed at 328 by multiplexer 135 and loaded in the fetch address register 138, and placed on the FADR bus 140. Bits 12–16 of the ISUL bus 30 are then compared at 330 by the page boundary check circuit 236 to see if a page hit has occurred.

It will be understood that if a page hit has occurred, it will not be necessary to fetch the real address from the page table 58 in real memory. However, if the new address is outside of the page boundary, the page table data, as shown in FIG. 6, will have to be retrieved from the main memory.

If a page table hit has not occurred, bits 6–8 of the SEG bus 178 are passed by multiplexer 220 to the origin RAM 216 (332). The map data stored in the origin RAM at the origin RAM address contained in the segment register is then placed at 334 on the output of the origin RAM 216. The map data is accessed from the origin RAM 216, passed by the multiplexer 226, and placed on the MSUA bus 234 by the latch 232. Also, bits 12–16 on the ISUL bus 30 are passed by multiplexer 222 to latch 228, and bits 1–5 on the SEG bus 178 are passed by multiplexer 224 to the latch 228. The bits latched by latch 228 are placed on the MSUA bus 230 to form the page table real address shown in FIG. 5. These functions occur in FIG. 9B in block 336.

Figure 13A:
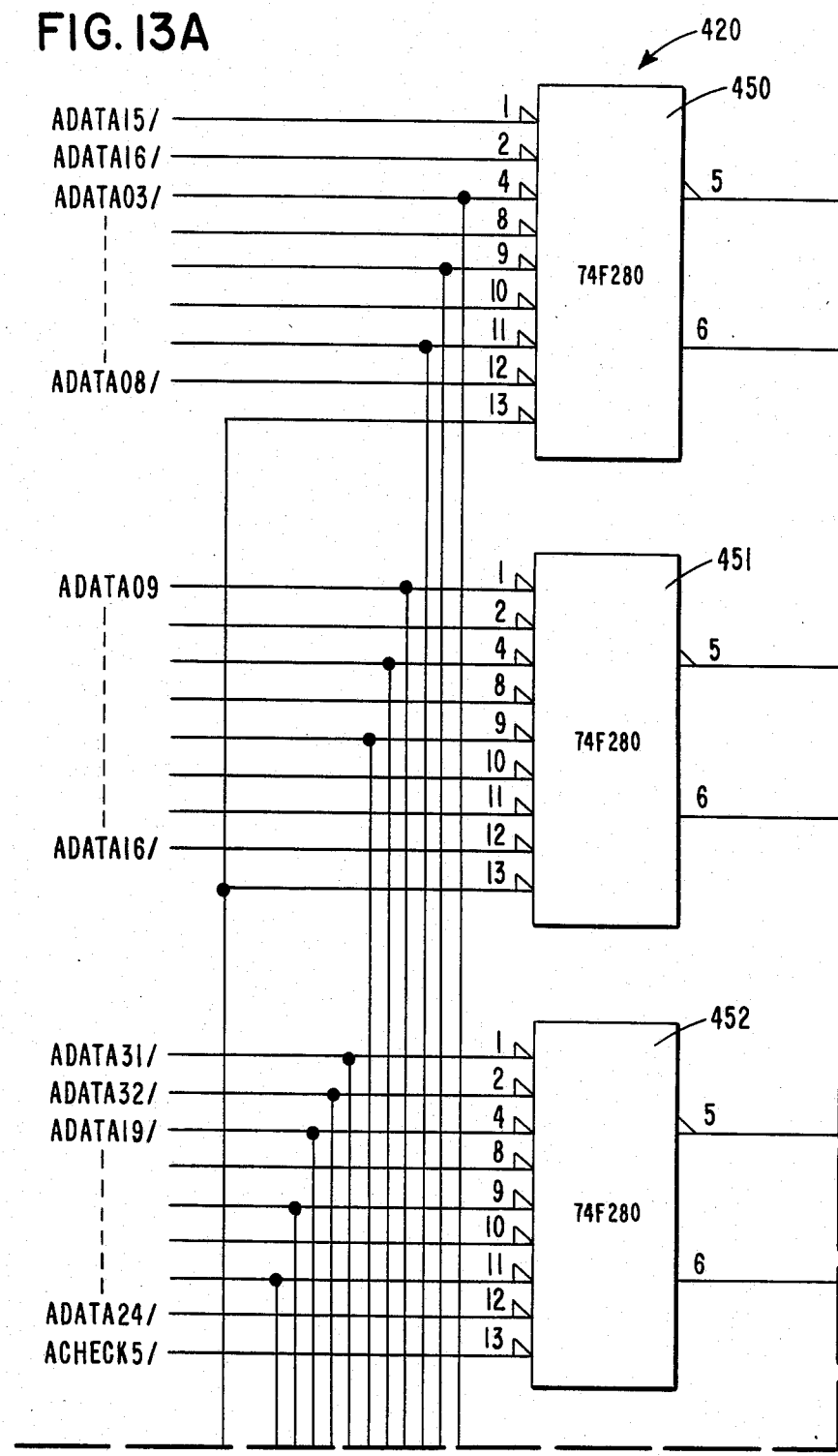
Figure 13C:
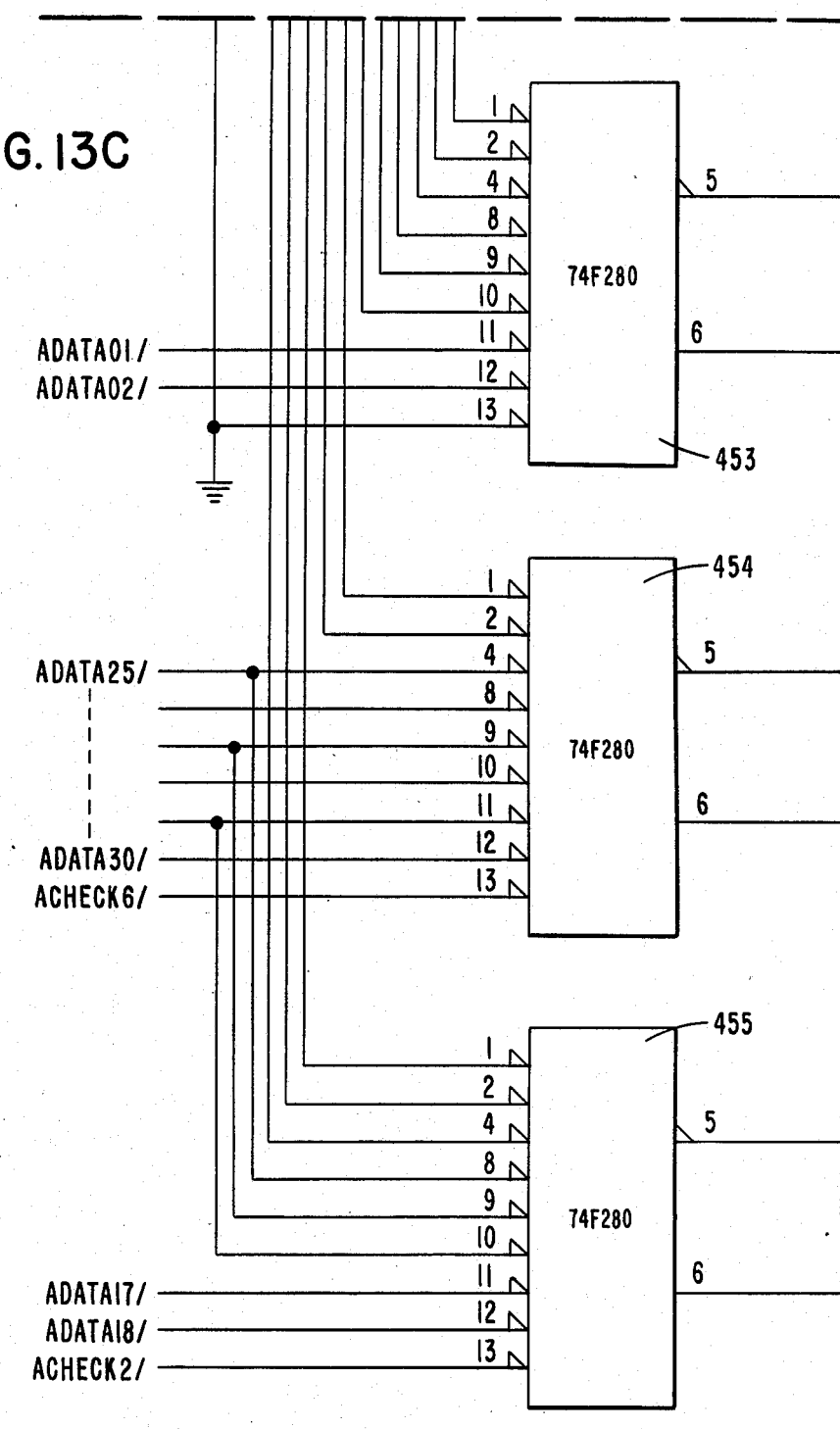

Using the address from latches 228 and 232 as the MSU address, the page table data is fetched from the MSU (338), and, as discussed in connection with FIG. 7E, is placed at 340 in page register 244. At the same time the page boundary register 420 of FIG. 13A is loaded with the new virtual page number from the ISUL bus 30, to be discussed later. Bits 3–6 are passed by multiplexer 222 through its input 221 to the latch 228 to be placed on MSUA bus 230. Bit 3 is set to 0, and ISUL bits 3–6 are shifted such that they appear in MSUA bits 4–7. Multiplexer 224 then passes ISUL bits 7–11 to latch 228 where they are placed on the MSUA bus 230 as MSU address bits 8–12. The contents of latch 232 are then cleared such that the contents of page register 244 are placed on the MSUA bus 234 as MSU address bits 13–24. The contents of the MSU address, as indicated at block 342, then becomes the instruction real address shown in FIG. 6 for fetching four instructions from the main memory 28. In block 344, four instructions are fetched from the main memory 28, two from the A portion 254 over ADATA bus 196, and two instructions from the B portion 256 over BDATA bus 198.

Single bit errors will be detected and corrected and double bit errors will be detected (as will be discussed in connection with FIGS. 11–16) at 339 for page table data fetched from the MSU at block 338, and at 345 for the instructions fetched from the MSU at block 344.

It will be remembered that at block 328, the address on the ISUL bus 30 was placed on the FADR bus 140. Using bits 3–12 of the FADR bus 140 as addresses for the cache buffer, the four instructions placed on the raw data bus 156 by the latch 200 from the ADATA bus 196 and BDATA bus 198 are stored in one of the cache buffer RAMs 158 or 160. Bits 3–12 on the FADR bus 140 are also used as addresses to store the virtual segment data on SEG bus 178 and bits 13–16 of the FADR bus 140 in the corresponding RAM 166 or 168 of the cache index 165.

Returning to the page hit compare 330, if a page hit is found by the page boundary check circuit 236, the logic transfers to block 342 to fetch instructions from the main memory as indicated by the address in the page register 244 and on the ISUL bus 30.

If the address contains new segment data, the logic starts at 350 shown in FIG. 9A. If the segment data shown in FIG. 4 changes, new segment data is sent by the CPC 10 to the ERU register 70(H) identified as segment register 208 in FIG. 7D. When the ERU decode circuit 102 decodes the ERU address to a 70(H), an INVC signal is output on the output terminal 105 of the ERU decode circuit 102 as discussed in connection with FIG. 7A. As illustrated by the dotted line from block 352, all of the compares blocks 302, 308, 314, 322 and 330 receive this INVC signal to force all of the compares to a non-compare condition. This is shown in FIGS. 7B, 7C and 7D as inputting the INVC signal to the hold compare 134, the live register compare 146, the fetch address compare 142, the cache index compares 180 and 182, and the compare circuit in the page boundary check circuit 236.

Bits 6–8 of the segment register 208 are passed by the bus 211 and the multiplexer 220 to the origin RAM 216. Using bits 6–8 from the segment register 208 over bus 211 as an address for the origin RAM 216, the map data for the segment just received by the segment register 208 is accessed at 334 in the origin RAM 216. Since all of the compares are held in the non-compare condition by the INVC signal, the logic will then transfer to the fetch map data block 334 indicated by connector "C" in FIG. 9B.

At the same time, the four instructions retrieved from the memory 28 are stored in the cache buffer, the logic transfers to block 316 wherein the live register 154 is loaded from the latch 200, as previously discussed.

Figure 10:
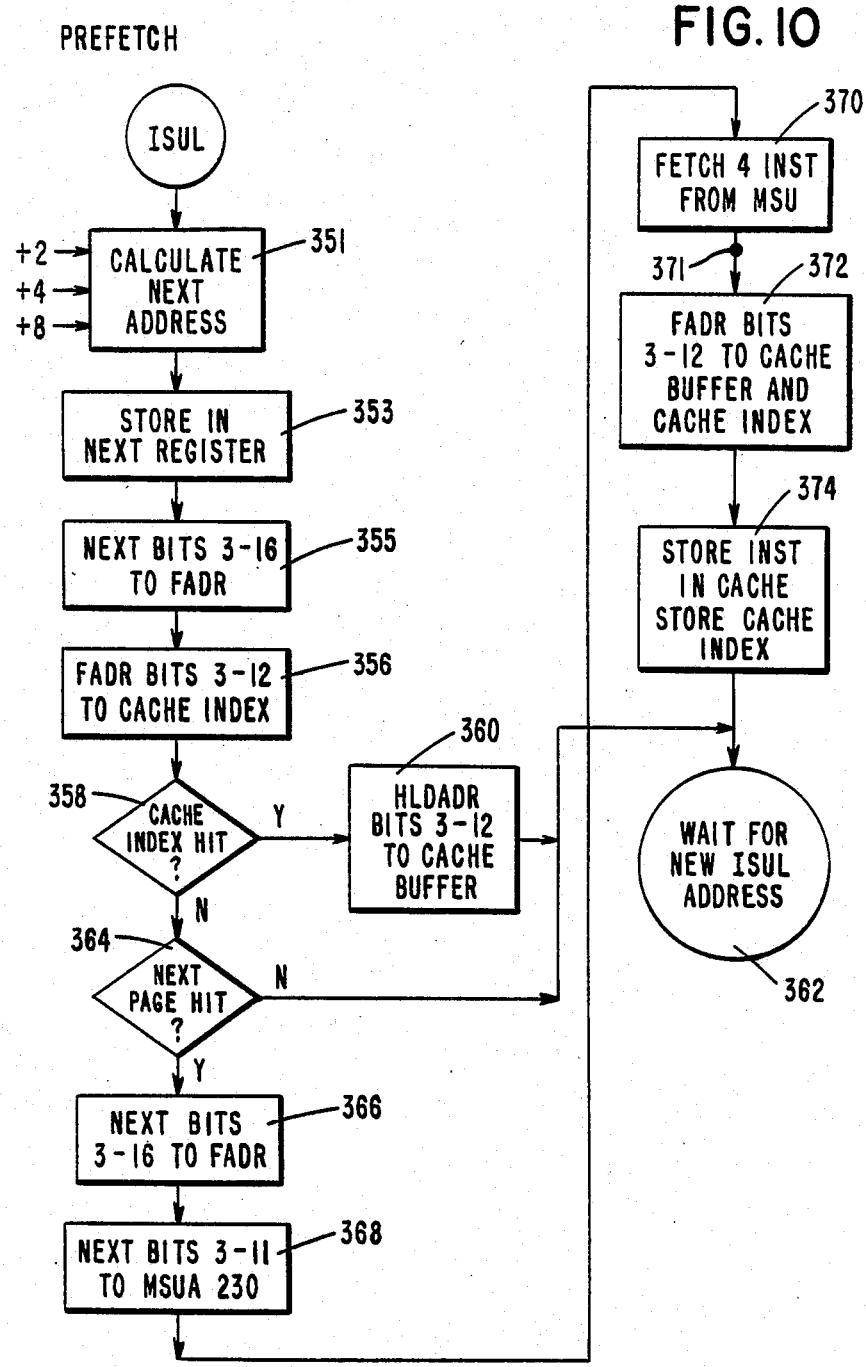
FIG. 10 is a logic flow diagram showing the logic of the circuit of FIG. 7B for performing prefetch operations.

FIG. 10 is a logic flow diagram showing the logic used by the circuit of FIG. 7B for performing prefetch operations. Either a 2, a 4 or an 8 is input on 121 to the adder 128 to be added to the address on the ISUL bus 30 to calculate at 351, the next address of the prefetch circuit of 7B. As discussed in connection with FIG. 7C, a 2 is added to the address for a PROM operation. If the last issued virtual address was a jump address as discussed in connection with check 314 of FIG. 9A, a 4 is added to the address on the ISUL bus 30 by adder 128. Otherwise, an 8 is added to the address on the ISUL bus 30 to calculate the next address.

It will be understood that when a jump address is issued, the operation of the hardware as discussed in connection with FIGS. 9A and 9B will fetch a block of four instructions including the instruction at the virtual address, and store them in the live register 154. The prefetch circuit of FIG. 7B will then prefetch the next four instructions in the expectation that the next address issued on the ISUL bus 30 will be within the consecutive block of 4 instructions just fetched. There is a high probability that the following ISUL address will still be in the live register 154. Thus, if 4 is added to the ISUL address, the next prefetch would calculate and prefetch an address in the 4 instruction block which was obtained in the previous prefetch sequence. For this reason, 8 is added to the ISUL address to calculate the next address for sequential addressing. This results in speeded-up operation of the data processing system because the prefetch circuit of FIG. 7B remains far enough ahead of the addresses issued on the ISUL bus 30 such that the system is not waiting for instruction blocks to be loaded in the cache buffer.

The next address as calculated in accordance with the previous discussion, is loaded at 353 in the next address register 130 and NEXT bits 3–16 are passed at 355 to the fetch address register 138 through multiplexer 135. Referring to FIG. 7C, FADR bits 3–12 are passed at 356 to the cache index 165 through multiplexer 170 to check at 356 for a cache index hit.

If there is a cache index hit, the HLDADR bits 3–16 are latched at 360 into the cache buffer 157. This means that the instructions at the next succeeding address most likely requested on ISUL bus 30 is present in the cache buffer, and if requested, a hold hit will occur as discussed in connection with FIG. 9A.

After block 360, the logic goes to 362 to wait for a new address to appear on the ISUL bus 30.

Returning to the cache index hit check of 358, if a cache index hit has not occurred, a compare at 364 is made of the page boundary data on the NEXT bus 136 to see if a page hit has occurred. If a page hit has not occurred, it means that new page table data must be fetched from the page table portion 58 of the real memory 56 as discussed in connection with FIG. 3. Since the prefetch operation of the circuit of FIG. 7B is made in anticipation of what might be called next, there is a chance that if new page table data is fetched as discussed, it may not be used. Therefore, if no page hit has occurred, the logic goes to 362 to wait for a new ISUL address on the ISUL bus 30.

If a page table hit has occurred, the next bits 3–16 are passed at 366 from the next address register 130 through the multiplexer 135 to the fetch register 138 and placed on the FADR bus 140.

The NEXT bits 3–11 on the NEXT bus 136 are passed at 368 through multiplexers 222 and 224 to the MSUA bus 230. NEXT bits 3–6 are passed through multiplexer 222 and latched into latch 228 as MSU address bits 4–7. The MSU address bit 3 is turned off as shown in the instruction real address of FIG. 6. Next bits 7–11 are passed through multiplexer 224 to the latch 228 as MSU address bits 8–12. As discussed in connection with FIG. 7E, the MSU address bits 3–12 appear on MSUA bus 230, and the MSU address bits 13-24 are placed on MSUA bus 234 by the page register 244. Thus, the total address appearing on MSUA buses 230 and 234 are used at 370 by the memory portion A, 254 and memory portion B, 256 of FIG. 7E to fetch four instructions starting at the MSU address. Single bit errors in the four fetched instructions will be detected and corrected and any double bit errors will be detected at 371, as will be discussed in connection with FIGS. 11-16.

As discussed in connection with FIG. 7C, the four fetched instructions are placed on the RAM data bus 156. The fetch address bits 3-12 on the FADR bus 140 are passed at 372 to the cache buffer and the cache index as addresses, and the instructions are stored at 374 in the cache buffer 157 and the cache index data is stored in the cache index 165. The logic then goes to block 362 wherein the circuit of 7B waits for a new ISUL address to appear on the ISUL bus 30.

Figure 11:
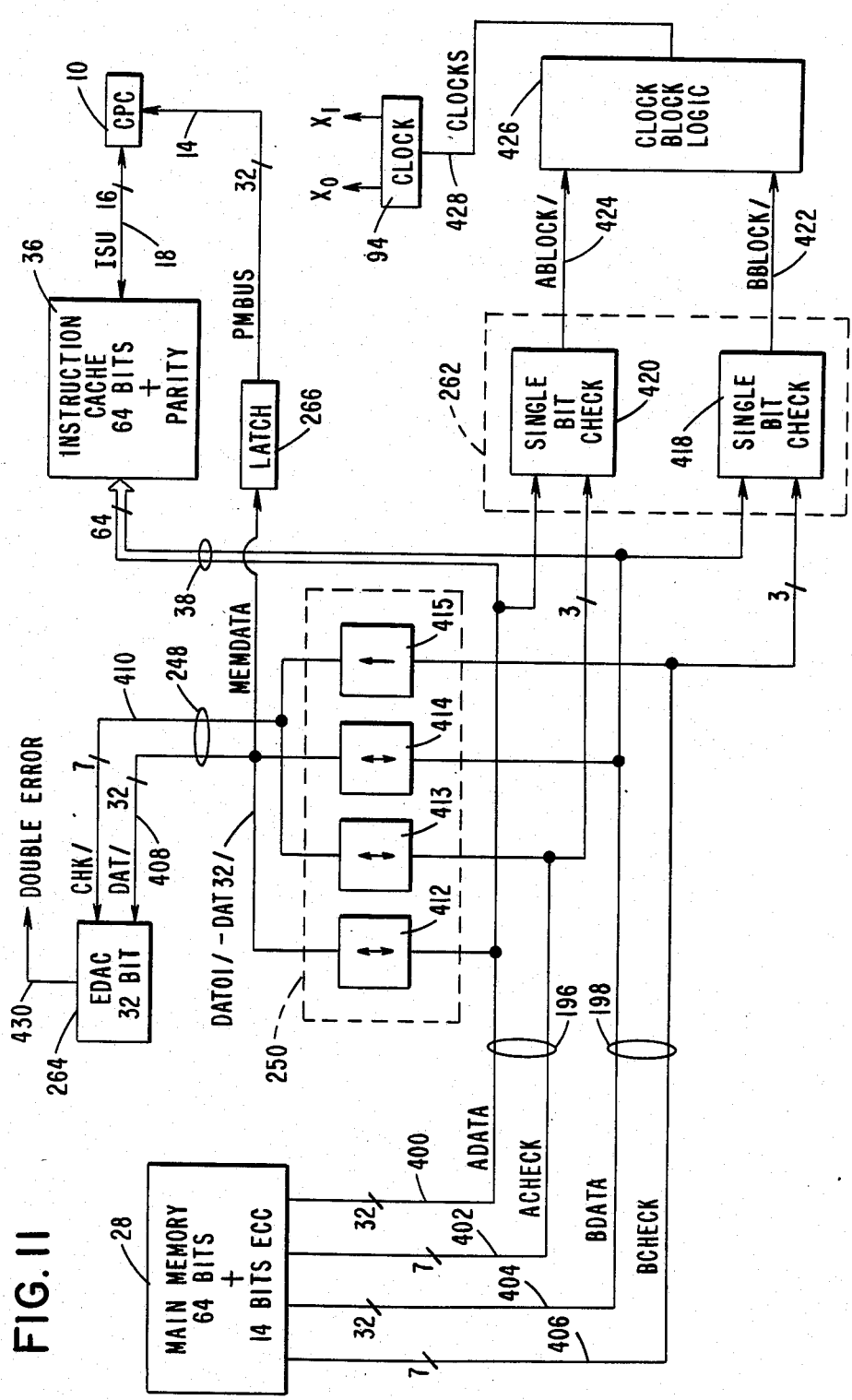
FIG. 11 is a block diagram of a portion of the data processing system of FIG. 1 showing the error detection and correction system of FIG. 7E.

FIG. 11 is a block diagram of the data processing system of FIG. 1, and shows the error detection and correction portion of the circuit shown in FIG. 7E. The elements of FIG. 11 have the same reference numbers as corresponding elements in FIGS. 1 and 7E. However, the data buses 196, 198 and 248 have been divided into buses for conducting data bits and buses for conducting check bits containing error correction codes (ECC). For instance, the ADATA bus 196 discussed in connection with FIGS. 7C-7E includes a data bus portion 400 for carrying ADATA bits 1-32, and an ECC bus portion 402 labeled ACHECK for carrying 7 bits of ECC code corresponding to data on the ADATA bus 400. Similarly, the BDATA bus 198 is divided into a data bus portion 404 for carrying BDATA bits 1-32, and an ECC portion 406 labeled BCHECK for carrying 7 bits of ECC code corresponding to the data on the BDATA bus 404. MEMDATA bus 248 is divided into a data bus portion 408 for carrying the data bits identified respectively as DAT/01-DAT/32, and an ECC bus portion 410 labeled CHK/ for carrying 7 bits of the ECC code.

Buffer 250 of FIG. 7E contains a plurality of two-way buffer elements 412-414 and a single one-way buffer element 415, as shown in FIG. 11. Two-way buffer element 412 passes data between the data portion 400 of the ADATA bus and the data portion 408 of the MEMDATA bus 248. Two-way buffer element 413 passes check bits between the ACHECK bus 402 and the CHK/ bus 410. Similarly, two-way buffer element 414 passes data between the data portion 404 of the BDATA bus and the data portion 408 of the MEMDATA bus. The one-way buffer element 415 passes check bits from the BCHECK bus 406 to the CHK/ bus 410. As will be explained, only a one-way buffer element is required at 415 since all data is written into the main memory 28 using the ADATA bus 196. It will also be noted that the data portion 408 of the MEMDATA bus 248 is connected to the PM bus 14 through the latch 266, as previously discussed in connection with FIGS. 7A-7E. Also, the data portions 400 and 404 of the ADATA bus 196 and the BDATA bus 198, respectively, are part of the 64 bit bus 38 between the main memory 28 and the instruction cache 36, as shown and discussed in connection with FIG. 1. Provision for generating and transmitting parity bits have not been shown in FIG. 11 for simplicity.

The single bit error detection and parity generator circuit 262 of FIG. 7E includes two single bit check circuits 418 and 420, as shown in FIG. 11. The single bit check circuit 418 is connected to the data portion 404 of the BDATA bus 198, and three check bits from the BCHECK bus 406 of the BDATA bus 198. The single bit check circuit 420 is connected to the data portion 400 of the ADATA bus 196, and to three of the check bits in the ACHECK bus 402 of the ADATA bus 196. As will be discussed, the single bit check circuit 418 includes logic to check for a single bit error in the data on the BDATA bus 198, and includes an output conductor 422 labeled BBLOCK/ for outputting a signal indicating that a single bit error exists. Likewise, the single bit check circuit 420 checks the data on the ADATA bus 196, and includes an output conductor 424 labeled ABLOCK/ for outputting a signal indicating if a single bit error was detected. The BBLOCK/ conductor 422 and the ABLOCK/ conductor 424 are connected to a clock block logic circuit 426 having an output conductor 428 labeled CLOCKS, which is in turn connected to the clock circuit 94 discussed in connection with FIG. 7A.

The buffer elements 412-415 may be made up of octal bidirectional tranceivers 74F245 available from Fairchild Camera and Instrument Corporation of South Portland, Me. 04106.

It will thus be understood that when data is to be stored in either the A portion 254 or the B portion 256 of the main memory 28 (see FIG. 7E), the CPC 10 places the data on the DAT/ portion 408 of the MEMDATA bus 248 as discussed in connection with FIGS. 7A and 7E. This data is applied to the EDAC chip 264 which generates 7 ECC bits placing them on the CHK/ bus 410. The data bits are placed on the data portion 400 of the ADATA bus 196 through the buffer element 412, and the ECC bits are placed on the ACHECK bus 402 of the ADATA bus 196 through the buffer element 413. As previously discussed, the 32 data bits and the 7 ECC bits are stored in the A portion 254 or the B portion 256 of the main memory as specified by the address appearing at the address terminals of the memory devices 252 of FIG. 7E.

In the case of a 32 bit data fetch, when data is read from the main memory, both A and B portions of the addressed memory are placed on the ADATA and BDATA buses. The third bit of the address is then used to determine if ADATA or BDATA is to be read.

When data is fetched from the A portion of the main memory, ADATA bits are transmitted from the data bus 400 through the buffer element 412 and over bus 408 to the EDAC circuit 264, and the ACHECK bits are transmitted from bus 402 through the buffer element 413 and over bus 410 to the EDAC circuit 264, to be processed in the conventional manner to detect and correct single bit errors, and to detect double bit errors. At this same time the clock block logic 426 is looking for errors in ADATA. The ADATA bits are transmitted through latch 266 over PM bus 14 to the CPC 10 as previously discussed. If the clock block logic 426 finds an error in ADATA, then the clock 94 will be stopped and the corrected data from the EDAC 264 (if a single bit correctable error has occurred) will be sent to the CPC 10. Else, bad data is sent to the CPC 10 and the system double bit error trap occurs. Likewise, when data is to be fetched from the B portion of main memory 28, BDATA bits are transmitted from the data bus 404 through buffer element 414 and over bus 408 to the EDAC circuit 264, and the BCHECK bits are transmitted from bus 406 through buffer element 415 and over bus 410 to the EDAC circuit 264 to be processed in the conventional manner. At this same time the clock block logic 426 is looking for errors in BDATA. The BDATA bits are transmitted through latch 266 to the CPC 10 over bus 14. Similar to above, if the clock block logic 426 detects a single bit error in BDATA, then the clock 94 will be blocked and corrected data will be sent to the CPC 10.

The single bit check circuit 420 is connected to the ADATA bus 400 and selected bits of the ACHECK bus 402 for determining if the EDAC circuit 264 will detect a single bit error. If the single bit check circuit 420 determines that a single bit error will be detected, the ABLOCK/ signal on conductor 424 goes active, causing the clock block logic circuit 426 to raise the CLOCKS signal on conductor 428, thereby stopping clock 94. The stopping of the clock 94, stops processing by the CPC 10 such that the uncorrected ADATA bits will not be processed until after the EDAC circuit 264 has had an opportunity to correct the single bit errors located therein. After the single bit errors are corrected, the clock 94 is restarted such that the CPC 10 may continue processing. If a double bit error is detected, a double bit error trap is activated (see decode circuit 175 of FIG. 7C), causing a conventional double bit error routine to be entered into by the CPC 10.

In a similar manner, the single bit check circuit 418 is connected to the BDATA bus 404 and selected bits of the BCHECK bus 406 to detect single bit errors in the data on the BDATA bus 404. If a single bit error is detected, the BBLOCK/ signal on conductor 422 is activated thereby causing the clock block logic circuit 426 to activate the CLOCKS signal on conductor 428, thereby stopping clock 94. As discussed in connection with the ADATA bits, the clock 94 is stopped until the EDAC circuit 264 has had time to correct any single bit errors detected in the BDATA bits.

In the case where 64 bits of instruction data are being fetched from main memory 28 and placed in the instruction cache 36 as previously described, 32 data bits are placed on the ADATA bus 400, and 32 data bits are placed on the BDATA bus 404. Also, 7 ECC bits corresponding to the data on ADATA bus 400 are placed on the ACHECK bus 402. Likewise, 7 ECC bits corresponding to the data on BDATA bus 404 are placed on the BCHECK bus 406. It will be understood that the data on ADATA bus 400 will be simultaneously placed on the 64 bit bus 38 to the instruction cache 36, and the single bit check circuit 420. Also, the data on the BDATA bus 404 will be simultaneously placed on its portion of the 64 bit bus 38 and the single bit check circuit 418. If a single bit error is detected in the BDATA bits by single bit check circuit 418 or the ADATA bits by single bit check circuit 420, appropriate error signals will be raised on conductors 422 or 424 to be detected by clock block logic circuit 426, which in turn stops the clock 94 by a CLOCKS signal on conductor 428. In this case, the stopping of clock 94 stops the acceptance of the data on bus 38 by the instruction cache 36 until the data can be corrected by the EDAC circuit 264.

Since the EDAC circuit 264 only handles 32 bits at a time, the buffer elements 412–415 are controlled to first pass the ADATA bits and the ACHECK bits to the EDAC circuit 264, and then to pass the BDATA bits and the BCHECK bits after the ADATA bits have been processed. It thus will be understood that the ADATA bits are transmitted through the buffer element 412 and the ACHECK bits are transmitted through the buffer element 413 to the EDAC circuit 264. If a single bit error is detected by the EDAC circuit 264, an error correction routine in the EDAC circuit 264 corrects the data and transmits it over bus 408 through bidirectional buffer element 412 back onto the ADATA bus 400 where it is in turn transmitted over bus 38 to the instruction cache 36. After any single bit errors in the ADATA bits have been corrected, the data on the BDATA bus 404 is transmitted through the buffer element 414 and the BCHECK bits are transmitted through the buffer element 415 to the EDAC circuit 264. If single bit errors are detected in the BDATA bits, the EDAC circuit 264 corrects the errors, and transmits the corrected BDATA bits back through buffer element 414 to the BDATA bus 404. The corrected BDATA bits are then available to the instruction cache 36 over the bus 38. It can thus be seen that the clock 94 must be stopped for a sufficient length of time to allow the EDAC circuit 264 to correct single bit errors in either the ADATA bits or the BDATA bits, and allow the corrected data to be placed on bus 38 before the clock 94 is unblocked and the instruction cache 36 is allowed to accept the 64 bits of instruction data.

If during the checking of either the ADATA bits or the BDATA bits a double bit error is detected, a double error signal is raised on conductor 430 which activates a double error trap and causes the CPC 10 to enter into a double error trap routine. Such routines are well known in the art and will not be discussed further herein.

Figure 12:
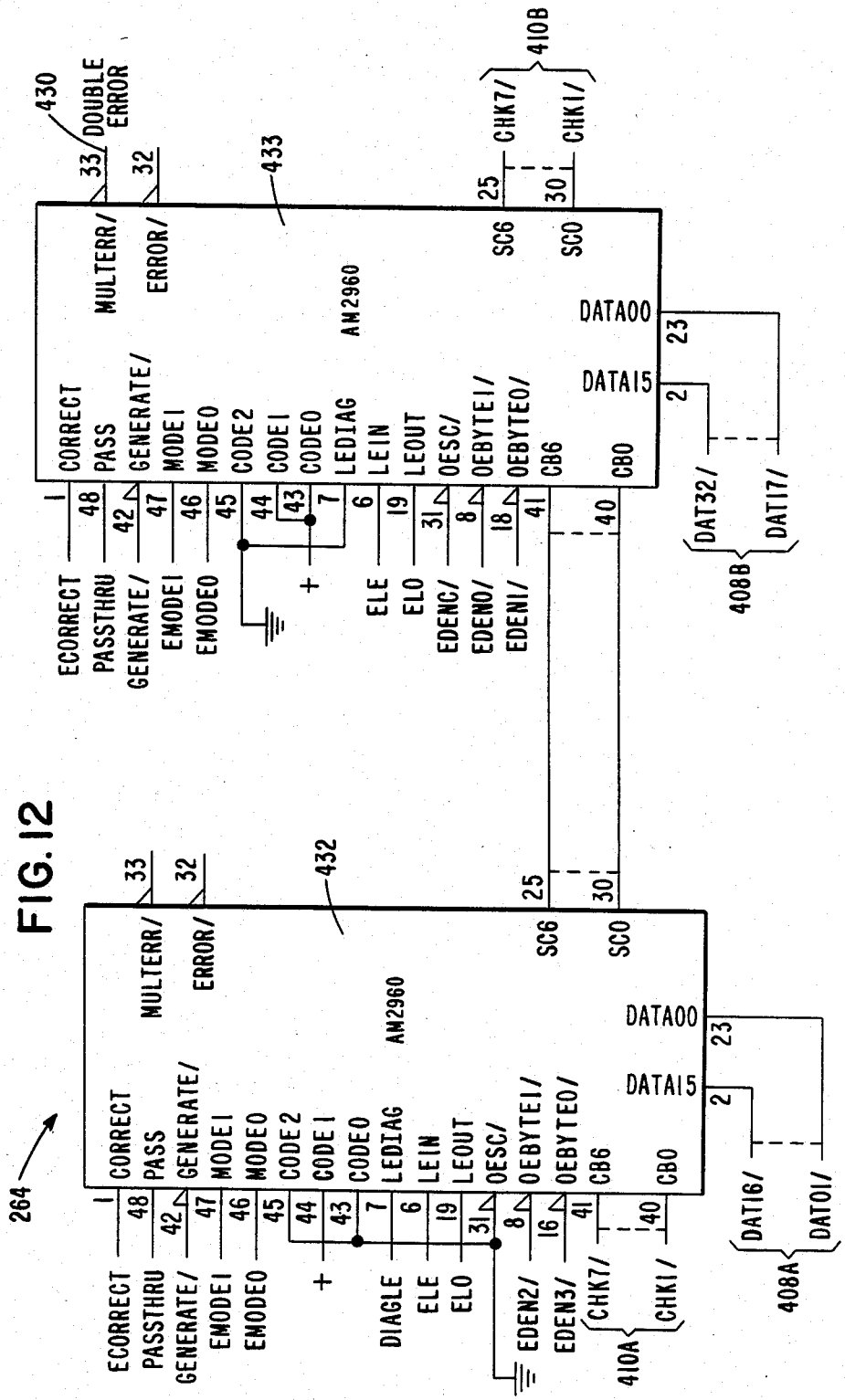
FIG. 12 is a schematic diagram showing the correction of an error detection and correction circuit of FIG. 11.

The EDAC circuit 264 includes two cascadable 16 bit error detection and correction circuits 432 and 433 as shown in FIG. 12. The 16 bit error detection and correction circuits 432 and 433 may be AM 2960 EDC chips available from Advanced Micro Devices, Inc. of Sunnyvale, Calif. 94086. The first 16 data bits (DAT0-1/-DAT16/) of the DAT/ bus 408 are inputted at 408A into the first AM 2960 EDC chip 432. The second 16 data bits (DAT17/-DAT32/) of the DAT/ bus 408 are inputted at 408B into the second AM 2960 EDC chip 433. The CHK/ bus 410 is connected to both the check bit inputs (CB0-CB6) of the first AM 2960 circuit 432 at 410A, and the syndrome bits output (SC0-SC6) of the second AM 2960 EDC chip 433 at 410B. The inputs to the EDC chips 432 and 433 are arranged such that the circuits are cascaded together to generate check bits for a 32 bit data field, and to correct the 32 bit data field when check bits are supplied.

When connected as shown, the circuits 432 and 433 operate on data bits read from memory and will correct any single bit error and will detect all double and some triple bit errors. The syndrome/check bit outputs (SC0-SC6) of the first AM 2960 EDC chip 432 are connected to the check bit inputs (CB0-CB6) of the second AM 2960 EDC chip 433. When a double bit error is detected and any of the 32 data bits inputted into the cascaded circuits 432 and 433, a double error signal is outputted on a conductor 430 connected to pin 33 (MULTERR/) of the second AM 2960 EDC chip 433. The other input signals of the AM 2960 EDC chips 432 and 433 are well known in the art, and will not be explained further herein. A description of these input signals may be found in the functional description and specifications of the AM 2960/60-1/60A specifications available from Advanced Micro Devices.

The AM 2960 circuits 432 and 433 generate check bits according to a modified hamming code as shown in Table 1.

TABLE 1
32-BIT MODIFIED HAMMING CODE - CHECK BIT ENCODE CHART

| CHECK | P | \multicolumn{16}{c}{Participating Data Bits} |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| 1 | E | X | | | | X | | X | X | X | X | | X | | | X | | |
| 2 | E | X | X | X | | X | | X | | X | | X | | X | | | | |
| 3 | O | X | | | X | X | | | X | | X | X | | | X | | X |
| 4 | O | X | X | | | | X | X | X | | | | X | X | X | | X |
| 5 | E | | | X | X | X | X | X | X | | | | | | | X | X |
| 6 | E | | | | | | | | | X | X | X | X | X | X | X | X |
| 7 | E | X | X | X | X | X | X | X | X | | | | | | | | |

| CHECK | P | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|
| 1 | E | | X | X | X | | X | | | | X | | X | X | | | X |
| 2 | E | X | X | X | | X | | X | | X | | X | | X | | | |
| 3 | O | X | | | X | X | | | X | | X | X | | | X | | X |
| 4 | O | X | X | | | | X | X | X | | | | X | X | X | | |
| 5 | E | | | X | X | X | X | X | X | | | | | | | X | X |
| 6 | E | | | | | | | | | X | X | X | X | X | X | X | X |
| 7 | E | | | | | | | | | X | X | X | X | X | X | X | X |

Column CHECK lists generated check bits.
Column P lists parity. E = Even (XOR), O = Odd (XNOR).
The check bit is generated as either an XOR or XNOR of the sixteen data bits noted by an "X" in the Table.

It will be noted that generated check bits 2, 5 and 6 of Table 1 cover all of the 32 data bits input into the EDAC circuit 264. Thus, if new check bits 2, 5 and 6 are generated for the data bits read from the memory and compared against the corresponding check bits generated by the EDAC circuit 264 and stored with the data in the memory, a single bit error of any of the 32 bits may be detected. Such a comparison is made by the single bit check circuits 418 and 420 of FIG. 11.

FIGS. 13A through 13D, connected as shown in FIG. 14, is a schematic diagram for the single bit check circuit 420 for the data bits on the ADATA bus 400. The single bit check circuit 420 includes six 9 bit parity generator/checker circuits shown in FIGS. 13A and 13C, which may be 74F280 circuits available from Fairchild Camera and Instrument Corporation. Parity generator 450 generates even and odd parity bits for check bit 5, data bits 1–16 of Table 1, parity generator 451 generates even and odd parity bits for check bit 6, data bits 1–16 of Table 1, parity generator 452 generates even and odd parity bits for check bit 5, data bits 17–32 of Table 1, parity generator 453 generates even and odd parity bits for check bit 2, data bits 1–16 of Table 1, parity generator 454 generates even and odd parity bits for check bit 6, data bits 17–32 of Table 1, and parity generator 455 generates even and odd parity bits for check bit 2, data bits 17–32 of table 1. As shown, pin 13 of each of the parity generators 450, 451 and 453 are grounded. The fifth bit on the ACHECK bus 402 (ACHECK5/), representing generated check bit 5, is connected to pin 13 of parity generator 452. The sixth bit on the ACHECK bus 402 (ACHECK6/), representing generated check bit 6, is connected to pin 13 of parity generator 454, and the second bit on the ACHECK bus 402 (ACHECK2/), representing generated check bit 2, is connected to pin 13 of parity generator 455. The other eight inputs of the parity generators 450–455 are connected to the ADATA bits on bus 400 as indicated by an X in the participating data bits columns of Table 1 for the respective lines. For instance, parity generator 450 is connected to ADATA data bits ADATA03/, ADATA04/, ADATA05/, ADATA06/, ADATA07/, ADATA08/, ADATA15/ AND ADATA16/.

Pin 5 of each of the parity generators 450–455 is the even output, and pin 6 is the odd output. Thus, when an even number of the input pins of a parity generator are even, pin 5 is high and pin 6 is low. If an odd number of inputs to a parity generator are high, the even output on pin 5 is low and the odd output on pin 6 is high.

Figure 13D:
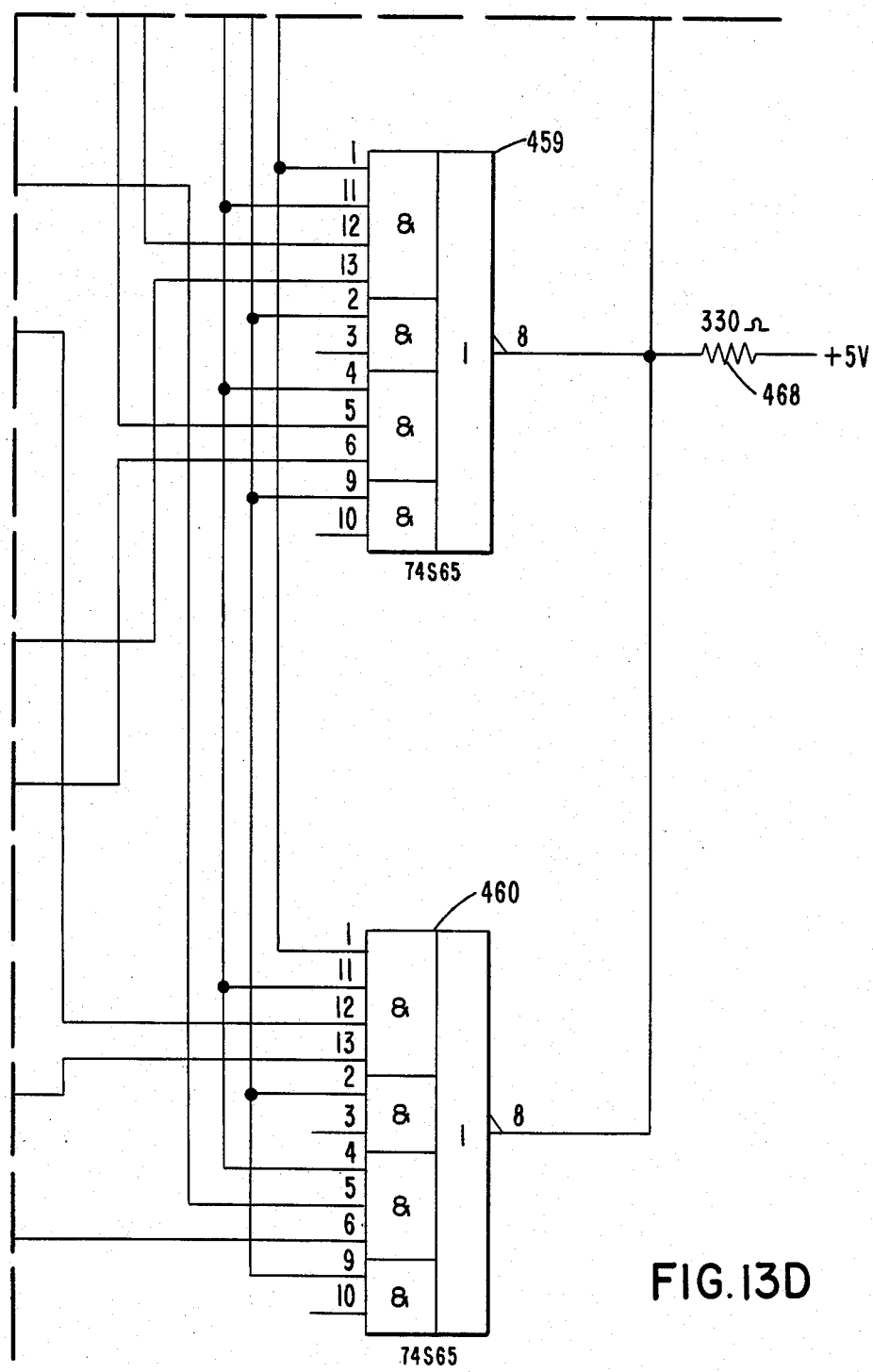

Gate circuits 458 of FIG. 13B, and 459 and 460 of FIG. 13D are 4-2-3-2-input AND/OR -invert gates which may be 74S65 gates available from Fairchild Camera and Instrument Corporation. Conductor 462 connected to pin 1 of each of the gates 458, 459 and 460 is connected to a positive voltage for applying a high on pin 1 of each of the gates. Conductor 463 is connected to pins 3 and 9 of the gates 458, 459 and 460, and is grounded to apply lows to those pins. Conductor 464 is connected to pins 11 and 5 of each of the gates 458, 459 and 460. An enable signal AVALID is placed on conductor 464 to enable the gates 458, 459 and 460. The gates 458, 459 and 460, connected as shown in FIGS. 13B and 13D perform an exclusive OR function during the enable period when a positive AVALID signal is placed on conductor 464.

Gate 458 compares the even output of parity generator 450 with the odd output of parity generator 452, and the odd output of parity generator 450 with the even output of parity generator 452. Gate circuit 459 compares the even output of comparitor generator 451 with the odd output of parity generator 454, and the odd output of parity generator 451 with the even output of parity generator 454. Gate circuit 460 compares the even output of parity generator 453 with the odd output of parity generator 455, and the odd output of parity generator 453 with the even output of parity generator 455.

It will thus be understood that when the AVALID signal is low, the output of gates 458, 459 and 460 will be high, and that when the AVALID signal on conductor 464 is high, the output of gate 458 will only remain high when the even and odd parity bits inputted into the gate 458 do not match. As mentioned previously, gate 458 matches the outputs of parity generators 450 and 452, gate 459 matches the outputs of parity generators 451 and 454, and gate 460 matches the outputs of parity generators 453 and 455.

The outputs of gates 458, 459 and 460 are connected to conductor 466 which outputs a signal labeled ABLOCK/. A resistor 468 connected at one end to conductor 466 and at the other to a +5 voltage supply provides a pull-up circuit for pulling up the voltage on conductor 466 to an inactive high when the outputs of gates 458, 459 and 460 are high. Gate circuits 458, 459 and 460 are open collector gates, which means that if any one of the outputs goes low, the pull-up voltage on resistor 468 will be grounded, causing the voltage on conductor 466 to go to a low active state.

A D type flip-flop 470 shown in FIG. 13B has its data terminal CD connected to conductor 466, and its Q/ output on pin 5 connected to conductor 472 labeled ABLOCKB/. A positive voltage is applied to the set terminal S of the flip-flop 470, a reset signal BLKRES/ is connected to the reset terminal R of the flip-flop 470, and a clock signal is applied to the clock terminal C. Thus, the flip-flop 470 acts as a buffer which is clocked on its clock terminal C during the time that the AVALID signal on 464 is active high. If a mismatch indicating a single bit error is detected by any one of the gates 458, 459 or 460, the ABLOCK/ signal on conductor 466 will go low, causing the ABLOCKB/ signal on conductor 472 to also go active low. The state of the ABLOCKB/ signal on conductor 472 will remain after the clock pulse on clock terminal C of flip-flop 470, even if the state of the ABLOCK/ signal on conductor 466 changes. The ABLOCK/ signal on conductor 466 and the ABLOCKB/ signal on conductor 472 will be used by the clock block circuit 426, to be explained in connection with FIG. 15B.

Figure 15A:
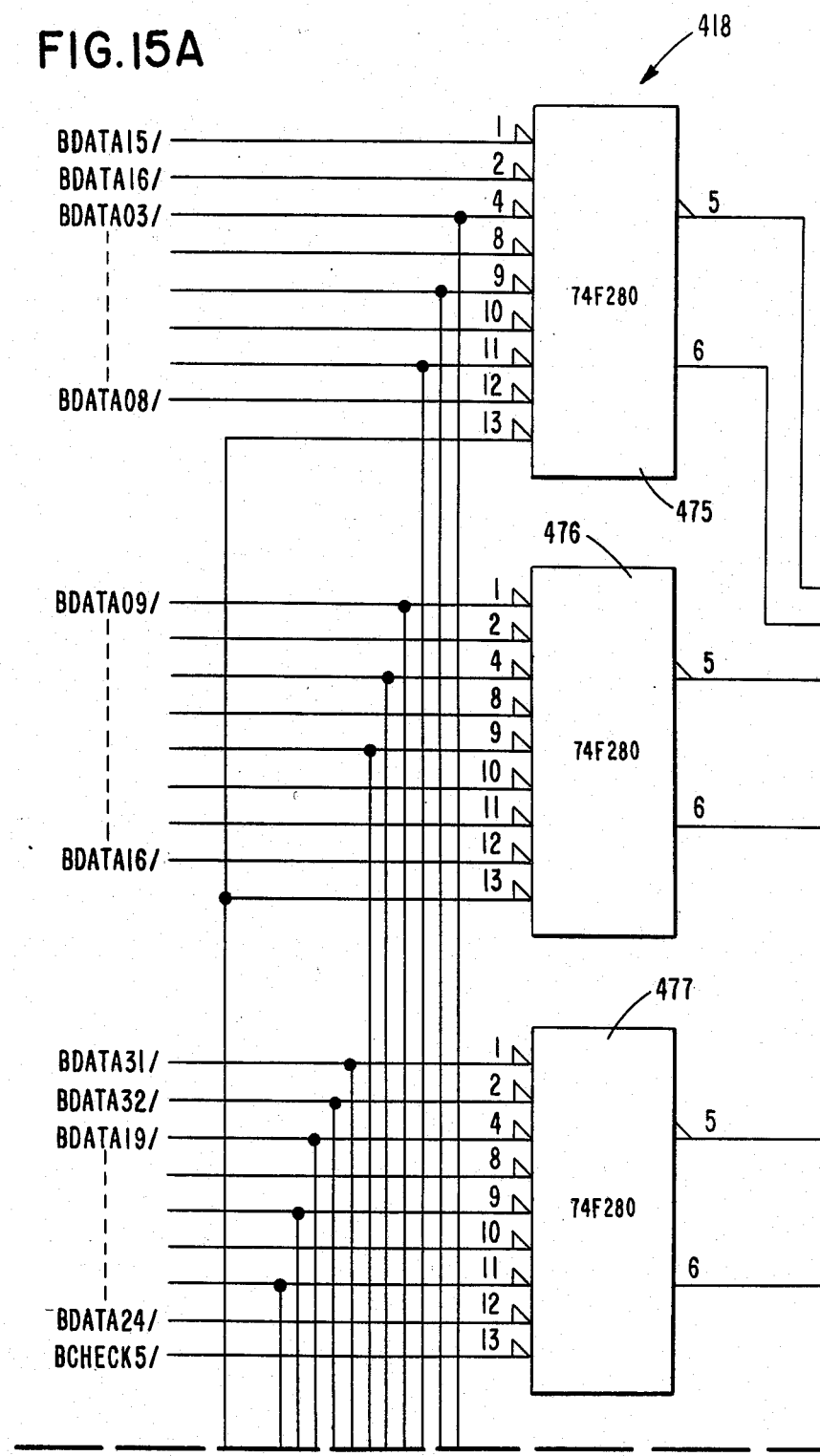
Figure 15C:
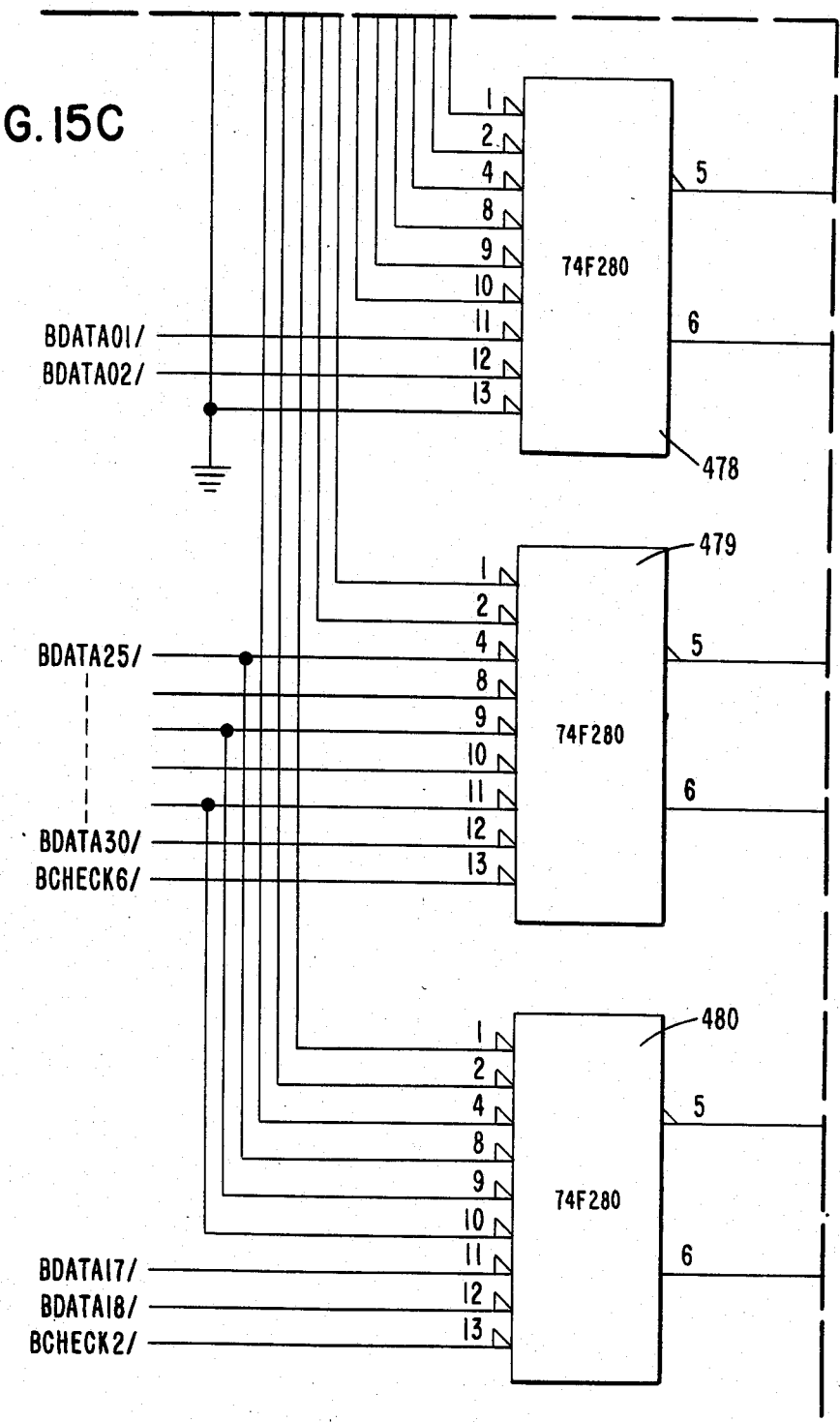
Figure 15D:
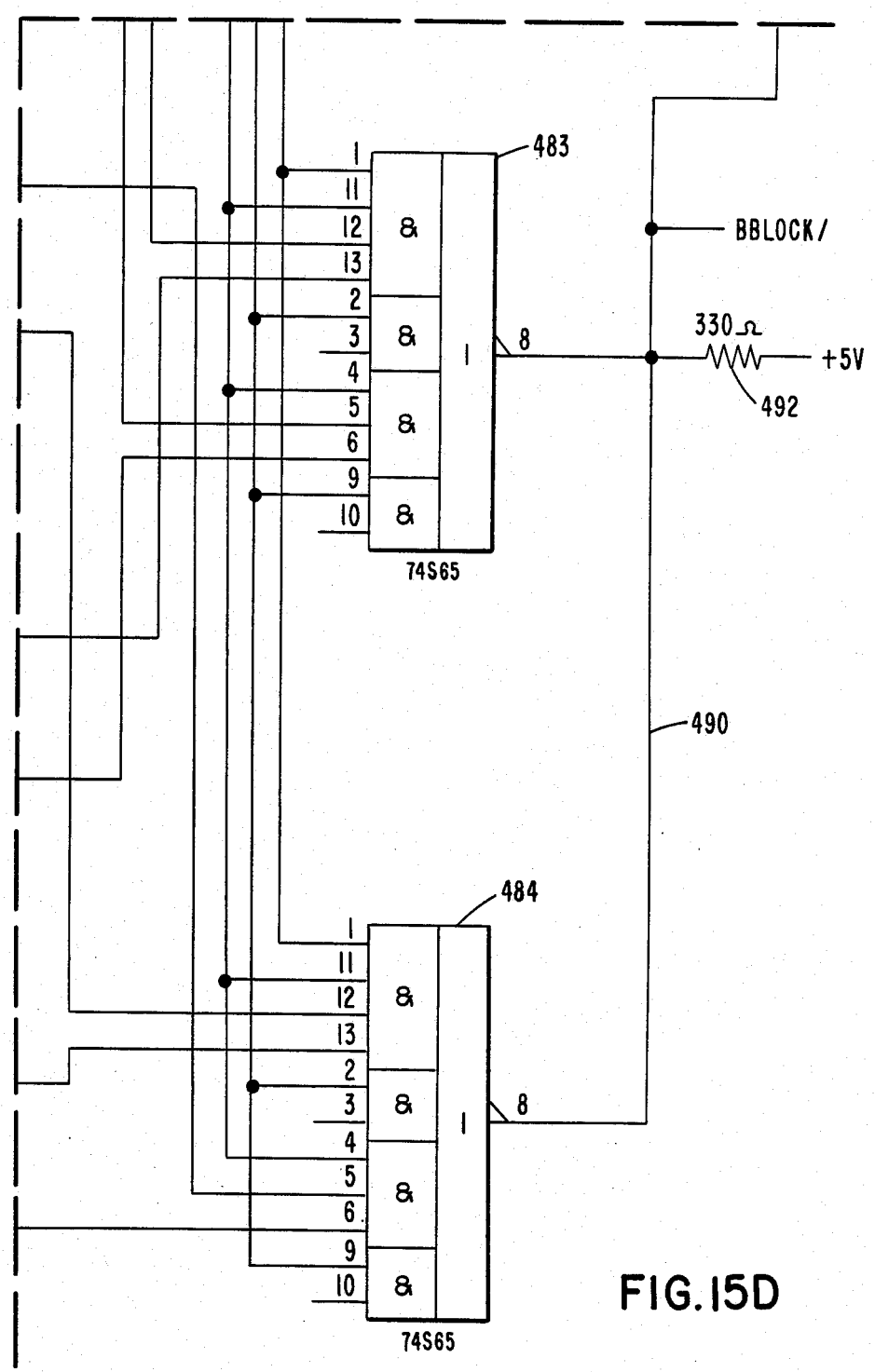

FIG. 15A through 15D assembled in accordance with FIG. 16, is a schematic diagram of the single bit check circuit 418 and the clock block logic circuit 426. The single bit check circuit 418 includes parity generator circuits 475, 476, 477 of FIG. 15A, and 478, 479 and 480 of FIG. 15C connected to the data bits of the BDATA bus 404 and selected check bits on the BCHECK bus 406 in the same manner that the parity generator circuits 450-455 were connected to the ADATA bus 400 and the ACHECK bus 402. Gate circuits 482 of FIG. 15B, and 483 and 484 of FIG. 15D are connected to the outputs of parity generator circuits 475-480 in a manner similar to the connections of gate circuits 458-460 to parity generator circuits 450-455 previously described.

A high is placed on conductor 486 which is connected to pin 1 of the gates 482-484, a low is placed on the conductor 487 which is connected to pins 3 and 9 of the gates 482-484, and a BVALID enable signal is placed on the conductor 488 which is connected to pins 11 and 4 of each of the gates 482-484. It will be understood that when data bits are placed on the BDATA bus 404, BVALID signal on conductor 488 goes to a high to enable gates 482, 483 and 484 to compare the output of the parity generators 475-480 for determining if a single bit error has occurred in the data bits on BDATA bus 404, as previously discussed in connection with the circuit of FIGS. 13A-13D. The parity generator circuits are also 74F280 circuits available from Fairchild, and the gates 482-484 are 4-2-3-2-input AND/OR -Invert gates 74S65 chips available from Fairchild Camera and Instrument Corporation.

The outputs of gates 482 of FIG. 15B, and 483 and 484 of FIG. 15D are connected to a conductor 490 labeled BBLOCK/. A pull-up resistor 492 has one end connected to the conductor 490, and the other end connected to a +5 voltage supply for providing pull-up voltage to the conductor 490. Gates 482-484 are open collector gates such that when any one of the gates goes to its low state, the pull-up resistor 492 is grounded causing the BBLOCK/ signal on conductor 490 to go to its low state. A D type flip-flop 494 shown in FIG. 15B has its data terminal CD connected to the B block/ signal conductor 490, and its Q output on pin 9 labeled BBLOCKB/ connected to conductor 496. A positive voltage is applied to the set terminal S of the flip flop 494, and a reset signal is applied to its reset terminal R. The clock signal (BCLK) which is applied to the clock terminal C flip-flop 470 of FIG. 13B is also applied to the clock terminal C of the flip-flop 494 of FIG. 15B. The D type flip-flop 494 acts as a buffer to hold the state of the BBLOCK/ signal which appears on conductor 490 responsive to a positive BVALID signal on conductor 488.

The clock block logic circuit 426 includes a 4-2-3-2 input AND/OR -Invert gate 500, connected as shown in FIG. 15B. Pin 1 of gate 500 is connected to conductor 496 for receiving the BBLOCKB/ signal from flip flop 494. Pin 11 is connected to conductor 472 to receive the ABLOCKB/ signal from flip-flop 470 of FIG. 15B. Pin 11 of gate 500 is connected to conductor 466 for receiving the ABLOCK/ signal as discussed in connection with FIG. 13B. Pin 13 is connected to conductor 490 for receiving the BBLOCK/ signal. A synchronizing signal SYNC/ is received on pin 10 of gate 500 for synchronizing the operation of gate 500.

It can thus be seen that gate 500 performs an OR gate function with an enable. The gate 500 is enabled when the SYNC/ signal is low. If any one of the signals on pins 1, 11, 12 or 13 (BBLOCKB/, ABLOCKB/, ABLOCK/, or BBLOCK/) is low while gate 500 is enabled, the output of the gate 500 (CLOCKS) will go high. As previously discussed, when the signal CLOCKS goes high, the clock 94 shown in FIG. 11 is stopped thereby stopping the CPC 10 and the acceptance of data by the instruction cache 36.

It will further be understood that the AVALID signal on conductor 464 of FIG. 13B goes high to enable gates 458-460 when the third bit of the address of the data read from the main memory 28 indicates that ADATA is to be read from the ADATA bus 400 (see FIG. 11). The BVALID signal on conductor 488 of FIG. 15B goes high when the third bit of the address of the data read from the main memory 28 indicates that BDATA is to be read from the BDATA bus 404. Thus, the AVALID signal will go high when the CPC 10 is to read data from the A portion (254 of FIG. 7E) of main memory 28, and the BVALID signal will go high when the CPC 10 is to read data from the B portion (256 of FIG. 7E) of the main memory 28. When the instruction cache reads instruction data from both the A portion 254 of the main memory 28 and the B portion 256 of main memory 28, both the AVALID signal and the BVALID signal will go high. After a correction sequence of the EDAC circuit 264 is complete, a reset signal RESET/ will be applied to both of the flip-flops 470 of FIG. 13B and 494 of FIG. 15B to reset signals ABLOCKB/ and BBLOCKB/ to their inactive states.

Figure 17:
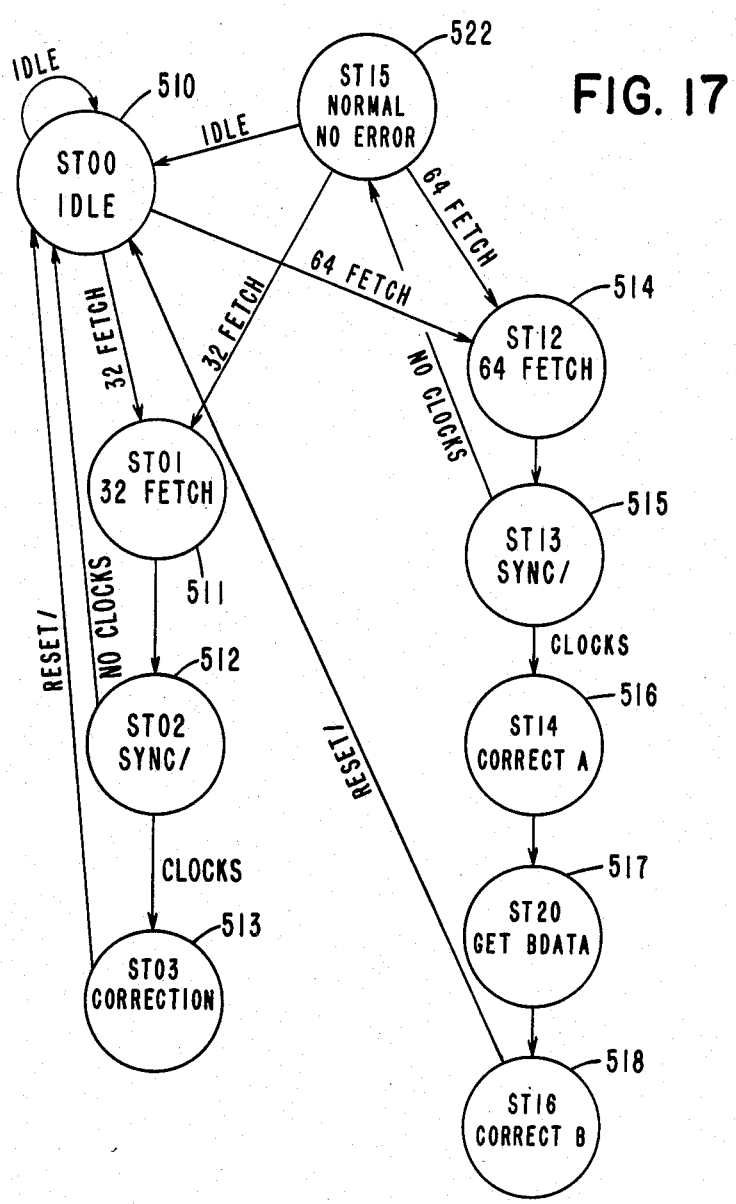
FIG. 17 is a logic diagram of the main control states controlling the main memory of FIG. 1.

FIG. 17 is a partial logic diagram for the main control states controlling the main memory 28 of FIG. 1. Various states of the memory appear in the circles of FIG. 17.

The first cycle of a memory operation is shown at 510, and is the idle or state zero shown in FIG. 17 as ST00. In the idle state, all of the dynamic RAMs of the memory are off and waiting for a new command, and the address bus is off and waiting for a new address. When a 32 bit fetch command is issued, the state goes from ST00 to ST01 at 511 during the first memory cycle. While in ST01, the fetched data is put into the EDAC circuit 264 and is also used by the single bit error detection circuit 262 of FIG. 11. In the second memory cycle, the state changes for ST01 at 511 to ST02 at 512 as shown in FIG. 17. In ST02, the SYNC/ signal is changed to a active low, which is input to the clock block logic circuit 426, as shown in FIG. 15B.

If a single bit error has been found by the single bit check circuit 418 or 420, as appropriate as set by the AVALID or BVALID signals, the SYNC/ signal sets a CLOCKS signal on conductor 428 as discussed in connection with FIG. 11. If a single bit error is found, the state changes from ST02 at 512 to ST03 at 513 for a sufficient time for the error to be corrected by the error detection and correction circuit 264 of FIG. 11. After ST03, the state is changed to ST00 at 510 to return the memory to idle for the start of another memory operation.

If no single bit errors were found, the state changes from ST02 to ST00 as shown and the EDAC circuit 264 is checked for any double bit errors detected.

For a 64 bit fetch, the state changes from ST00 at 510 to ST12 at 514. In this cycle, both the ADATA and ADATA bits are fetched as previously described. Also, the EDAC circuit 264 is loaded with the ADATA word. The state then changes from ST12 at 514 to ST13 at 515. In ST13, the SYNC/ signal is changed to an active low.

If a single bit error has been found by either of the single bit check circuits 418 or 420, the SYNC/ signal sets a CLOCKS signal on conductor 428. If a single bit error has been found, the state changes from ST13 at 515 to ST14 at 516 wherein the ADATA bits are corrected by the error detection and correction circuit 264 of FIG. 11 and placed on the ADATA bus 400. The state then changes from the ST14 at 515 to ST20 at 517 wherein BDATA is transmitted from the BDATA bus 404 to the error detection and correction circuit 464 through buffer element 414. The state then changes from ST20 at 517 to ST16 at 518 wherein the BDATA bits are corrected by the error detection and correction circuit 264 and placed on the BDATA bus 404. After ST16 at 518, the state returns to idle or ST00 at 510.

Figure 18:
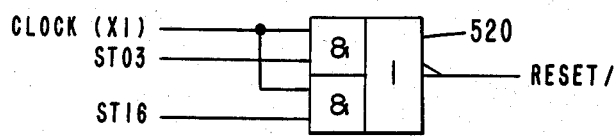
FIG. 18 is a circuit diagram for a circuit for a RESET/ signal for the single bit check circuits of FIGS. 13A-13D and 15A-15D.

FIG. 18 shows a circuit for generating the RESET/ signal to reset the signal bit check circuits. A 2-2 input AND/OR-invert gate 520, which may be a 74S51 chip available from Fairchild Camera and Instrument Corporation, receives a clock signal at one of the inputs for each of the AND functions. The clock signal is output from a free running clock derived from X1. The other input of one of the ANDs is from state ST03, and the other input of the other AND is from state ST16. The output of gate 520 is RESET/.

It can thus be seen that the first free running clock pulse after the end of either ST03 or ST16 will reset the flip-flops 470 and 494 of the single bit check circuits 420 and 422 respectively (see FIGS. 13B and 15B).

If no single bit errors were found at state ST13 at 512, the EDAC circuit 264 is checked for any double bit errors in the ADATA word and then the state changes to ST15 at 522. This may be the first cycle of any memory operation. If that memory operation is a 32 bit fetch, the state changes to ST01 at 511. State ST15 at 522 is a hidden cycle state because it allows the error detection and correction circuit 264 of FIG. 11 to check for and report multiple bit errors in the BDATA bits during this first cycle of the next possible memory operation.

Figure 19A:
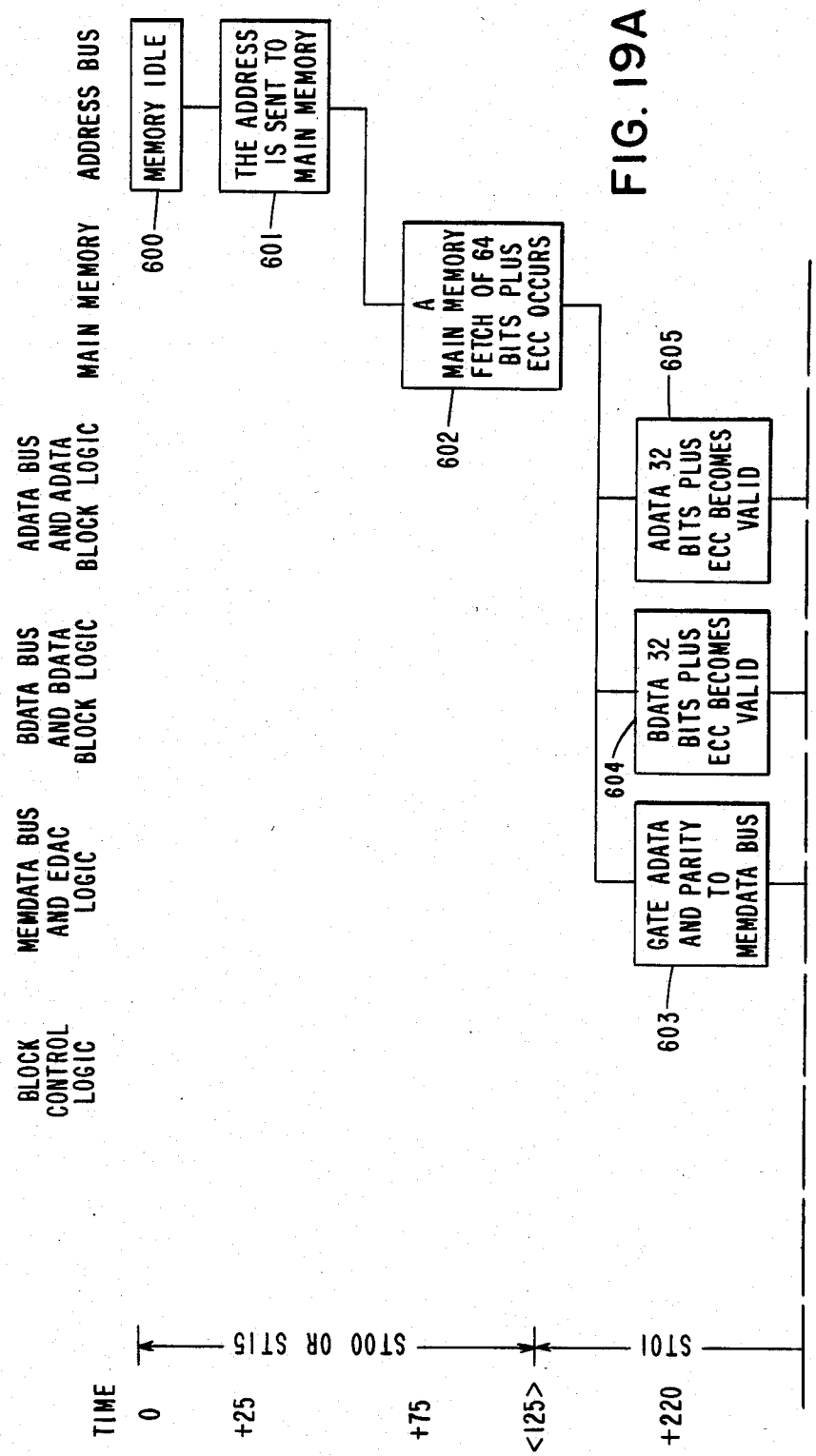
Figure 19D:
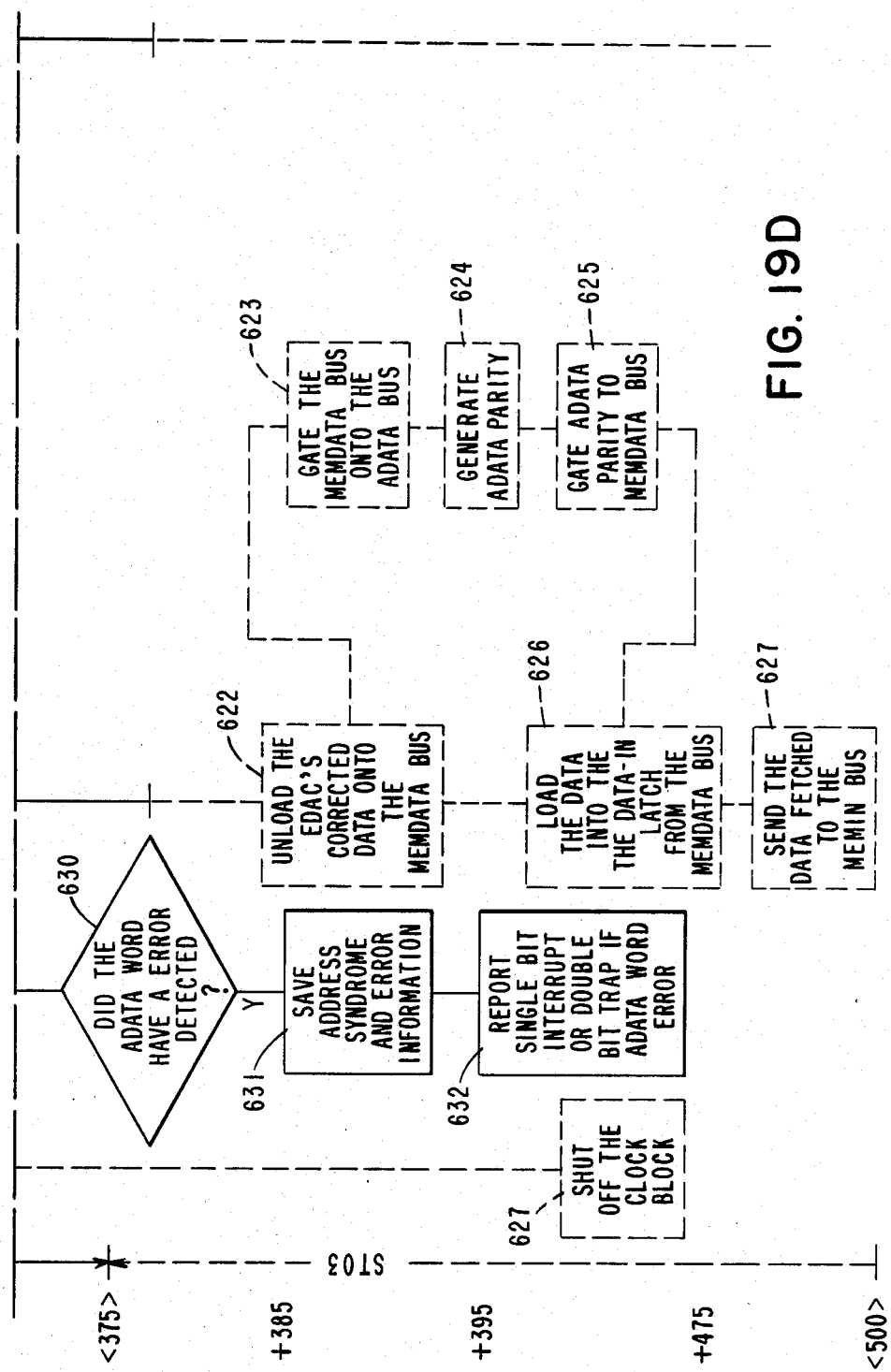
Figure 20:
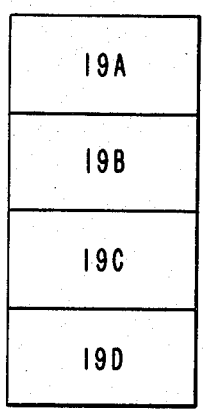

FIGS. 19A-19D assembled in accordance with FIG. 20 is a block diagram of the 32 bit fetch operation of the memory and error correction of the disclosed system. The titles of the Columns across the top of the figures identify the elements of the system which are operating, and the numbers down the left side of the figures represent the time elapsed, in nanoseconds, since the memory operation started. The times set off by brackets indicate the end of a clock cycle. The states of the memory from FIG. 17 are shown along the left side of FIGS. 19A-19D.

As indicated at 600, at time 0 the memory is at idle. As mentioned in connection with FIG. 17, memory idle means that the memory RAM chips are off and waiting for a new command, and the address bus is off and waiting for a new address. When a 32 bit fetch command is given to the memory, the address is sent to main memory over the address bus at 601, which causes the main memory to do a fetch of 64 bits plus the associated ECC bits at 602. These bits are placed on the ADATA bus and BDATA bus as previously described. The operations of 600 and 601 occurs during either states SI00 or ST15 of FIG. 17 as described.

During ST01, the ADATA bits with associated parity are transmitted to the MEMDATA bus as shown at 603, if an even word is being fetched, else the BDATA bits are sent. The BDATA bits and associated ECC bits become valid at 604 simultaneously with the ADATA bits and associated ECC bits becoming valid at 605.

In the rest of FIGS. 19B-19D, it assummed that ADATA is being fetched. It will be understood that the BDATA case would be the same except that the ADATA and BDATA functions would be reversed.

The memory now changes from ST01 to ST02 as shown in FIG. 17. During ST02 the following occurs: the data on the MEMDATA bus is loaded into the EDAC and also into the data catch 266 (see FIG. 11); the ADATA bus gate into the MEMDATA bus at 608 is then shut off; and the EDAC starts checking for any errors occurring at 610 and checks for multiple errors occurring at 611. The ADATA bus and ADATA block logic (described in connection with the single bit check circuit 420 of FIG. 11, and also the operation shown at 605) checks the ADATA bits for a single bit error and generates parity at 612. The ADATA block is enabled by issuing a BCLK signal at 613, the state of the ADATA block logic is saved by the state of the ABLOCK/ signal at 614, and the ADATA bus is shut off at the main memory at 615. At the same time as the operation of block 615, the BDATA bus is shut off at the main memory at 616.

At the same time as the operations shown at 608, 616, and 615, the block control logic of the clock block logic circuit 426 of FIG. 11 is enabled by the SYNC/ signal at 617. If a single bit error is detected at 618, the state of the CLOCKS signal blocks the system clock as shown at 619. If no single bit error is detected, no block occurs as shown at 620, and the state changes to ST00. Also during ST02, the memory returns to idle as shown at 621.

In the rest of the figures, FIGS. 19-29, the dotted lines represent operations that occur after an error has been detected. If an error is detected in ADATA bits, the state changes to ST03 as discussed in connection with FIG. 17. If the EDAC did not find multiple errors in 611, the corrected data is unloaded onto the MEMDATA bus at 622, the corrected ADATA bits are in turn gated onto the ADATA bus at 623, new parity bits are generated at 624, and the ADATA parity is gated back to the MEMDATA bus at 625. The corrected ADATA bits from 622 and the corrected parity bits from 625 are then latched in latch 266 at 626 where it is sent to the MEMIN bus to the PMBUS as shown at 627, as previously described.

At the same time as the operation shown at 626, the clock is unblocked as shown in 629.

If the EDAC detects either a single bit error or a multiple bit error, the address, syndrome and error information is saved at 631. If the error was a single bit error, then the single bit error interrupt is set. If the error was a multiple bit error, then the double bit trap is set at 632. As explained in connection with FIG. 17, after ST03, the state changes to ST00.

Figure 22:
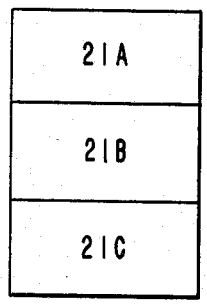
Figure 21A:
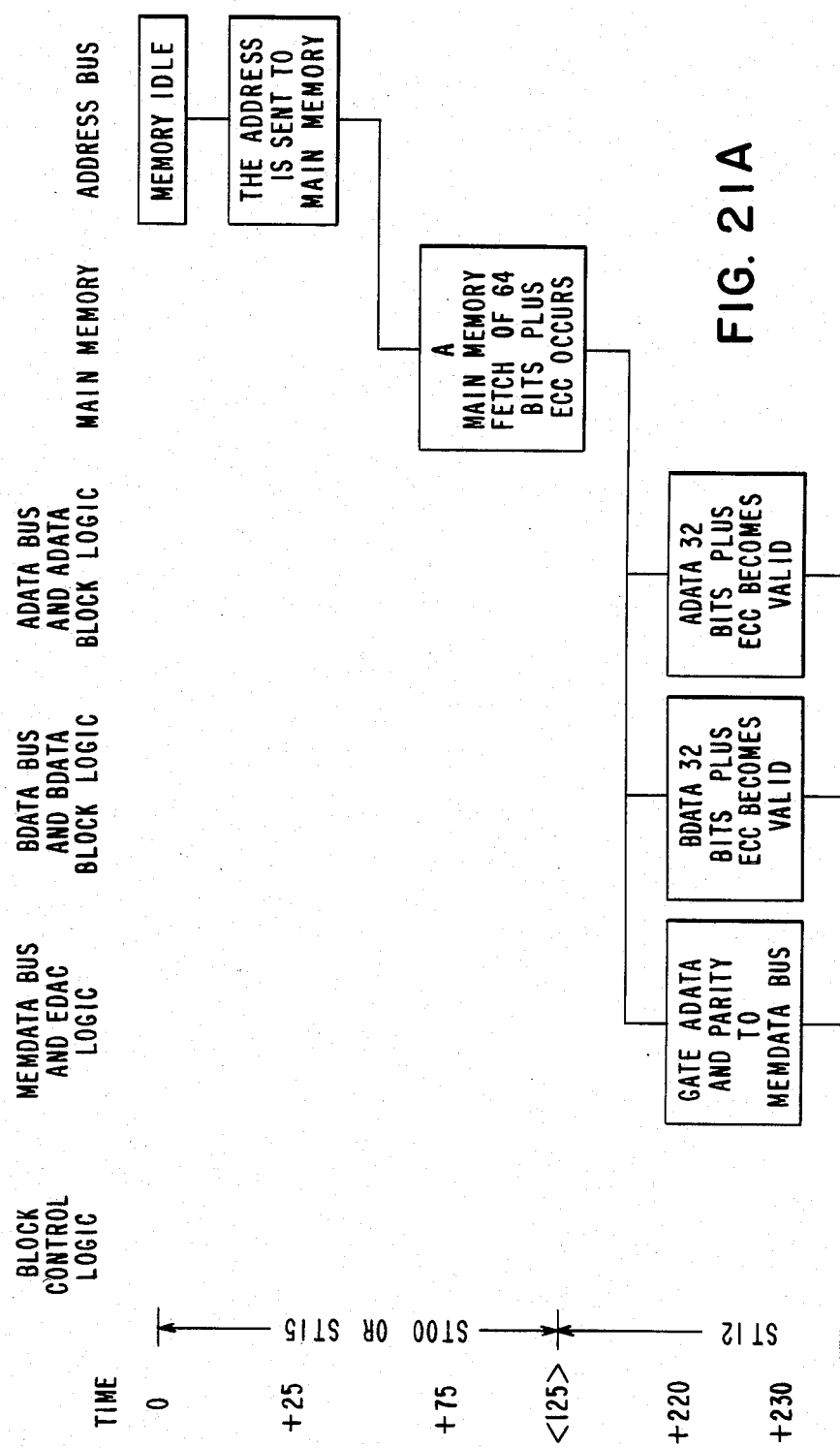
Figure 21C:
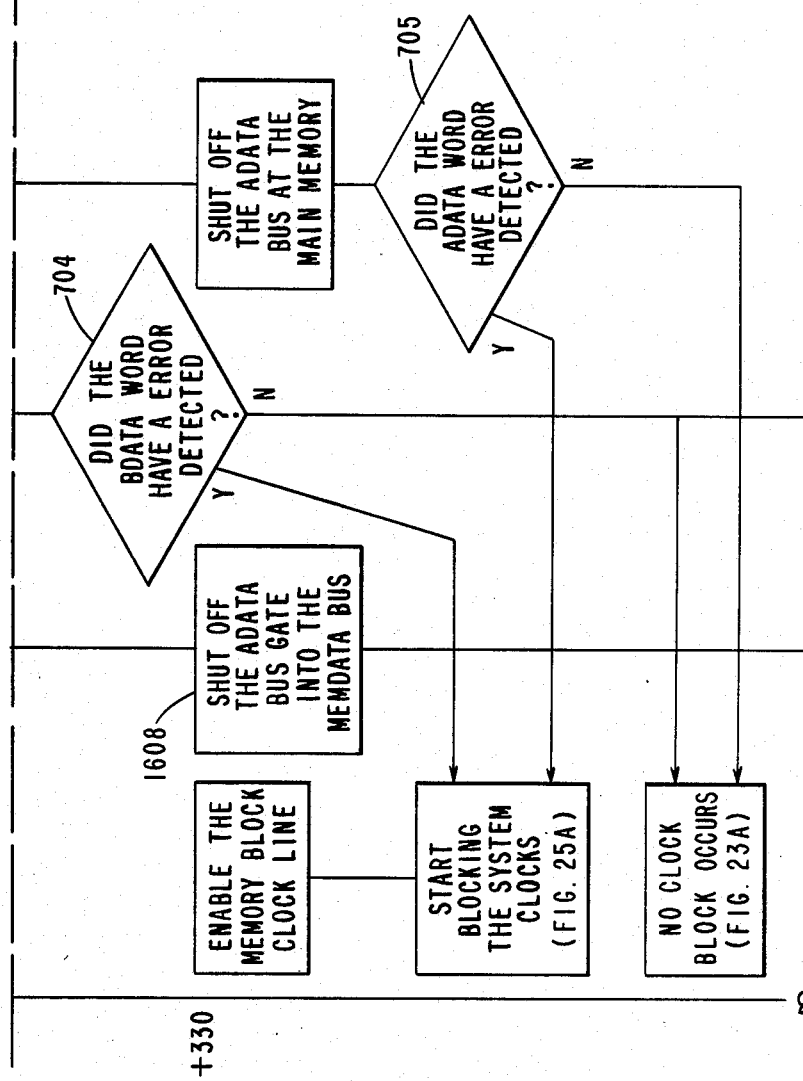

FIGS. 21A-21C assembled in accordance with FIG. 22 is a block diagram of the operation of the memory and error correction functions of the present system for states ST00 or ST15 through the first portion of ST13 for a 64 bit fetch operation. The operations indicated in each block are self explanatory and can be followed without further comment. It will be noted that in FIG. 21B that at blocks 700, 701, 702 and 703, the BDATA bits are checked for single bit errors as well as the ADATA bits. Also in FIG. 21C, both ADATA and BDATA bits are checked at 704 and 705 for single bit errors. Since the data in 64 bit fetches is instruction data as previously explained, the ADATA and BDATA words are sent to the instruction cache and ISU bus at 701 and 706 (see FIG. 11).

Figure 24:
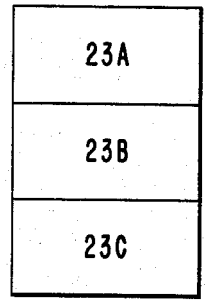
Figure 23C:
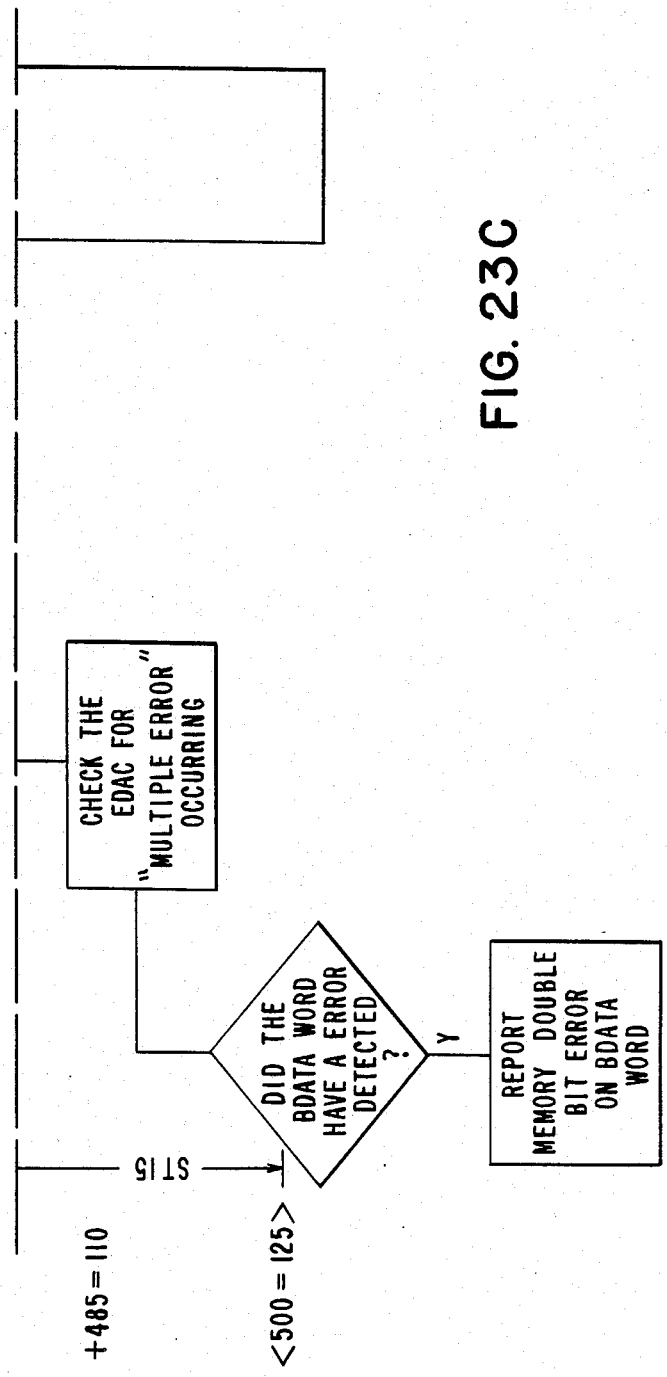
Figure 25B:
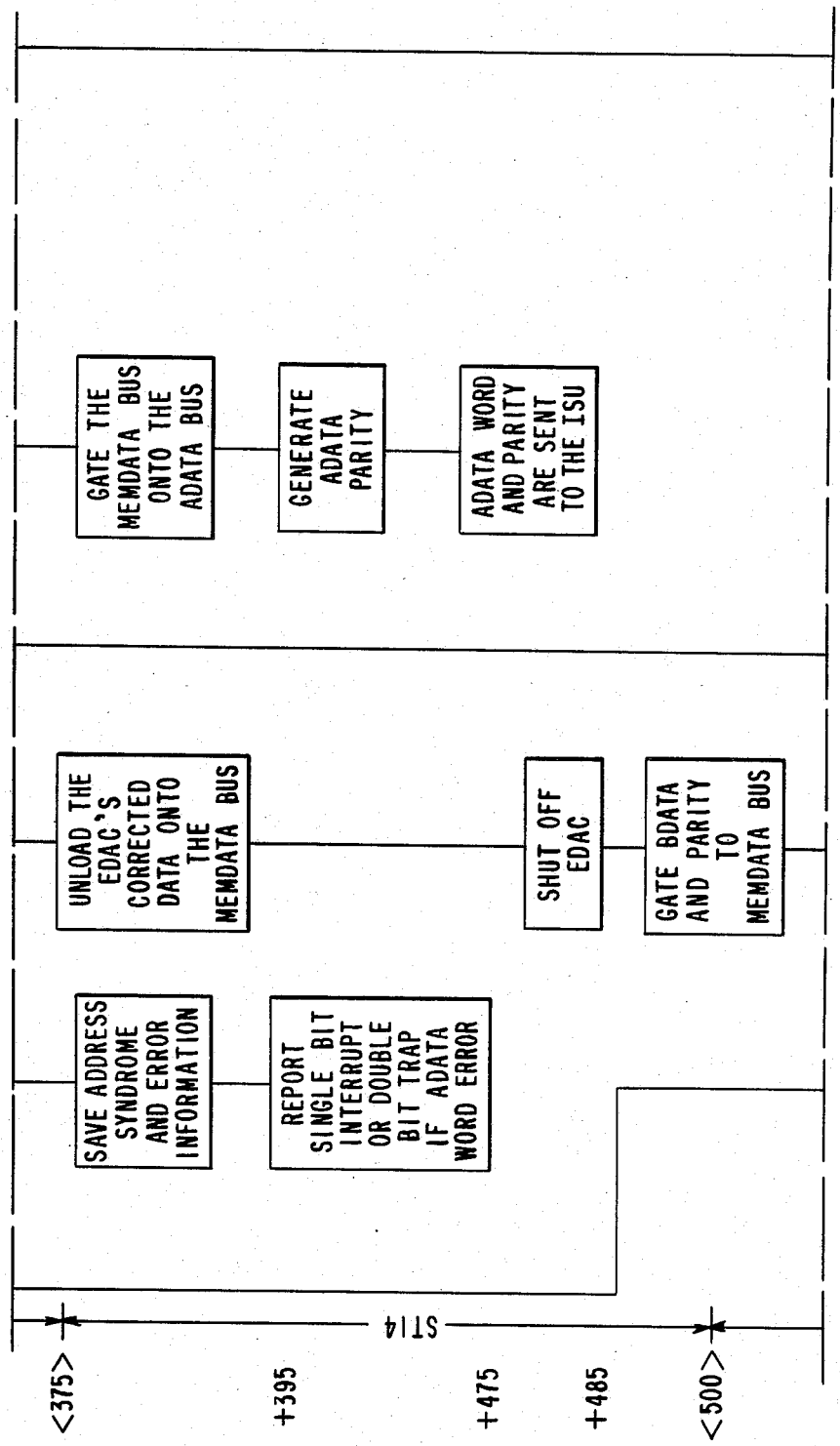
Figure 25D:
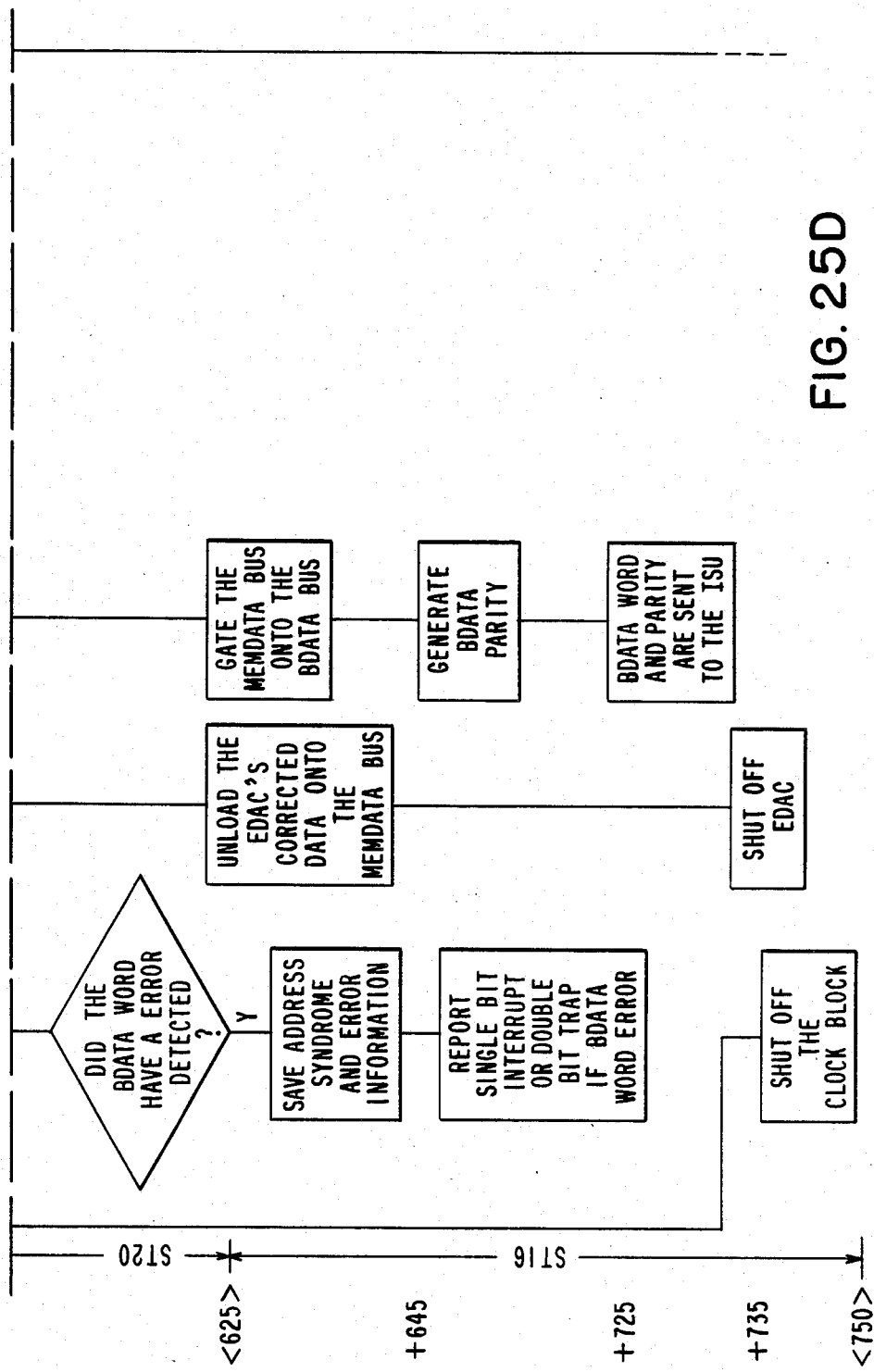

FIGS. 23A-23C assembled in accordance with FIG. 24, is a block diagram of the operation of the memory and error correction of the present system for a 64 bit fetch, and continues where FIG. 21C left off in the case of a normal fetch where no errors are found. FIGS. 23A-23C illustrate the operations of the memory through the last of state ST13 through ST15 of FIG. 17.

FIG. 23B illustrates the hidden memory cycle of ST15 wherein a new memory operation may start before state ST15 is complete. Blocks 710 and 711 show the start of a new memory operation, in the illustrated example another 64 bit fetch, before the completion of state ST15.

Figure 26:
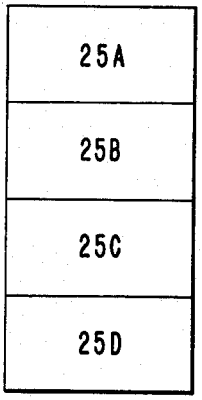

FIGS. 25A-25D assembled in accordance with FIG. 26 illustrates the operation of the memory and error correction of the present system for the remainder of state ST13 after FIG. 21C through states ST14, ST20 and ST16 in the case of a 64 bit fetch where errors were detected. The block labels of the blocks of FIGS. 25A-25D are sufficient to understand the operation of the elements of the systems without further explanation.

The states as described in connection with FIG. 17, are shown along the left side of FIGS. 21A-21C, 23A-23C and 25A-25D.

Figure 28:
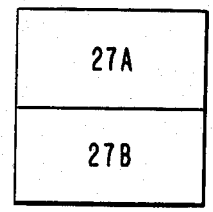
Figure 30:
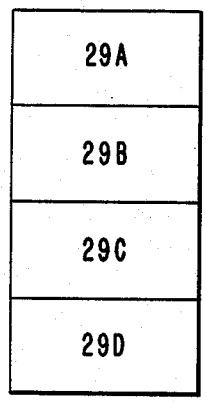
Figure 27B:
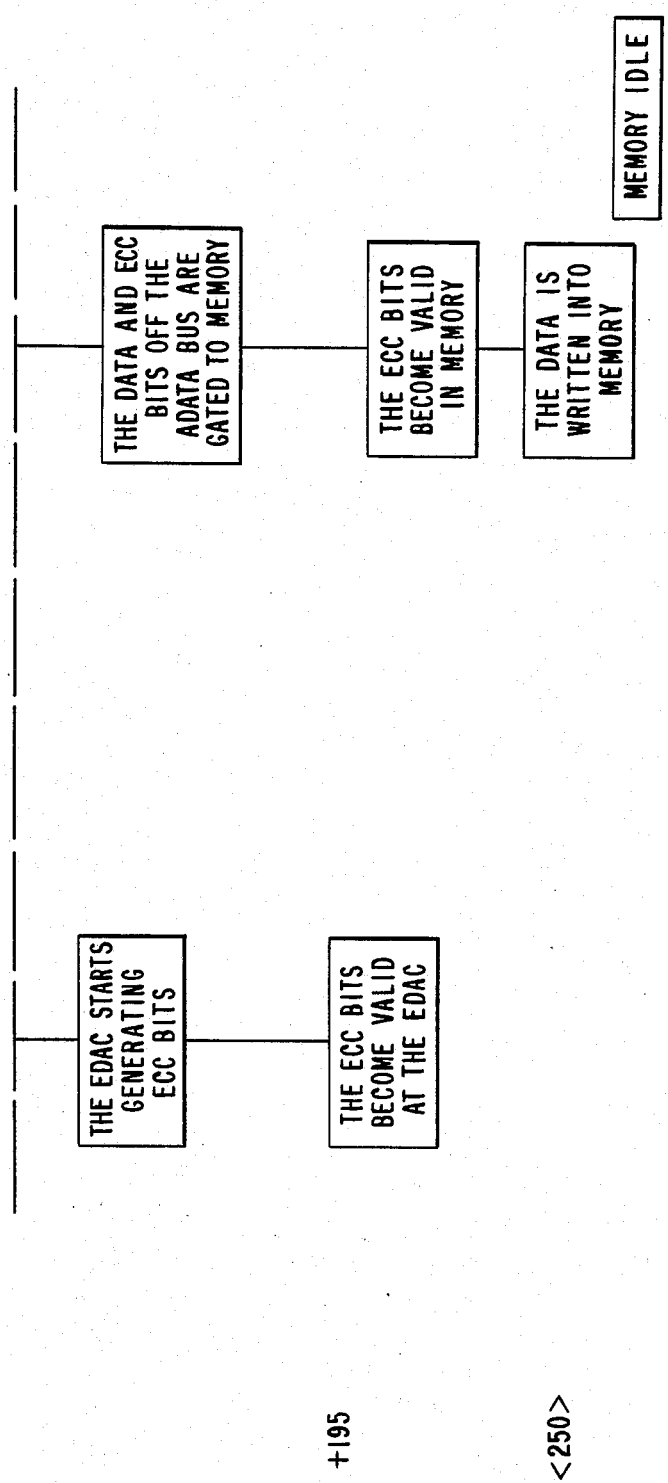
Figure 29C:
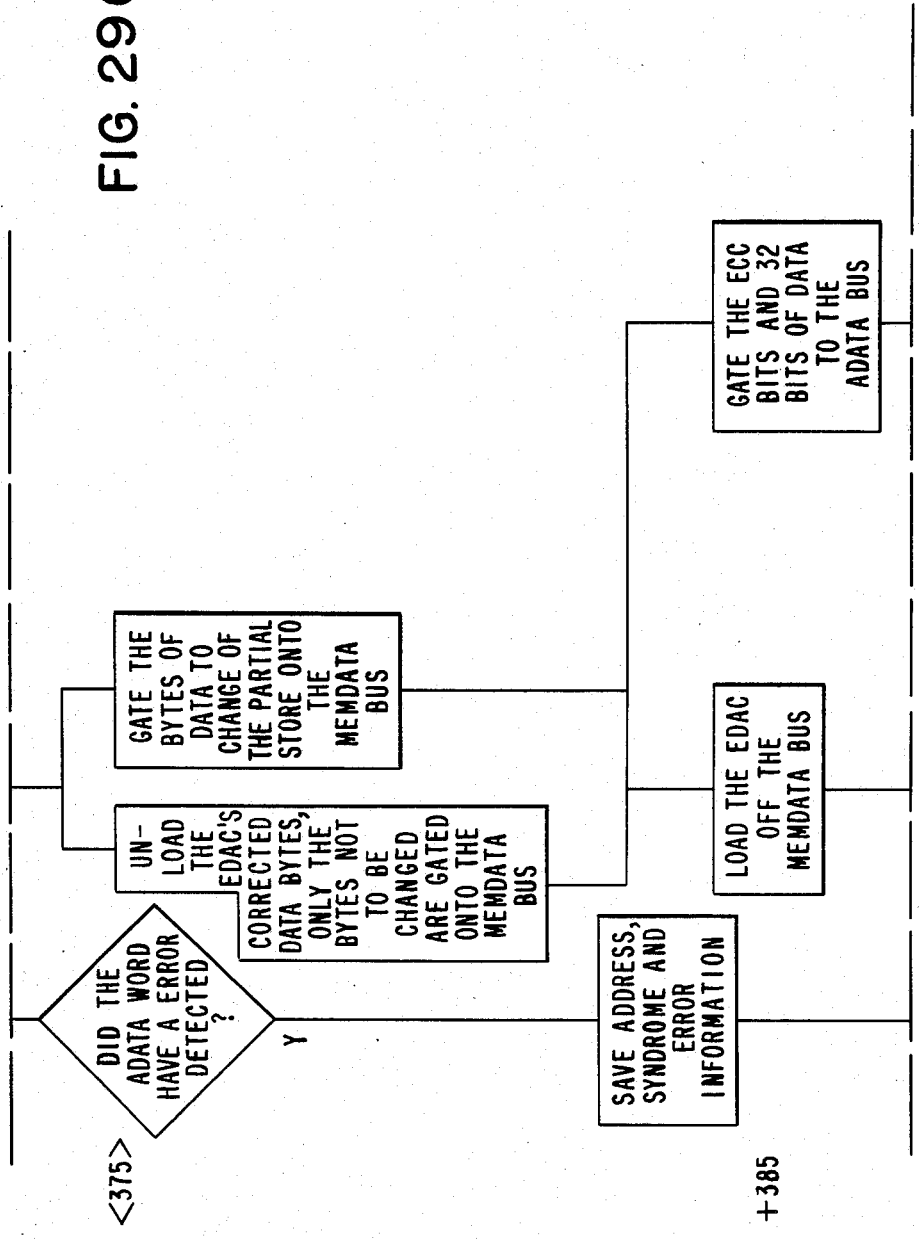

FIGS. 27A-27B assembled in accordance with FIG. 28 illustrates the operation of the memory and error correction of the disclosed system during a full store operation. Likewise, FIGS. 29A-29C assembled in accordance with FIG. 30 illustrates the operation of the memory and error correction of the disclosed system during a partial store operation. The states for the memory for a full store and partial store have not been shown in FIG. 17 for clarity, but will be understood by those skilled in the art.

It will thus be seen that single bit check circuits are provided which check for single bit errors to be found in data before an error detection and correction circuit detects and corrects these single bit errors. Thus, the output of the single bit check circuits generate a signal for stopping the clock before erroneous data is used in the system, and gives the error detection and correction circuit sufficient time to detect and correct the single bit errors. It will further be understood that any modified Hamming code may be used by the parity generator circuit disclosed to match the modified Hamming code used by any error detection and correction circuit desired. The described data processing system using the invention disclosed, and its components, are exemplary only and may be replaced by equivalents by those skilled in the art, which equivalents are intended to be covered by the attached claims.

What is claimed is:

1. An error detection and correction circuit comprising:
   a data memory for storing multi-bit data;
   processing means for processing multi-bit data stored in said data memory;
   clock means for controlling the running of said processing means;
   data transmitting means for transmitting data from said data memory to said processing means, said data transmitting means having first and second data buses for transmitting respective first and second data portions from said data memory;
   first and second single bit error check circuits each having an output, and an input connected respectively to said first and second data buses, each output of said single bit error check circuits having a first state when the data on the respective input of said single bit check circuit has no single bit error, and a second state when the data on the respective input of said single bit check circuit has a single bit error;
   clock blocking means connected between the outputs of said single bit error check circuits and said clock means, said clock blocking means for blocking said clock means thereby blocking the running of said processing means when either of the outputs of said first and second single bit error check circuits are in their second states;
   error detection and correction means connected to both of said first and second data buses for detecting and correcting single bit errors in multi-bit data on said first and second data buses; and
   reset means connected to said clock blocking means for unblocking said clock blocking means after correction of single bit errors by said error detection and correction means.

2. The error detection and correction circuit of claim 1 wherein said error detection and correction means includes error detection means utilizing a modified Hamming code for detecting errors in data received from said data transmitting means; and
   each of said first and second single bit error check circuits includes parity bit generator means connected to said data transmitting means for receiving selected bits of said data and generating parity bits corresponding to said modified Hamming code for detecting any single bit errors in data received from said data transmitting means.

3. The error detection and correction circuit of claim 2 wherein said data memory includes memory for storing multi-bit error correction code corresponding to said modified Hamming code for data stored in said data memory;

said data transmitting means includes means for transmitting said error correction code with related data transmitted to said first and second single bit error check circuits; and said first and second single bit error check circuits each include comparison means for comparing selected bits of said error correction code with the modified Hamming code from said parity generator means for determining single bit errors in data received from said data transmitting means.

4. The error detection and correction circuit of claim 3 wherein said clock blocking means includes two-state gate means having a first input connected to said comparison means of said first single bit error check circuit, a second input connected to said comparison means of said second single bit error check circuit, and an output having a first state for unblocking said clock when said comparison means of both of said first and second single bit check circuits indicate a match between said selected bits of said error correction code and the modified Hamming code of said first and second single bit error check circuits, and having a second state for blocking said clock when said comparison means of either of said first or second single bit check circuits indicates a mismatch.

5. An error detection and correction apparatus comprising:

transmission means for transmitting multi-bit data signals and multi-bit error correction code signals generated responsive to said multi-bit data signals in accordance with a modified Hamming code technique;

parity generator means connected to said transmission means for receiving the bits of said multi-bit data signals and selected bits of said error correction code signals, said parity generator means connected in accordance with said modified Hamming code technique for determining if a single bit error in the multi-bit data signals transmitted by said transmitting means exist;

two-state comparison means connected to said parity generator means, said comparison means having a first state when said parity generator means indicates a single bit error exists and a second state when said parity generator means indicates a single bit error does not exist;

separate error detection and correction means connected to said transmission means for receiving the bits of said multi-bit data signals and the bits of said multi-bit error correction code signals for detecting and correcting single bit errors in said multi-bit data signals; and reset means connected between said separate error detection and correction means for resetting said two-state comparison means to its second state after single bit errors in said multi-bit data signals have been corrected.

6. The error detection and correction apparatus of claim 5 further comprising:

buffer means connected between said separate error detection and correction means and said transmission means, said buffer means transmitting a first portion of said multi-bit data signals and a corresponding first portion of said multi-bit error correction code signals from said transmission means to said separate error detection and correction means for detecting and correcting single bit errors in said first portion of said multi-bit data signals, and subsequently transmitting a second portion of said multi-bit data signals and a corresponding second portion of said multi-bit error correction code signals from said transmission means to said separate error detection and correction means for detecting and correcting single bit errors in said second portion of said multi-bit data signals; and wherein said reset means resets said two-state comparison means after the correction of any single-bit errors by said separate error detection and correction means in said second portion of said multi-bit data signals.

7. A method for error detection and correction comprising:

transmitting multi-bit data signals and multi-bit error correction code signals generated responsive to said multi-bit data signals in accordance with a modified Hamming code technique;

generating parity bits from the bits of said multi-bit data signals and selected bits of said error correction signals in accordance with said modified Hamming code technique for determining if a single bit error in the multi-bit data signals transmitted by said transmitting means exist;

generating a comparison signal having a first state when said generated parity bits indicate a single bit error exists and a second state when said generated parity bits indicate a single bit error does not exist;

separately detecting and correcting single bit errors in said multi-bit data signals; and resetting said comparison signal to its second state after any single bit errors in said multi-bit data signals have been corrected.

8. The method of error detection and correction of claim 7 further comprising:

detecting and correcting any single bit errors in a first portion of said multi-bit data signals;

detecting and correcting any single bit errors in a second portion of said multi-bit data signals; and resetting said comparison signal after the correction of any single-bit errors in said second portion of said multi-bit data signals.

9. An error detection and correction apparatus comprising:

data memory means for storing multi-bit data, said data memory means including control means for controlling the storage of data in either a first or a second memory portion;

processing means for processing multi-bit data stored in said memory portions of said data memory means;

clock means for controlling the running of said processing means;

data transmitting means for simultaneously transmitting multi-bit data from both memory portions of said data memory to said processing means;

single bit error check means for simultaneously checking the multi-bit data from both memory portions of said data means, said single bit check means having an output for indicating if a single bit error exists in the multi-bit data from either of the memory portions of said data memory means;

clock blocking means for blocking said clock means thereby stopping said processing mean when the output of said single bit error check mean indicates a single bit error exists;

error detection and correction means connected to said data transmitting means for serially detecting and correcting single bit errors first in the multi-bit data from the first portion of said memory means, and then in the multi-bit data from the second portion of said memory means; and reset means connected to said clock blocking means and said error detection and correction means for unblocking said clock means after the correction of detected single bit errors by said error detection and correction means.

10. The error detection and correction apparatus of claim 9 wherein said error detection and correction means includes error detection means utilizing a modified Hamming code for detecting errors in data received from said data transmitting means; and said single bit error check means includes parity bit generator means for receiving selected bits of said multi-bit data transmitted over said data transmitting mean and generating parity bits corresponding to said modified Hamming code for detecting any single bit errors in the multi-bit data from either of said memory portions of said data memory means.

11. The error detection and correction apparatus of claim 10 wherein each memory portion of said data memory means includes memory for storing multi-bit error correction code corresponding to said modified Hamming code for data stored in said data memory;

said data transmitting mean includes mean for transmitting said error correction code with related data from each of the memory portions of said data memory means; and said single bit error check means includes comparison means for comparing selected bits of said error correction code from each memory portion with the modified Hamming code from said parity generator means for the multi-bit data of said corresponding memory portion, for determining single bit errors in data received from said data transmitting means.

12. The error detection and correction apparatus of claim 11 wherein the correction code stored in said memory for storing multi-bit error correction code is generated by said error detection and correction means, said error detection and correction apparatus further comprising:

input data transmission means for transmitting multi-bit data to be stored in said data memory means, to said error detection and correction means; and error correction code transmission means for transmitting error correction code generated responsive to input data received over said input data transmission means, to said data memory means for storage.

13. The error detection and correction apparatus of claim 11 further comprising:

state means for controlling said data transmitting means and said single bit error check means, said state means for optionally selecting multi-bit data from the first memory portion only of said data memory means, and disable means for disabling the comparison means of said single bit error check means for said second memory portion whereby single bit errors may be optionally detected and corrected for said first memory portion only.

14. The error detection and correction apparatus of claim 13 wherein said state means includes means for optionally selecting the multi-bit data from one of said first memory portion, said second memory portion, and both of said first and second memory portions.

15. The error detection and correction apparatus of claim 14 wherein said state means includes means for starting the selecting of multi-bit data from said data memory means during the detecting and correcting of single-bit errors in the mult-bit data from said second portion of said memory means by said error detection and correction means.

* * * * *